(12) United States Patent
Magnusson

(10) Patent No.: US 8,938,141 B2
(45) Date of Patent: Jan. 20, 2015

(54) TUNABLE RESONANT LEAKY-MODE N/MEMS ELEMENTS AND USES IN OPTICAL DEVICES

(75) Inventor: Robert Magnusson, Arlington, TX (US)

(73) Assignee: University of Connecticut, Farmington, CT (US)

( * ) Notice: Subject to any disclaimer, the term of this patent is extended or adjusted under 35 U.S.C. 154(b) by 1943 days.

(21) Appl. No.: 12/218,081

(22) Filed: Jul. 11, 2008

(65) Prior Publication Data

US 2009/0067774 A1    Mar. 12, 2009

Related U.S. Application Data

(63) Continuation-in-part of application No. 11/188,452, filed on Jul. 25, 2005, now Pat. No. 7,689,086.

(60) Provisional application No. 60/592,550, filed on Jul. 30, 2004, provisional application No. 60/959,627, filed on Jul. 13, 2007.

(51) Int. Cl.
*G02B 6/34* (2006.01)

(52) U.S. Cl.
USPC ................................. 385/37; 385/8

(58) Field of Classification Search
USPC ....................................... 385/8–10
See application file for complete search history.

(56) References Cited

U.S. PATENT DOCUMENTS

| | | | |
|---|---|---|---|
| 5,216,680 A | 6/1993 | Magnusson et al. | |
| 5,598,300 A | 1/1997 | Magnusson et al. | |
| 5,978,524 A * | 11/1999 | Bischel et al. | 385/4 |
| 6,154,480 A | 11/2000 | Magnusson et al. | |
| 6,542,682 B2 * | 4/2003 | Cotteverte et al. | 385/125 |
| 6,747,773 B2 * | 6/2004 | Theil et al. | 359/237 |
| 7,263,258 B2 | 8/2007 | Levner et al. | |
| 7,283,716 B2 * | 10/2007 | Park et al. | 385/129 |
| 7,526,148 B2 * | 4/2009 | Kilic et al. | 385/12 |
| 7,689,086 B2 | 3/2010 | Magnusson et al. | |
| 8,249,400 B2 * | 8/2012 | Kilic et al. | 385/11 |
| 8,331,741 B2 * | 12/2012 | Kilic et al. | 385/12 |
| 8,548,283 B2 * | 10/2013 | Kilic et al. | 385/12 |

(Continued)

OTHER PUBLICATIONS

S. T. Peng, et al., "Theory of Periodic Dielectric Waveguides," IEEE Trans. Microwave Theory and Tech. MTT-23, 123-133 (1975).

(Continued)

*Primary Examiner* — Sung Pak
(74) *Attorney, Agent, or Firm* — McCarter & English, LLP

(57) ABSTRACT

Mechanically tunable electromagnetic and photonic devices featuring enhanced spectral tunability with minimal mechanical movement are provided. These nano/micro-electromechanically (N/MEMS) tunable elements, including filters and pixels, rely on leaky-mode resonance effects in subwavelength photonic lattices that constitute periodic wavelengths. Such elements can operate in reflection (bandstop) or transmission (bandpass) modes, and can be arranged in one-dimensional or two-dimensional arrays, or operated as single units, and their spectral regions are controlled by the element design. Input electromagnetic radiation illuminates the element and is then filtered, modulated, analyzed or tuned by the element. Mechanical motion alters the structural symmetry, and therefore, the tuning properties, of the nanostructured subwavelength resonance elements. Further, incorporating metals and dielectrics to generate coexisting plasmonic and leaky-mode resonance effects adds to the versatility of the potential applications.

21 Claims, 41 Drawing Sheets

(56) References Cited

U.S. PATENT DOCUMENTS

2004/0076362 A1* 4/2004 Wong et al. .................. 385/14
2005/0117866 A1* 6/2005 Park et al. .................. 385/129
2006/0024013 A1 2/2006 Magnusson

OTHER PUBLICATIONS

P. Vincent, et al., "Corrugated Dielectric Waveguides: A Numerical Study Of The Second-Order Stop Bands," Appl. Phys. 20, 345-351 (1979).
G. A. Golubenko, et al., "Total Reflection Of Light From A Corrugated Surface Of A Dielectric Waveguide," Sov. J. Quantum Electron. 15, 886-887 (1985).
T. K. Gaylord, et al., "Analysis And Applications Of Optical Diffraction By Gratings," Proc. IEEE 73, 894-937 (1985).
L. Mashev, et al., "Zero Order Anomaly Of Dielectric Coated Gratings," Opt. Commun. 55, 377-380 (1985).
R. F. Kazarinov, et al., "Second-Order Distributed Feedback Lasers With Mode Selection Provided By First-Order Radiation Loss," IEEE J. Quant. Elect. QE-21, 144-150 (1985).
S. Zhang, et al., "Spatial Modifications Of Gaussian Beams Diffracted By Reflection Gratings," J. Opt. Soc. Am. A 6, 1368-1381 (1989).
Avrutsky, et al., "Reflection Of A Beam Of Finite Size From A Corrugated Waveguide," J. Mod. Optics 36, 1527-1539 (1989).
M. T. Gale, et al., "Zero-Order Diffractive Microstructures For Security Applications," Proc. SPIE on Optical Security and Anticounterfeiting Systems 1210, 83-89 (1990). (abstract).
R. Magnusson, et al., "New Principle For Optical Filters," Appl. Phys. Lett. 61, 1022 (1992).
S. S. Wang, et al., "Theory And Applications Of Guided-Mode Resonance Filters," Appl. Opt. 32, 2606-2613 (1993).
S. S. Wang, et al., "Multilayer Waveguide-Grating Filters," Appl. Opt. 34, 2414-2420 (1995).
M. G. Moharam, et al., "Stable Implementation Of The Rigorous Coupled-Wave Analysis For Surface-Relief Gratings: Enhanced Transmittance Matrix Approach," J. Opt. Soc. Am. A 12, 1077-1086 (1995).
R. Magnusson, et al., "Transmission Bandpass Guided-Mode Resonance Filters," Appl. Opt. 34, 8106 (1995).
R. W. Day, et al., "Filter Response Lineshapes Of Resonant Waveguide Gratings," J. Lightwave Tech. 14, 1815-1824 (1996).
S. Peng, et al., "Experimental Demonstration Of Resonant Anomalies In Diffraction From Two-Dimensional Gratings," Opt. Lett. 21, 549-551 (1996).
D. Rosenblatt, et al., "Resonant Grating Waveguide Structure," IEEE J. Quant. Electronics 33, 2038-2059 (1997).
S. Tibuleac, et al., "Reflection and Transmission Guided-Mode Resonance Filters," J. Opt. Soc. Am. A. 14, 1617 (1997).
F. Lemarchand, et al., "Increasing The Angular Tolerance Of Resonant Grating Filters With Doubly Periodic Structures," Opt. Lett. 23, 1149-1151 (1998).
Taflove, et al., Computational Electrodynamics: The Finite-Difference Time-Domain Method, $2^{nd}$ edition, Artech House, Norwood, MA, 2000.
D. L. Brundrett, et al., "Effects Of Modulation Strength In Guided-Mode Resonant Subwavelength Gratings At Normal Incidence," J. Opt. Soc. Am. A. 17, 1221-1230 (2000).
D. Wawro, et al., "Optical Fiber Endface Biosensor Based On Resonances In Dielectric Waveguide Gratings," Biomedical Diagnostic, Guidance, and Surgical-Assist Systems II, Proc. SPIE, 3911, 86-94 (2000).
Tibuleac, et al., "Narrow-Linewidth Bandpass Filters With Diffractive Thin-Film Layers," Opt. Lett. 26, 584 (2001).
Z. S. Liu, et al., "Concept of Multiorder Multimode Resonant Optical Filters," IEEE Photonics Tech. Lett. 14, 1091-1093 (2002).
B. Cunningham, et al., "Colorimetric Resonant Reflection As a Direct Biochemical Assay Technique," Sens. Actuators B 81, 316-328 (2002).
B. Cunningham, et al., "A Plastic Colorimetric Resonant Optical Biosensor For Multiparallel Detection Of Label-Free Biochemical Interactions," Sens. Actuators B 85, 219-226 (2002).
M. Cooper, Nature Reviews. Optical Biosensors In Drug Discovery, 1, 515-528 (2002).
R. Magnusson, et al., "Diffractive Optical Components," Encyclopedia Of Physical Science And Technology, Third Edition, vol. 4, pp. 421-440 Academic Press, 2002.
R. Magnusson, et al., "Photonic devices enabled by waveguide-mode resonance effects in periodically modulated films," Proc. SPIE, vol. 5225 Nano- and Micro-Optics for Infomation Systems, edited by Louay A. Eldada, (SPIE, Bellingham, WA, 2003) pp. 20-34.
Y. Ding and R. Magnusson, "Doubly-Resonant Single-Layer Bandpass Optical Filters," Opt. Lett. 29, 1135-1137 (2004).
Y. Ding, et al., "Polarization Independent Resonant Bandstop Filters Using 1D Periodic Layers With Asymmetric Profiles," Diffractive Optics and Micro-Optics Topical Meeting, DOMO 2004, Rochester, New York, Oct. 10-14, 2004.
Y. Ding, et al., "Use Of Nondegenerate Resonant Leaky Modes To Fashion Diverse Optical Spectra," Optics Express, vol. 12, pp. 1885-1891, May 3, 2004. [http://www.opticsexpress.org/abstract.cfm?URI=OPEX-12-9-1885].
Y. Ding, et al., "Resonant Leaky-Mode Spectral-Band Engineering And Device Applications," Opt. Express 12, 5661-5674 (2004).
C. F. R. Mateus, et al., "Broad-Band Mirror (1.12-1.62 μM) Using A Subwavelength Grating," IEEE Photonics Tech. Lett. 16, 1676-1678 (2004).
W. Suh, et al., "All-Pass Transmission Or Flattop Reflection Filters Using A Single Photonic Crystal Slab," Appl. Phys. Lett. 84, 4905-4907 (2004).
R. Magnusson, et al., "Spectral-Band Engineering With Interacting Resonant Leaky Modes In Thin Periodic Films," Proc. SPIE, vol. 5720, Conference on Micromachining Technology for Microoptics and Nanooptics, edited by E. G. Johnson, (SPIE, Bellingham, WA, 2005), pp. 119-129 (invited).
U.S. Appl. No. 60/592,550, filed Jul. 30, 2004.
U.S. Appl. No. 60/959,627, filed Jul. 13, 2007.
Raether, Surface Plasmons On Smooth And Rough Surfaces And On Gratings, Springer-Verlag, Berlin, Table of Contesnts, Introduction and pp. 91-116, (1988).
Nishihara, et al., Optical Integrated Circuits, McGraw-Hill, Table of Contents and pp. 205-220, (1989).
Joannopoulos, et al., Photonic Crystals: Molding the Flow of Light, Princeton, 1995.
Bloom, "The Grating Light Valve: Revolutionizing Display Technology," Proc. SPIE 3013, pp. 165-171 (1997).
Ebbesen, et al., "Extraordinary Optical Transmission Through Subwavelength Hole Arrays," Nature, vol. 391, pp. 667-669 (1998).
Amm, et al., "Grating Light Valve Technology: Update And Novel Applications," Society for Information Display Symposium, Anaheim, Calif., May 19, 1998.
Kim, et al., "Control Of Optical Transmission Through Metals Perforated With Subwavelength Hole Arrays," Optics Letters 24, pp. 256-258 (1999).
Sakoda, Optical Properties of Photonic Crystals, Springer-Verlag, Berlin, Table of Contents, 2001.
Madou, Fundamentals of Microfabrication: The Science of Miniaturization, Second Edition, CRC press, Table of Contents and pp. 272-299, (2002).
Collin, et al., "Horizontal and Vertical Surface Resonances In Transmission Metallic Gratings," Journal of Optics: Pure and applied optics, vol. 4, pp. s154-s160 (2002).
Darmanyan, et al., "Light Tunneling Via Resonant Surface Plasmon Polariton States And The Enhanced Transmission Of Periodically Nanostructured Metal Films: An Analytical Study," Phys Rev B, vol. 67, 035424 (2003).
Suh, et al., "Displacement-Sensitive Photonic Crystal Structures Based On Guided Resonances In Photonic Crystal Slabs," Appl. Phys. Lett., vol. 82, pp. 1999-2001, Mar. 31, 2003.
Carr, et al., "Laterally Deformable Nanomechanical Zeroth-Order Gratings: Anomalous Diffraction Studied By Rigorous Coupled-Wave Theory," Optics Letters 28, pp. 1636-1638 (2003).

(56) References Cited

OTHER PUBLICATIONS

Nakagawa, et al., "Tunable Optical Nanocavity Based On Modulation Of Near-Field Coupling Between Subwavelength Periodic Nanostructures," IEEE J. Selected Topics in Quantum Electronics, vol. 10, pp. 478-483, May/Jun. 2004.

Park, et al., "Mechanically Tunable Photonic Crystal Structures," Appl. Phys. Lett., vol. 85, pp. 4845-4847, Nov. 22, 2004.

Keeler, et al., "Experimental Demonstration Of A Laterally Deformable Optical Nanoelectromechanical System Grating Transducer," Optics Letters 29, pp. 1182-1184 (2004).

Trisnadi, et al., "Overview And Applications Of Grating Light Valve Based Optical Write Engines For High-Speed Digital Imaging," Proc. SPIE 5348, pp. 1-13 (2004).

Kanamori, et al., "Movable Guided-Mode Resonant Grating Filters by Four Bimorph Actuators for Wavelength Selective Dynamic Reflection Control," 2006 IEEE/LEOS International Conference on Optical MEMS and their applications, Big Sky, Montana, Aug. 21-24, 2006.

Huang, et al., "Nanoscale High-Contrast Subwavelength Grating Integrated Tunable Surface Emitting Laser," 2006 IEEE/LEOS International Conference on Optical MEMS and their applications, Big Sky, Montana, Aug. 21-24, 2006.

Magnusson, et al., "MEMS Tunable Resonant Leaky Mode Filters," IEEE Photonics Technology Letters, vol. 18, pp. 1479-1481, Jul. 15, 2006.

Christ, et al., "Surface Plasmon Optics," 2006 IEEE/LEOS International Conference on Optical MEMS and Their Applications, Big Sky, Montana, Aug. 21-24, 2006.

Lee, et al., "Guided-Mode Resonance Elements Fabricated By Microcontact Printing Method," Optical Society of America Topical Meeting: Nanophotonics, Uncasville, Connecticut, Apr. 26-28, 2006; paper NThA5 on Technical Digest CD (2006).

Magnusson, et al., Widely Tunable Guided-Mode Resonance Nanoelectromechanical RGB Pixels, Optics Express, vol. 15, No. 17, 8 pages, (2007).

Yariv, et al., Photonics: Optical Electronics in Modern Communications, 6th edition, Oxford University Press, New York, Table of Contents, 2007.

http://www.wikipedia.org/wiki.Digital_Micromirror_Device;(printed Sep. 2009); 2 sheets.

* cited by examiner

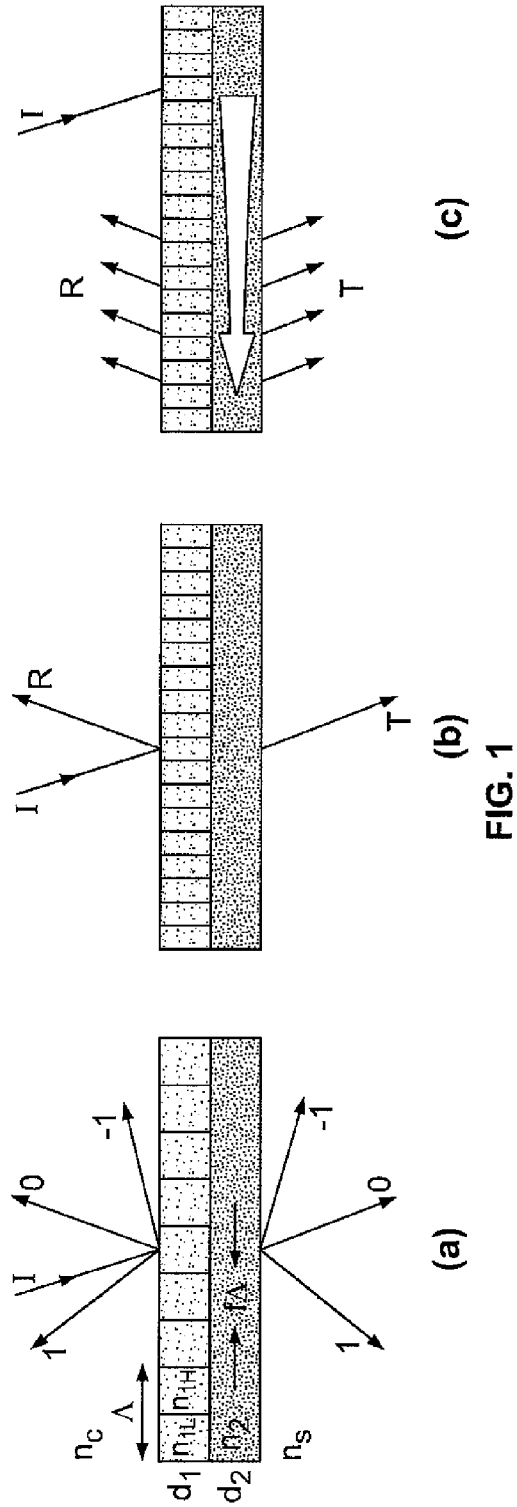
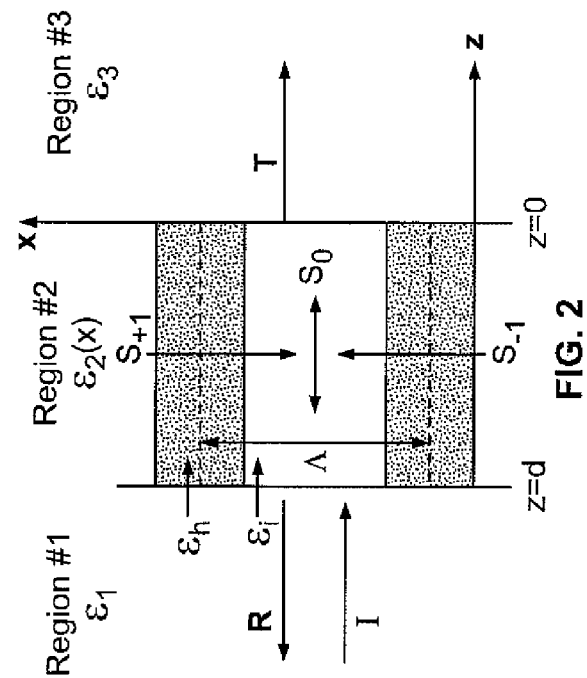
FIG. 1
FIG. 2

Cross Section of Beam (normalized to incident beam)

Modulation Profiles in a Cell

TUNABLE RESONANT LEAKY-MODE N/MEMS ELEMENTS AND USES IN OPTICAL DEVICES

CROSS-REFERENCES TO RELATED APPLICATIONS

The present application is a continuation-in-part of and claims priority to U.S. patent application Ser. No. 11/188,452, filed Jul. 25, 2005, now U.S. Pat. No. 7,689,086, entitled "Resonant Leaky Mode Optical Devices and Associated Methods," which claims priority to a provisional application (Ser. No. 60/592,550 filed Jul. 30, 2004). The present application also claims priority to co-pending U.S. Provisional Patent Application Ser. No. 60/959,627, filed Jul. 13, 2007, entitled "Tunable Resonant Leaky-Mode N/MEMS Elements and Uses in Optical Devices," both of which are hereby incorporated by reference in their entireties, as part of the present disclosure.

STATEMENT REGARDING FEDERALLY SPONSORED RESEARCH OR DEVELOPMENT

In accordance with 35 U.S.C. §202(c)(6), the United States Government has a paid-up license in this invention and the right, in limited circumstances, to require the patent owner to license others on reasonable terms as provided for by the terms of Grant No. ECS-0702307 from the National Science Foundation.

BACKGROUND OF THE DISCLOSURE

1. Technical Field

The present invention generally relates to an advantageous new field of optical devices based on resonant leaky modes in periodically modulated films. More particularly, the present invention relates to tunable optical devices based on known nano/micro-electromechanical (N/MEMS) actuation methods, and useful applications thereof.

2. Description of the Background Art

The field of thin-film optics is a mature area of optical technology. There are numerous companies and/or industries producing optical filters and devices of a great variety throughout the world. These devices typically consist of homogeneous layers deposited with precise thicknesses and materials parameters, often under vacuum. Examples of currently marketed devices utilizing multilayered arrangements include, but are not limited to, laser mirrors; polarizers; antireflection film systems; bandpass filters; bandstop filters; edge filters; lowpass filters; high-pass filters; phase plates; tunable optical devices and/or filters; sensors; modulators; polarization control devices; hyper-spectral arrays; sensor arrays; beam splitters; and others.

A significant drawback associated with current optical devices is that a large number of layers, for example, from 10 to 200, are often needed to fashion the spectral and angular properties required for a particular application. These optical devices, which utilize homogeneous layer stacks, operate on the basis of multiple reflections between the interfaces incorporated in a layer stack. Thus, the amount and cost of material required to effectuate a desired optical effect can be significant. In addition, the adhesion difficulties associated with forming the multilayered stacks can cause problems. Further, there are interface scattering losses inherently associated with multilayered arrangements.

Materials that are artificially structured on a nanoscale exhibit electronic and photonic properties that differ dramatically from those of the corresponding bulk entity. Periodic volumes and layers are expected to yield new devices in many fields including communications, medicine, and laser technology. [See, J. D. Joannopoulos, R. D. Meade, and J. N. Winn, *Photonic Crystals Molding the Flow of Light*, Princeton, 1995; A. Yariv and P. Yeh, Photonics: Optical Electronics in Modern Communications, 6th edition, Oxford University Press, New York, 2007; K. Sakoda, *Optical Properties of Photonic Crystals*, Springer-Verlag, Berlin, 2001.] On incorporation of mechanical mobility into nanostructured systems, further enhancements and advances in performance can be realized.

Subwavelength photonic lattices are presently of immense interest owing to their applicability in numerous optical systems and devices including biosensors, lasers, and filters. When the lattice is confined to a layer, thereby forming a periodic waveguide, an incident optical wave may undergo a guided-mode resonance (GMR) on coupling to a leaky eigenmode of the layer system. The external spectral signatures can have complex shapes with high efficiency in both reflection and transmission. It has been shown that subwavelength periodic leaky-mode waveguide films provide diverse spectral characteristics such that even single-layer elements can function as narrow-line bandpass filters, polarized wideband reflectors, wideband polarizers, polarization-independent elements, and wideband antireflection films. [See, R. Magnusson, Y. Ding, K. J. Lee, D. Shin, P. S. Priambodo, P. P. Young, and T. A. Maldonado, "*Photonic devices enabled by waveguide-mode resonance effects in periodically modulated films*," in Nano- and Micro-Optics for Information Systems, L. A. Eldada, ed., Proc. SPIE 5225, 20-34 (2003); Y. Ding and R. Magnusson, "*Use of nondegenerate resonant leaky modes to fashion diverse optical spectra*," Opt. Express, 12, 1885-1891 (2004); Y. Ding and R. Magnusson, "*Resonant leaky-mode spectral-band engineering and device applications*," Opt. Express 12, 5661-5674 (2004); R. Magnusson and Y. Ding, "*Spectral-band engineering with interacting resonant leaky modes in thin periodic films*," Proc. SPIE, Vol. 5720, Micromachining Technology for Microoptics and Nanooptics, pp. 119-129, Photonics West, January 2005.] The relevant physical properties of these elements can be explained in terms of the structure of the second (leaky) photonic stopband and its relation to the symmetry of the periodic profile.

The interaction dynamics of the leaky modes at resonance contribute to sculpting the spectral bands. The leaky-mode spectral placement, their spectral density, and their levels of interaction decisively affect device operation and associated functionality. [See, Y. Ding et al., "Use of nondegenerate resonant leaky modes to fashion diverse optical spectra," Opt. Express, 12, 1885-1891 (2004); Y. Ding et al., "Resonant leaky-mode spectral-band engineering and device applications," Opt. Express 12, 5661-5674 (2004).] Additional background information is set forth in the above-referenced provisional/non-provisional applications that are incorporated herein by reference. [See Cross-Reference to Related Applications.]

Guided-mode resonance device parameters, including refractive index of grating layers or surrounding media, thickness, period, and fill factor, can all be applied to implement tunability. In past publications, a tunable laser using a rotating resonance element (i.e., angular tuning) and a photorefractive tunable filter were described. [S. S. Wang and R. Magnusson, "*Theory and applications of guided-mode resonance filters*," Appl. Opt., vol. 32, pp. 2606-2613, May 1993.] Furthermore, tuning can be accomplished by changing layer thickness or material refractive index, a method of significance in resonant sensor operation. Shu et al. reported analysis of a tunable structure consisting of two adjacent photonic-crystal films, each composing a two-dimensional waveguide grating that could be displaced laterally or longitudinally by a mechanical force. [W. Shu, M. F. Yanik, O. Solgaard, and S. Fan, "*Displacement-sensitive photonic crystal structures based on guided resonances in photonic crystal slabs*," Appl. Phys. Lett., vol. 82, pp. 1999-2001, 31 Mar. 2003.] Each periodic waveguide admitted guided-mode resonances whose coupling could be mechanically altered for spectral tuning. Carr et al. theoretically studied laterally deformable nanomechanical gratings under resonance conditions and, using a fixed input wavelength, found intensity modulation and polarization effects on application of grating lateral shifts. [D. W. Carr, J. P. Sullivan, and T. A. Friedman, "*Laterally deformable nanomechanical zeroth-order gratings: anomalous diffraction studied by rigorous coupled-wave theory*," Optics Letters 28, pp. 1636-1638 (2003).] Later, Keeler et al. fabricated a prototype device in amorphous diamond with 600 nm period and nanoscale features and suggested uses for inertial sensing and modulation [B. E. N. Keeler, D. W. Carr, J. P. Sullivan, T. A. Friedman, and J. R. Wendt, "*Experimental demonstration of a laterally deformable optical nanoelectromechanical system grating transducer*," Optics Letters 29, pp. 1182-1184 (2004).]

More recently, Kanamori et al. fabricated two-dimensional (and thus polarization independent) GMR filters that could be moved, via micro-electromechanical (MEMS) actuators, within an air gap to add or drop selected wavelengths in a bit stream. The silicon-on-insulator device had about 80% efficiency at 1500 nm. [Y. Kanamori, T. Kitani, and K. Hane, "*Movable Guided-Mode Resonant Grating Filters by Four Bimorph Actuators for Wavelength Selective Dynamic Reflection Control,*" 2006 IEEE/LEOS International Conference on Optical MEMS and their applications, Big Sky, Mont., Aug. 21-24, 2006.] Huang et al. applied a mobile GMR mirror to tune a surface emitting laser by electrostatic actuation. The point was made there that this thin (230 nm) element is a significant advance over similar tuning with Bragg stacks that might be about 10 µm thick; the laser could be tuned across a 2.2 nm spectral range in the reported experiment. [Michael C. Y. Huang, Ye Zhou and Connie J. Chang-Hasnain, "Nanoscale High-Contrast Subwavelength Grating Integrated Tunable Surface Emitting Laser," 2006 IEEE/LEOS International Conference on Optical MEMS and their applications, Big Sky, Mont., Aug. 21-24, 2006.] Finally, Magnusson et al. initial results on widely tunable SOI elements. [R. Magnusson and Y. Ding, "*MEMS tunable resonant leaky mode filters*," IEEE Photonics Technology Letters, vol. 18, pp. 1479-1481, Jul. 15, 2006.]

Additionally, numerous other tunable grating structures, not inducing leaky modes, have been described in the literature. As an example of a device in this class, Nakagawa and Fainman presented a structure in which a subwavelength grating was placed between planar dielectric mirrors composing a Fabry-Perot cavity. [W. Nakagawa and Y. Fainman, "*Tunable optical nanocavity based on modulation of near-field coupling between subwavelength periodic nanostructures*," IEEE J. Selected Topics in Quantum Electronics, vol. 10, pp. 478-483, May/June 2004.] Lateral and longitudinal motion yielded effective tuning via associated near-field coupling mechanisms. Park and Lee presented a tunable nanophotonic grating layer that was placed on a flexible substrate. [W. Park and J. B. Lee, "*Mechanically tunable photonic crystal structures*," Appl. Phys. Lett., vol. 85, pp. 4845-4847, 22 Nov. 2004.] By mechanically stretching the lattice, thereby changing the grating period, a variation in the angle of refraction of an incident beam of light was achieved. Kim et al. applied surface plasmons and Rayleigh anomaly to obtain enhanced transmission through a metallic perforated film. They tuned the device by embedding it in a liquid crystal and then varying the surrounding refractive index by applied voltage. [Tae Jin Kim, Tineke Thio, T. W. Ebbesen, D. E. Grupp, and H. J. Lezec, "*Control of optical transmission through metals perforated with subwavelength hole arrays*," Optics Letters 24, pp 256-258 (1999).].

The patent literature reflects previous developments involving optical devices. For example, U.S. Pat. No. 5,216,680 to Magnusson et al. describes a guided-mode resonance filter which can be used as an optical filter with narrow line width and as an efficient optical switch. Diffraction efficiencies and passband frequencies are calculated based on guided-mode resonance properties of periodic dielectric structures in a waveguide geometry. The guided-mode resonance filter preferably includes means for changing various parameters within the grating so as to change passband frequencies in response thereto. The disclosed diffraction grating could be supported by a semiconductor substrate adjacent to a semiconductor laser for fine-tuning the output of the semiconductor laser. The diffraction grating between thin-film layers of the Magnusson '680 patent can be designed so as to enhance the thin-film performance characteristics of the structure.

U.S. Pat. No. 5,598,300 to Magnusson et al. discloses ideal or near ideal filters for reflecting or transmitting electromagnetic waves having a wavelength range of approximately 100 nm to 10 cm. The disclosed filters combine a dielectric multilayer structure with a resonant waveguide grating and are valid for both TE and TM polarized waves. High efficiency, arbitrarily narrow band, polarized filters with low sidebands over extended wavelength ranges can be obtained according to the teachings of the Magnusson '300 patent. In addition, U.S. Pat. No. 6,154,480 to Magnusson et al. discloses vertical-cavity lasers (VCLs) fabricated without Bragg mirrors by replacing them with diffractive GMR mirrors with much fewer layers, for example, two or three layers. When incorporated in VCLs, the GMR mirrors yield single-mode, narrow-line, highly-polarized output light.

Notwithstanding that which is presently known with respect to optical devices and optical device-related technologies, a need remains for optical devices and optical device-related technologies that facilitate greater optical design and fabrication flexibility. In addition, a need remains for optical devices and optical device-related technologies that facilitate shaping of the reflection and transmission spectra of optical devices. A further need exists for mechanically tunable electromagnetic and photonic devices and, more particularly, for tunable structures that support leaky waveguide modes. A need also exists for structures that coexhibit plasmonic and leaky mode properties. Such concepts and devices have tremendous potential for beneficial uses.

These and other needs are met by the systems and methods disclosed herein. In addition, the disclosed systems and methods address numerous problems and shortcomings commonly associated with known optical devices and optical device-related technologies, thereby providing means for achieving greater optical design flexibility and effectiveness.

SUMMARY OF THE DISCLOSURE

The present disclosure, in at least one aspect, is directed to optical devices employing leaky modes in an innovative fashion by employing the first order or higher multiple evanescent diffraction orders in a single layer to excite one or more leaky modes. The periodic structure can have a symmetric or asymmetric profile to permit a broadened variety of resonant leaky-mode devices to be realized. Furthermore, the material within each period of this structure having a symmetric or asymmetric profile can be distributed in an arbitrary fashion to still further broaden the variety of obtainable devices. For example, a material with high refractive index value can be placed in two or more slots within each period. Essentially, this controls the amplitude of the various Fourier harmonics of the grating with concomitant control of the width of an associated leaky-mode resonance, and the separation of adjacent resonances, to be employed in the engineering of the spectral characteristics of a particular element. What is more, as nanoscale patterning and processing technologies continue to advance, steady progress in passive and active optical devices engineered with spatially modulated films can be expected, thereby further enhancing the utility and significance of the disclosed systems and methods.

Thus, one aspect of the present disclosure is directed to optical devices that are based on resonant leaky modes in periodically modulated films, wherein the spatial modulation is such that an associated structure profile lacks reflection symmetry in a plane erected normal to the surface and normal to the grating vector and leaky resonant modes propagate in opposite directions when excited at, or near, normal incidence. One advantage provided by this arrangement is that adjacent, distinct resonance frequencies or wavelengths are produced. Also, convenient shaping of the reflection and transmission spectra for such optical devices may advantageously be accomplished. Another advantage is that the wavelength resonance locations may be precisely controlled so as to affect the extent to which the leaky modes interact with each other. Still another advantage is found in that the interaction spectral range can be large, providing the ability to produce wideband shaped spectra.

Another aspect of the present disclosure is directed to a method for realizing optical devices wherein multiple evanescent diffraction orders are provided in a single layer that may have a symmetric or asymmetric profile. In this aspect of the disclosure, multiple first and higher evanescent diffraction orders may advantageously interact with the fundamental and higher waveguide modes to yield unique optical spectral characteristics. In each case, for these symmetric or asymmetric profiles, the material distribution within the period is arbitrary and can be chosen to suit the applicable device design constraints to realize a broad variety of spectral signatures and properties of the resulting elements. The design of the grating profiles to include a possibly complex, multi-component distribution of materials in order to fashion the final spectral response of GMR elements is significant for at least one aspect of the present disclosure.

In a further aspect of the present disclosure, a single modulated wave-guiding layer, i.e., a waveguide grating, with one-dimensional (1D) periodicity deposited on a substrate having arbitrary properties and having a top cover with arbitrary properties is provided with a refractive index that is higher than those of the surrounding media.

In another aspect of the present disclosure, an asymmetric device is modulated in two dimensions (2D). In this aspect, an exemplary 2D pattern can be a regular lattice of dots, or mesas, or holes with an appropriately offset sub-lattice to create the asymmetry. Alternatively, the 2D pattern can consist of arbitrarily shaped holes or mesas yielding the asymmetry.

In yet another aspect of the present disclosure, the 2D pattern can be symmetric or asymmetric and, as in the 1D case, the material distribution within each period may be arbitrary.

In still another aspect of the present disclosure, a system of two or more wave-guiding layers is employed to enhance the leaky-mode device performance.

In another aspect of the present disclosure, ease of fabrication and enhanced functionality may be achieved by employing a homogeneous waveguide layer and an adjacent, separate periodic layer to form the waveguide grating structure. Arbitrary combinations with one or more homogeneous layers and one or more periodic layers may be advantageously used.

The advantages and features associated with the aspects identified and discussed in the present disclosure are utilized in designing various optical devices including, for example, narrowband reflecting structures and filters (bandstop filters), wideband reflecting structures and filters (bandstop filters, mirrors), narrowband transmitting structures and filters (bandpass filters), and wideband transmitting structures and filters (bandpass filters). In addition, such advantages and features are effectively employed when using 1D periodicity to implement polarization independent devices such as narrowband and wideband bandstop and bandpass filters, or using 1D periodicity to implement polarization independent reflectors where the phase between the two orthogonal components is 180 degrees to implement a half-wave polarization plate, or is 90 degrees to realize a quarter-wave plate. That is, as the amplitude for each polarization component has nearly unity reflectance and the phase is controllable by design, a variety of devices can be implemented for polarization control. The phase shifts imposed and/or achieved through such design factors can, in fact, be arbitrary, and not just 90 or 180 degrees, for more generalized control in this aspect of the present disclosure.

A particularly significant advantage of the optical device arrangement disclosed herein is that the optical spectral properties of a single modulated layer advantageously rival and exceed the performance provided by much more elaborate (i.e., multilayer) conventional thin-film devices.

As described herein, one aspect of the present invention is motivated by theoretical results that demonstrate substantial spectral tunability of photonic structures with minimal mechanical movement. In one aspect of the present disclosure, the associated nano/micro-electromechanically (N/MEMS) tunable filters and pixels rely on leaky-mode resonance effects in subwavelength photonic lattices that constitute periodic waveguides. This concept has potential utility in wavelength bands ranging from UV- and visible spectra to mm- and microwave frequencies, and can be used in diverse applications such as tunable filters, variable reflectors, modulators, and tunable pixels. These devices could be used, for example, as pixels in new, compact spatial light modulators for display applications, in tunable multispectral detectors, in multispectral analysis systems, in polarization discrimination and analysis systems, and in tunable lasers. Incorporating metals and dielectrics to generate coexisting plasmonic and leaky-mode resonance effects adds to the versatility of the applications. Further, the N/MEMS-tunable elements disclosed herein can operate in reflection (bandstop mode) and in transmission (bandpass mode).

Additional advantageous features and functions associated with the present disclosure will be readily apparent from the detailed description which follows, particularly when reviewed together with the figures appended hereto.

BRIEF DESCRIPTION OF THE FIGURES

So that those having skill in the art to which the subject matter of the present disclosure appertains will have a better understanding of uses and implementations of the present disclosure, including specifically optical spectral properties associated with a spatially modulated, periodic layer simultaneously possessing wave-guiding properties, reference is made to the accompanying figures. The patent or application file contains at least one drawing executed in color. Copies of this patent or patent application publication with color drawing(s) will be provided by the Office upon request and payment of the necessary fee.

FIGS. 1(a) to 1(c) are schematic illustrations demonstrating diffraction by resonant photonic-crystal waveguide structures in accordance with an aspect of the present disclosure. FIG. 1(a) shows low-spatial-frequency waveguide grating wherein the period is greater than the wavelength; FIG. 1(b) shows high-spatial-frequency waveguide grating wherein the period is less than the wavelength; and FIG. 1(c) demonstrates how the excitation of a leaky mode with zero-order grating causes an efficient resonance.

FIG. 2 is a schematic illustration of one type of a resonant periodic waveguide model in accordance with another aspect of the present disclosure.

FIG. 7(b) shows a structure similar to a single-grating structure, where the waveguide layer has been converted to a periodic layer with the same average refractive index, and where D is the diameter of the incident Gaussian beam.

FIG. 14(a) illustrates spectrum at normal incidence and FIG. 14(b) illustrates angular spectrum at $\lambda=1.52$ μm with $F_1=0.444$, $F_2=0.13$, M=0.74, d=0.728 μm, $\Lambda=1.0$ μm, $n_c=1.0$, $n_s=1.0$, $n_h=3.48$, $n_1=1.0$ and $\eta_T$ is the transmittance.

FIG. 19(a) is spectra with low modulation ($n_h=2.12$) and GMR#1 and GMR#2 having symmetric lineshapes as they are close to a $q\lambda_g/2$ line; and where FIG. 19(b) is spectra with high modulation ($n_h=2.282$), and where $F_1=0.4$, $F_2=0.26$, M=0.6, d=0.134 μm, $\Lambda=0.314$ μm, $n_c=1$, $n_s=1.52$, $n_{avg}=2.0665$, $\eta_R$ is the reflectance, and the low grating index used is $n_1=\sqrt{n_{avg}^2-Fn_h^2}/(1-F)$ where $F=F_1+F_2$.

FIG. 20(a) is as TE spectrum with $n_h=2.8$, FIG. 20(b) is a TM spectrum with $n_h=2.8$, and FIG. 20(c) is a reflectance with TE and TM incidence with $n_h=3.48$, FIG. 20(d) is a transmittance with TE and TM incidence with $n_h=3.48$, and where $F_1=0.435$, $F_2=0.225$, M=0.5, d=0.68 μm, $\Lambda=0.84$ μm, $n_c=1$, $n_s=1.52$, $n_{avg}=2.887$, and $\eta_T$ is the transmittance.

In FIG. 39, $S_0$ represents the zero order and $S_1$ the leaky mode electric field.

FIG. 42(a) shows the double-grating device structure, wherein the materials distribution within a period is defined by the fill factors which sum to unity as $F_1+F_2+F_3+F_4=1$, and a table containing the set of device parameters applicable to this example. FIG. 42(b) demonstrates TE-polarized reflectance vs. wavelength and tuning fill factor $F_2$, wherein the map shows locus of high reflectance, and the bar on the right shows level of reflectance with red denoting high reflection and blue low reflection.

FIG. 43(a) shows reflectance vs. wavelength and $F_2$; the map also shows locus of high reflectance (red) with the background indicating regions of low reflection, and the input wave is TE-polarized. FIG. 43(b) shows the evolution of the reflection spectrum relative to the applied tuning fill factor $F_2$.

FIG. 44(a) shows the blue pixel depicted in FIGS. 42(a), 42(b) and 42(c), while FIG. 44(b) shows the red pixel depicted in FIGS. 43(a), 43(b) and 43(c).

FIG. 45(a) shows transmittance vs. wavelength and tuning factor $F_x$, and the locus of high transmission. FIG. 45(b) shows the device structure in which the materials distribution within a period is defined by the F-factors, wherein $F_1+F_2+F_3+F_4=1$.

DESCRIPTION OF EXEMPLARY EMBODIMENTS

Figure 3:
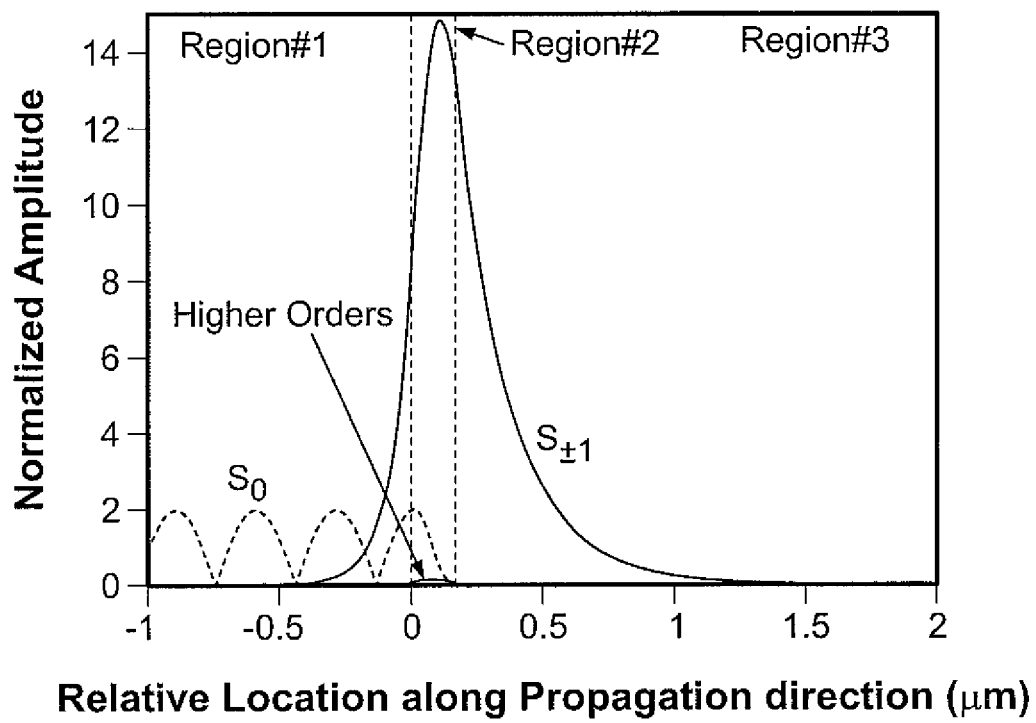
FIG. 3 is a graphical representation of field profile associated with leaky mode resonance in accordance with an illustrative aspect of the present disclosure.

Optical devices based on resonant leaky modes in thin periodically modulated films are provided by the present disclosure. For illustrative purposes, reference is made to a number of illustrative implementations of the disclosed resonant leaky mode technology and associated applications. However, the present disclosure is not limited by the exemplary implementations disclosed herein, but rather is susceptible to many changes, enhancements, modifications and/or variations without departing from the spirit or scope of the present disclosure.

With reference to FIGS. 1(a), 1(b) and 1(c), the interaction of a diffraction grating (sometimes recently also called one-dimensional (1D) photonic crystal slab) and an incident plane wave is shown with key parameters, including layer thicknesses d, refractive indices n, period $\Lambda$, fill factor f, and the various propagating waves driven by the incident plane wave I with wavelength $\lambda$ and angle of incidence $\theta$ measured with respect to the surface normal. As shown, the period $\Lambda$ may be reduced and higher-order propagating waves may become increasingly cut off until the zero-order regime is obtained as shown in FIG. 1(b). If the structure contains an appropriate waveguide, the first-order waves that are evanescent or cut off can induce a resonance by being coupled to a leaky mode. Thus, thin-film structures containing waveguide layers and periodic elements (photonic crystals), under the correct conditions, can exhibit a GMR effect. When an incident wave is phase-matched, by the periodic element, to a leaky waveguide mode as shown in FIG. 1(c), it is reradiated in the specular-reflection direction with reflectance R as indicated in FIG. 1(c) as it propagates along the waveguide and constructively interferes with the directly reflected wave. Conversely and equivalently, the phase of the reradiated leaky mode in the forward, directly transmitted wave (transmittance T) direction shown in FIG. 1(c) is $\pi$ radians out of phase with the direct unguided T wave, thereby extinguishing the transmitted light. [See, G. A. Golubenko, A. S. Svakhin, V. A. Sychugov, and A. V. Tishchenko, "*Total reflection of light from a corrugated surface of a dielectric waveguide*," Sov. J. Quantum Electron. 15, 886-887 (1985); D. Rosenblatt, A. Sharon, A. A. Friesem, "*Resonant grating waveguide struc-* ture," IEEE J. Quant. Electronics 33, 2038-2059 (1997).] The real part of the propagation constant may be expressed by the phase matching condition $$k_0 n_c \sin\theta - iK = \beta_i, \tag{1}$$

where i is the diffraction order index, $k_0=2\pi/\lambda$ is the free-space wave number, K is the magnitude of the grating vector, and θ is the angle of incidence. The effective leaky-mode (excited with the i=1 spectral order, for example) propagation constant can be expressed as $\beta_1=\beta-j\alpha$ where j is the imaginary unit. The electric field associated with this mode varies as $$E_{LM} \sim \exp(j\beta x - \alpha x) \tag{2}$$

and thus the mode decays on travel along the resonant element as $\sim\exp(-\alpha x)$. For normal incidence and leaky-mode excitation by the $i=\pm 1$ orders, β=K yielding $$\Lambda = \lambda/N \tag{3}$$

where N is the effective mode index of refraction. Accordingly, at normal incidence a second-order Bragg condition prevails. The two counter-propagating leaky modes, driven by the input wave, set up a standing wave pattern in the waveguide layer at resonance; they are also coupled by the second-order Bragg condition.

For a given diffracted wave (usually i=1 and/or i=-1) exciting a leaky mode, the mode-propagation constant $\beta(\lambda_0)$ can be estimated by solving the eigenvalue equation of the waveguide-grating structure. [S. S. Wang and R. Magnusson, "*Theory and applications of guided-mode resonance filters,*" Appl. Opt. 32, 2606-2613 (1993); S. S. Wang and R. Magnusson, "*Multilayer waveguide-grating filters,*" Appl. Opt. 34, 2414-2420 (1995).] Thus, with β known, the approximate resonance wavelength may be found from Equation (1). To find the exact resonance wavelength, the problem must be solved rigorously; the approximate wavelength provides a good starting value for the numerical computations. The resonance spectral linewidth may typically be narrow and can be controlled by the modulation amplitude, fill factor, layer thickness, and the refractive-index contrast of the device layers. The resonance response (location and linewidth) is polarization dependent due to inherent difference in modal characteristics of excited TE- and TM-waveguide modes. The spectral resonance location can be effectively set by the choice of the period.

Figure 4:
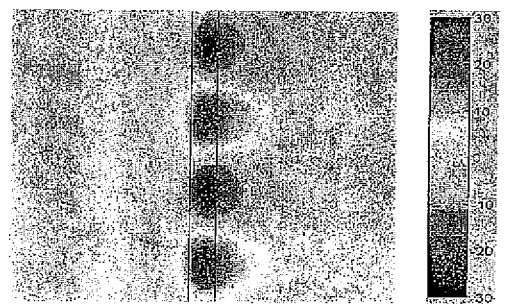
FIG. 4 is a snapshot of the standing-wave pattern associated with the leaky mode resonance of FIG. 3.

Referring to FIGS. 2 to 4, there is shown a single periodically modulated layer surrounded by regions of lower effective dielectric constant with a normally incident, TE-polarized wave in accordance with an aspect of the present disclosure. $S_i$ represents diffracted waves, $\in_i$ is the dielectric constant, and Λ is the grating period. Numerical results may be obtained using rigorous-coupled wave analysis (RCWA) [T. K. Gaylord and M. G. Moharam, "*Analysis and applications of optical diffraction by gratings,*" Proc. IEEE 73, 894-937 (1985)] and with the finite-difference time domain method (FDTD) [A. Taflove and S. C. Hagness, *Computational Electrodynamics The Finite-Difference Time-Domain Method, $2^{nd}$ edition*, Artech House, Norwood, Mass. (2000)] to provide quantitative information on relative field strengths and spatial extents associated with the near fields. The $S_0$ wave (zero order), as shown in FIG. 3, propagates along the z direction with reflected wave amplitude close to unity producing the standing-wave pattern shown by interference with the unit-amplitude input wave. Thus, at resonance, most of the energy is reflected back. The evanescent diffracted waves $S_1$ and $S_{-1}$ constitute the leaky mode. Because the grating layer may be used as both waveguide and phase matching element in the present case, the maximum field value is located in the grating layer with the evanescent tails gradually penetrating into the substrate and cover. The standing wave pattern formed by the counter-propagating $S_{-1}$ and $S_{+1}$ waves at a certain instant of time is shown in FIG. 4. Since the $S_{\pm 1}$ space harmonics correspond to localized waves, they can be very strong at resonance. For the parameters selected in the present exemplary case, the maximum field amplitude may be enhanced by a factor of approximately 75 with modulation ($\Delta\in/\in_{av}$) of 0.011; and by approximately 750 with modulation of 0.0011. The maximum amplitude of $S_1$ is inversely proportional to modulation strength over the modulation range in the present case. In general, small modulation implies narrow linewidth and a large resonator Q factor $$Q = \lambda/\Delta\lambda \tag{4}$$

and thus, while the near field is enhanced with small modulation, the linewidth simultaneously becomes narrow. With a narrow linewidth, the resonance becomes very delicate, and in the present case, the loss in the material becomes an important factor in establishing the actual values of the fields at resonance. Further, efficient coupling into such a fine-line resonance requires well-collimated light beams. Consideration of these factors is significant in effectively applying the near-field enhancement associated with resonant periodic waveguides, for example, in nonlinear optics, optical switching, or particle manipulation.

Guided-mode resonant interaction may be manifested as rapid spectral or angular variations of the diffraction efficiencies (~intensities) of the propagating waves. When zero-order gratings are used, in particular, a high-efficiency resonance reflection can be obtained, which is the basis for high-efficiency filtering. Accordingly, with proper design, symmetric, low-sideband filters may be implemented. Applications such as GMR lasers, filters, modulators, as well as any of a variety of other similar optical devices, do not necessarily require symmetrical lines or low sidebands as such devices use only the top of the resonance peak and/or are more linear in the asymmetric regime.

Figure 5:
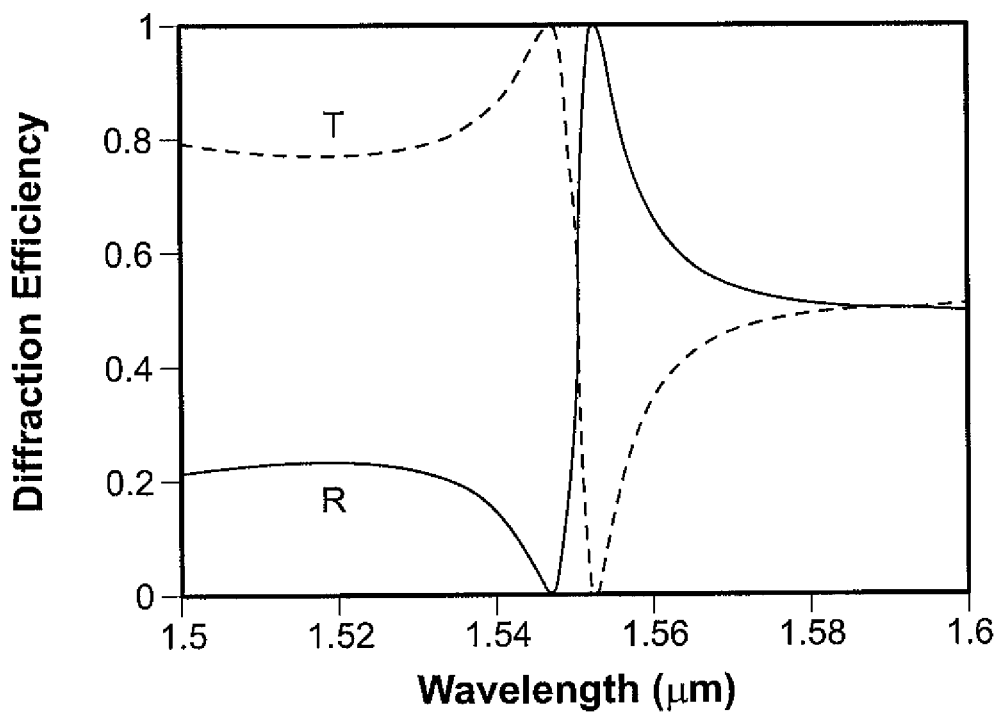
FIG. 5 is a graphical representation of a characteristic lineshape of a single-layer resonant structure in accordance with an illustrative aspect of the present disclosure.

Referring to FIG. 5, a calculated resonance lineshape for an arbitrary, zero-order periodic film is graphically depicted. As shown, the resonance is generally asymmetrical and exhibits a reflection peak near a minimum. Also, the transmittance has a corresponding minimum and a peak. A rapid variation in the phase is associated with the illustrated resonance effect. Accordingly, in an aspect of the present disclosure, various optical devices can be designed by optimizing the resonance peak; for example, with additions of antireflection layers to reduce the sidebands, bandstop, or reflection filters are obtained. For example, the transmission peak may be optimized to provide bandpass, or transmission, optical filters. Further, optical devices including, for example, optical filters having versatile spectral attributes may, in accordance with a preferred aspect of the present disclosure, be implemented with modulated films possessing asymmetric grating profiles. The profile asymmetry preferably breaks the leaky mode degeneracy at normal incidence to thereby permit precise spectral spacing of interacting leaky modes leading to greater flexibility in the design of optical devices.

Figure 6A:
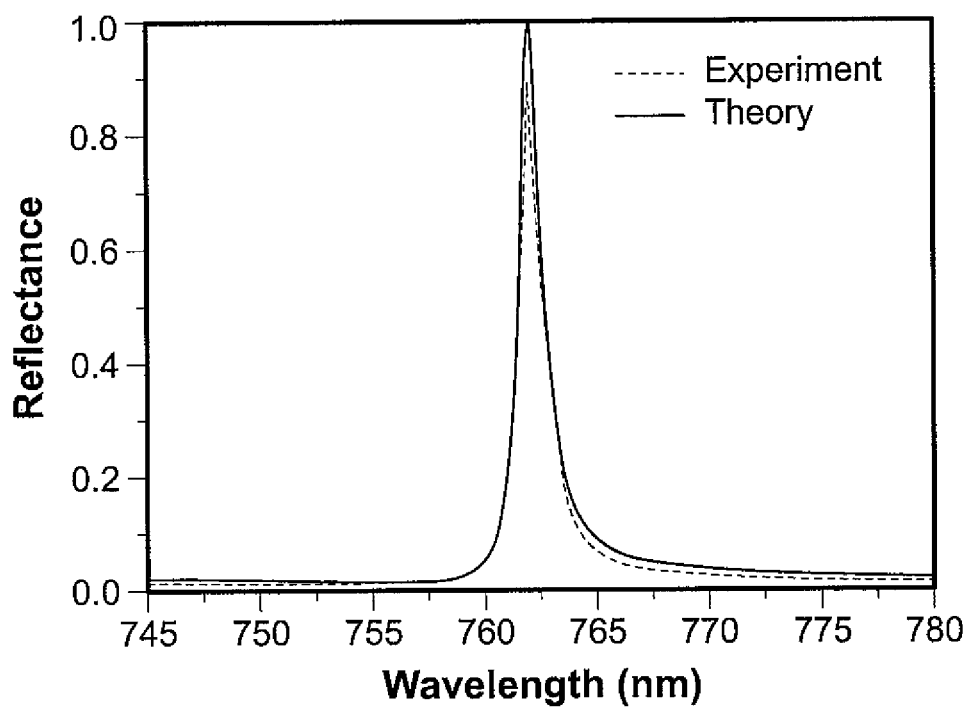
FIGS. 6(a), 6(b) and 6(c) provide a graphical representation, a schematic of an exemplary dielectric resonance element, and a scanning electron micrograph (SEM), respectively. In particular, FIG. 6(a) demonstrates a comparison between experimental data and theory where parameters for the theoretical curve fit are close to nominal values (i.e., $n_c=1.0$, $n_1=1.454$ ($SiO_2$), $n_2=1.975$ ($HfO_2$), $n_s=1.454$, $d_1=135$ nm, f=0.58, $d_2=208$ nm, $\Lambda=446$ nm, and $\theta=0°$).
Figure 6B:
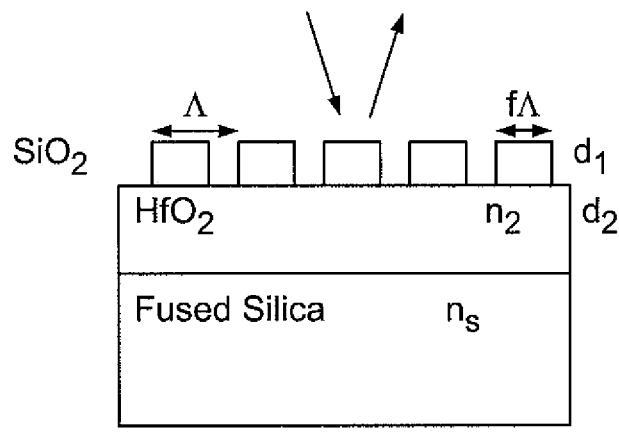
Figure 6C:
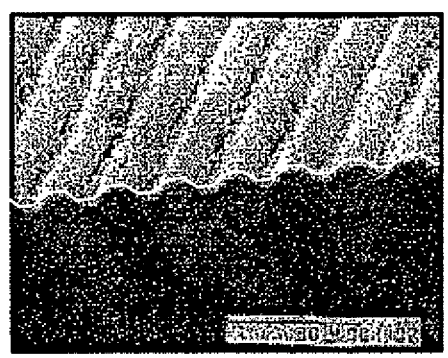

Referring to FIGS. 6(*a*) to 6(*c*), an exemplary dielectric guided-mode resonance device is shown which preferably acts as a bandstop filter with spectrum of interest being reflected in a narrow band with relatively low sidebands. As shown, although the theoretical calculation predicts 100 percent peak efficiency for a plane wave incidence, the efficiency is diminished in practice by various factors such as material shortcomings (e.g., scattering losses), incident beam divergence, and the lateral device size. By way of illustration, as shown in FIG. 6(b), an exemplary resonant device according to the present disclosure can be fabricated by depositing a waveguide grating (WGG) HfO$_2$ layer (e.g., approx. 210 nm and refractive index of n=2) and a SiO$_2$ layer (e.g., approx. 135 nm and n approx. 1.5) on a fused silica substrate (e.g., 1-inch diameter glass with refractive index n=1.5). Alternatively, an air/silicon WGG/insulator system may equally be used. In the present case, the SiO$_2$ grating may in turn be obtained by a series of processes including, for example, holographic recording of a photoresist mask grating (period of Λ=446 nm) with an Ar+UV laser (λ=364 nm) in a Lloyd mirror interference setup, development, deposition of an approx. 10 nm Cr mask layer on top of the photoresist grating, lift-off of the photoresist grating, and subsequent reactive-ion etching of the SiO$_2$ layer with CF$_4$. The surface roughness evident in the SEM of FIG. 6(c) contributes to the reduction in peak efficiency.

Figure 7A:
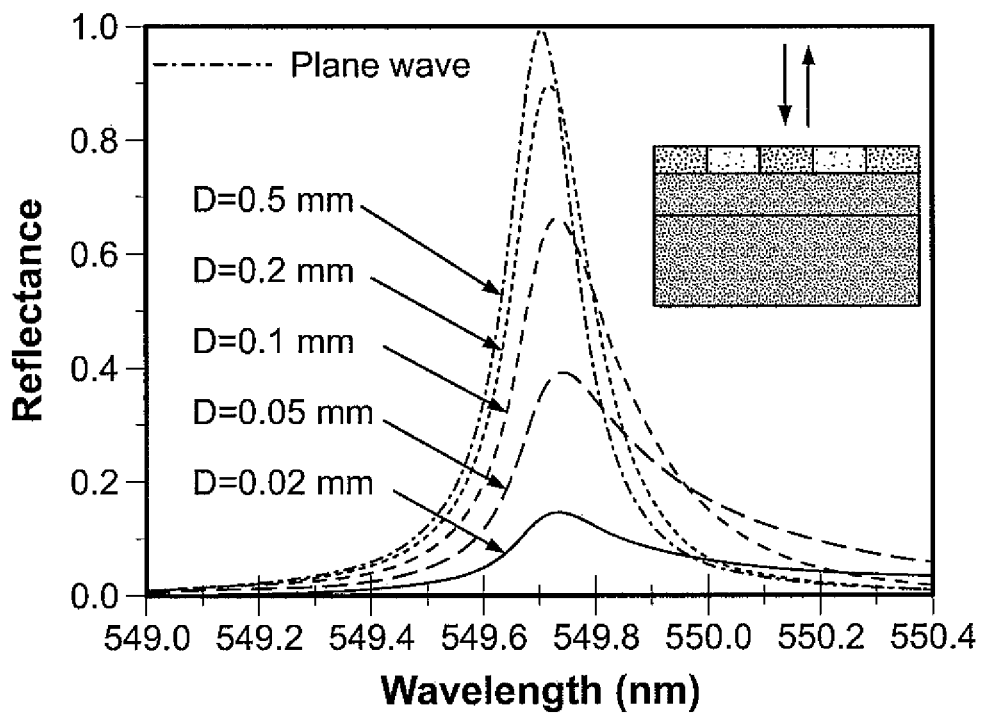
FIGS. 7(a) and 7(b) are graphical representations illustrating the effect of integrating a first-order Bragg grating into the resonance structure.
Figure 7B:
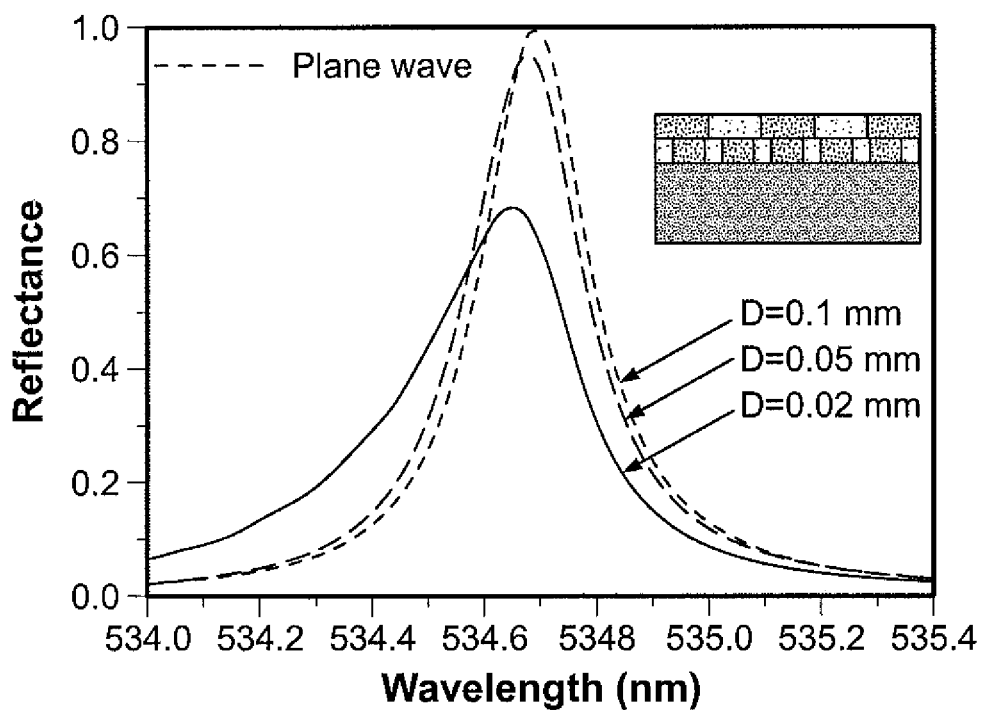
Figure 7C:
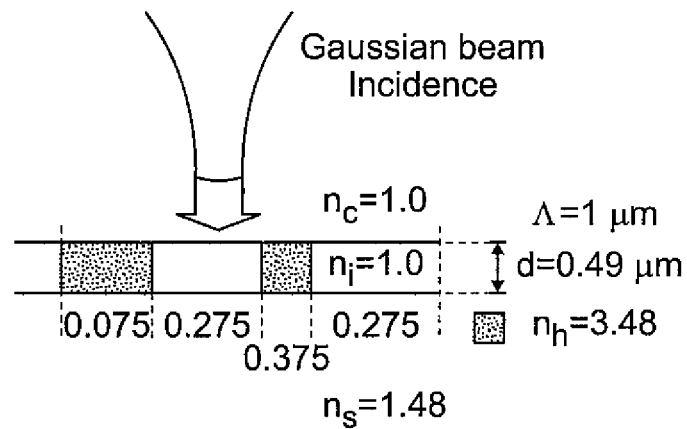
FIGS. 7(c) and 7(d) demonstrate diffraction properties of a broadband TE-polarized high reflector with Gaussian-beam incidence as an illustration of the ability of the devices of the present disclosure to efficiently resonate and reflect narrow incident laser beams.
Figure 7D:
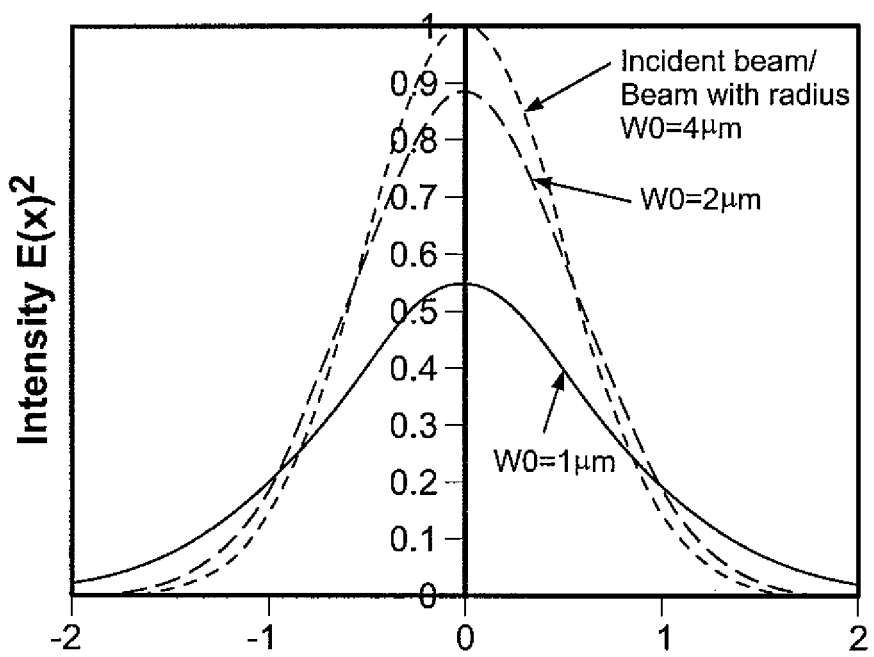

Furthermore, although the presently disclosed resonance filters exhibit high reflectance under a plane wave incidence, reflectance reduction and spatial modification of the beam profile occur under a practical finite beam illumination [See, S. Zhang and T. Tamir, "Spatial modifications of Gaussian beams diffracted by reflection gratings," J. Opt. Soc. Am. A 6, 1368-1381 (1989), I. A. Avrutsky and V. A. Sychugov, "Reflection of a beam of finite size from a corrugated waveguide," J. Mod. Optics 36, 1527-1539 (1989)]. This result stems from the typically narrow angular linewidth of the resonance filter. Accordingly, representing a Gaussian beam with an angular spectrum of plane waves, only the fraction of these plane wave components that fall within the filter's angular aperture will resonate. In an aspect of the present disclosure, a wider angular linewidth can preferably be achieved by incorporation of a first-order Bragg grating [See, F. Lemarchand, A. Sentenac, and H. Giovannini, "Increasing the angular tolerance of resonant grating filters with doubly periodic structures," Opt. Lett. 23, 1149-1151 (1998)]. In the present case, a grating period (Λ$_2$) may be chosen as Λ$_2$=Λ/2 to satisfy the first-order Bragg condition for the leaky modes. It is noted that consistent with Equation 3, the first-order grating cannot phase-match to the incident wave; it only provides waveguiding and coupling between the leaky modes. Exemplary results such as shown in FIGS. 7(a) and 7(b) demonstrate the improvement in resonance efficiency. For instance, as shown, a 100-µm beam resonates fully in the double grating device. Moreover, in accordance with exemplary aspects of the present disclosure, FIGS. 7(c) and 7(d) show that when employing a resonant element with broad reflection band and wide angular aperture, even a narrow Gaussian beam is efficiently reflected. It can be seen in this example that even when the waist of the Gaussian beam is only 8 µm in diameter (i.e., beam radius w$_0$=4 µm), high reflection efficiency (>98%) may be achieved.

Referring to FIGS. 8 to 12, illustrative spectral filters and like resonant photonic devices enabled by resonant elements with asymmetric grating profiles will now be discussed. As shown in FIGS. 8(a) and 8(b), exemplary single-layer modulated films may be designed, by placement of grating materials within each period, to have profile asymmetry. In this case, the asymmetry preferably works to remove the leaky-mode degeneracy at normal incidence. FIG. 8(a) is intended to demonstrate that GMR will only appear at one edge of the second stopband [See, D. L. Brundrett, E. N. Glytsis, T. K. Gaylord, and J. M. Bendickson, "Effects of modulation strength in guided-mode resonant subwavelength gratings at normal incidence," J. Opt. Soc. Am. A. 17, 1221-1230 (2000)] for a symmetric grating while resonance peaks will appear at each edge of the band for a grating without reflection symmetry as demonstrated by FIG. 8(b). As shown, the value of the average refractive index is comparably the same for both structures. Hence, the low grating index used in the computation can be found as $$n_1 = \sqrt{n_{avg}^2 - F n_h^2 / (1-F)} \qquad (5)$$

where F=F$_1$+F$_2$ for the type II profile. The dispersion curves can be calculated with the method introduced by Peng et al. [See, S. T. Peng, T. Tamir, and H. L. Bertoni, "Theory of periodic dielectric waveguides," IEEE Trans. Microwave Theory and Tech. MTT-23, 123-133 (1975)] and the spectra and field profiles can be calculated with software/computer codes based on rigorous coupled-wave analysis of wave propagation in periodic media [See, T. K. Gaylord and M. G. Moharam, "Analysis and applications of optical diffraction by gratings," Proc. IEEE 73, 894-937 (1985); M. G. Moharam, D. A. Pommet, E. B. Grann, and T. K. Gaylord, "Stable implementation of the rigorous coupled-wave analysis for surface-relief gratings: Enhanced transmittance matrix approach," J. Opt. Soc. Am. A 12, 1077-1086 (1995)].

Figure 8A:
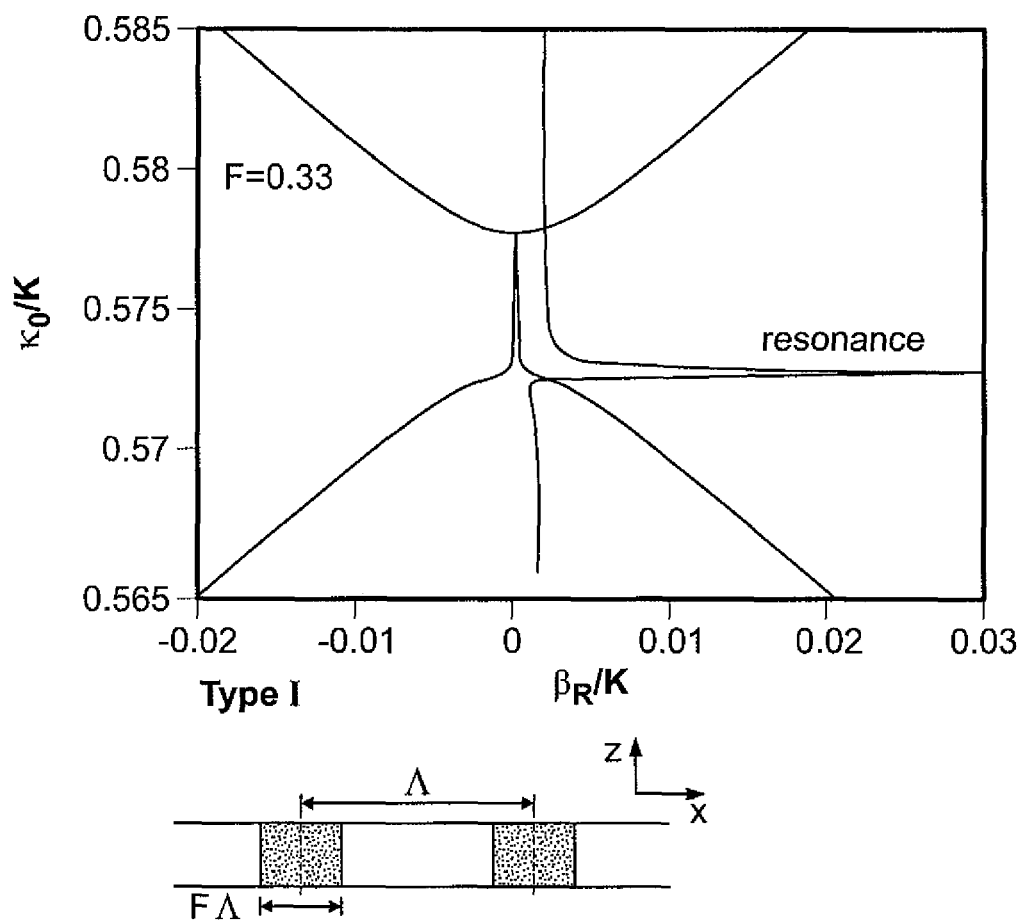
FIGS. 8(a) and 8(b) are exemplary Brillouin diagrams showing second stopband detail for a single-layer waveguide grating.
Figure 8B:
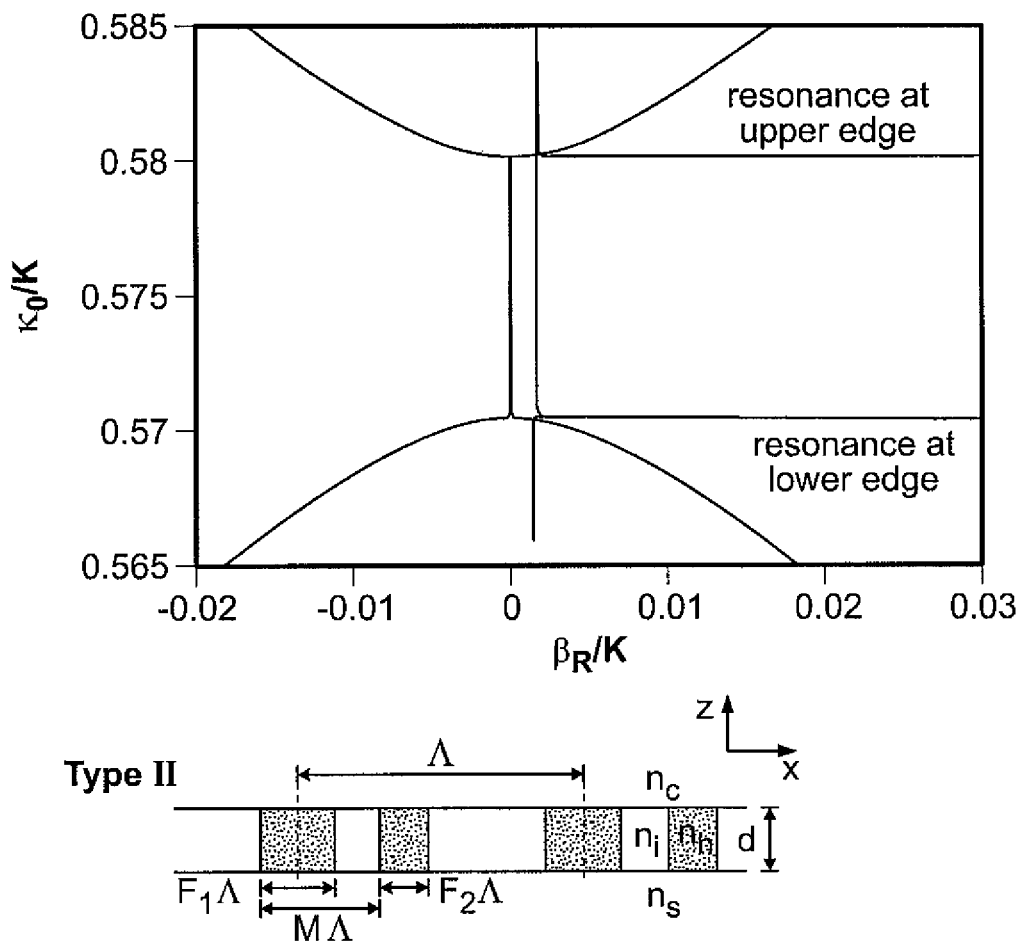

With further reference to FIGS. 8(a) and 8(b), the exemplary profiles being denoted by type I (i.e., grating with symmetric profile) and type II (i.e., grating with generally asymmetric profile), as shown, each have a cover index n$_c$=1, a substrate index n$_s$=1.48, an average grating index n$_{avg}$=2, a high grating index n$_h$=2.05, a period Λ=0.3 µm, and a thickness d=0.14 µm. It is assumed in the present case calculations that the gratings are transversely infinite and that the materials are lossless. Further, the incident wave, in the present case, is taken as being TE polarized (electric vector normal to the page) and at normal incidence. In the figures, k$_0$=2π/λ where λ is the wavelength in free space, K=2π/Λ, and β$_R$ is the real part of the propagation constant of the leaky mode. Note that these dispersion curves are associated with the TE$_0$ mode and are transferred to the first Brillouin zone. The dashed curves are intended to demonstrate the resonance spectrum at normal incidence (not to scale).

Figure 9:
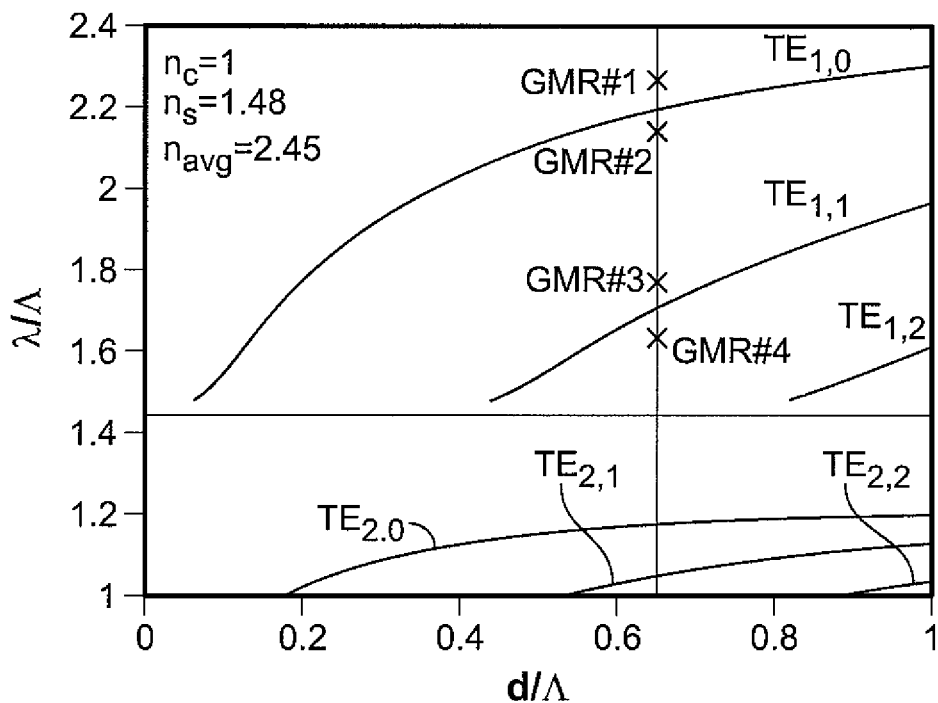
FIG. 9 is a graphical representation of estimated resonance locations based on the eigenfunction of an equivalent homogeneous waveguide with the material parameters indicated on the figure.

Turning to FIG. 9, multiple GMRs resulting from interaction between several modes and multiple evanescent diffracted orders can be utilized to condition the spectral response. For example, this method has been used to design three-layer wideband bandstop filters [See, Z. S. Liu and R. Magnusson, "Concept of multiorder multimode resonant optical filters," IEEE Photonics Tech. Lett. 14, 1091-1093 (2002)] and single-layer bandpass filters [See, Y. Ding and R. Magnusson, "Doubly-resonant single-layer bandpass optical filters," Opt. Lett. 29, 1135-1137 (2004)] using symmetric grating profiles. One difficulty in using this approach stems from the fact that the resulting resonance locations may be relatively widely separated as, for example, illustrated in FIG. 9. The graph of FIG. 9 may be constructed using a homogeneous planar waveguide eigenvalue equation and a phase-matching condition needed for coupling [See, S. S. Wang and R. Magnusson, "Theory and applications of guided-mode resonance filters," Appl. Opt. 32, 2606-2613 (1993)]. The order-mode resonance connection is indicated in FIG. 9 by TE$_{m,v}$, where m represents the evanescent diffraction order exciting the v-th mode; for example, the resonance formed by the interaction between TE$_2$ and the 1st evanescent diffracted order is written as TE$_{1,2}$. The resonances falling below the horizontal line λ/Λ=1.48 will have diffracted orders other than the 0th orders radiating. It is noted that higher orders draw power and decrease the diffraction efficiency of the zero orders and thus may not be desirable.

For an asymmetric structure, as described above, there will be two resonances associated with each mode, one on each side of the curves in FIG. 9. For example, for a structure with d/Λ=0.65 in FIG. 9, there will be four such GMRs of interest, nondegenerate GMR#1 and GMR#2 associated with leaky mode $TE_0$ and GMR#3 and GMR#4 associated with leaky mode $TE_1$. The separation (in wavelength or frequency) of the two GMRs associated with a particular nondegenerate leaky mode is related to the width of the bandgap demonstrated in FIGS. 8(a) and 8(b). Thus, the spectral separation of GMR#1 and GMR#2 indicates the width of the $TE_0$ stopband and that of GMR#3 and GMR#4 shows the width for the $TE_1$ band. The width of the stopband can be increased by increasing the modulation strength $\Delta\in=n_h^2-n_l^2$ [See, S. S. Wang and R. Magnusson, "*Theory and applications of guided-mode resonance filters*," Appl. Opt. 32, 2606-2613 (1993)] and by profile design. As shown in FIG. 9, possible interaction between GMR#2 and GMR#3 may be seen as $\Delta\in$ increases. Since each GMR is associated with 100% reflection, placing two GMRs near each other opens the possibility of a flat reflection band.

Thus, in accordance with a preferred aspect of the present disclosure, besides modulation, the separation of two GMRs can be controllable through the modulation profile by inducing asymmetry and hence modal non-degeneracy. Another preferred aspect of the present disclosure relates to the use of arbitrary materials distribution within each period to produce symmetric or asymmetric grating profiles to properly match the exciting evanescent orders and the resonant leaky modes. Therefore, with certain modulation strength available (i.e., given materials), it is preferably possible to design both wideband and narrow-band filter devices with geometric manipulations such as demonstrated by the following examples. As noted above, the present disclosure is not limited by the following examples, which are merely illustrative of the systems and/or methods of the present disclosure.

EXAMPLE 1

Figure 10A:
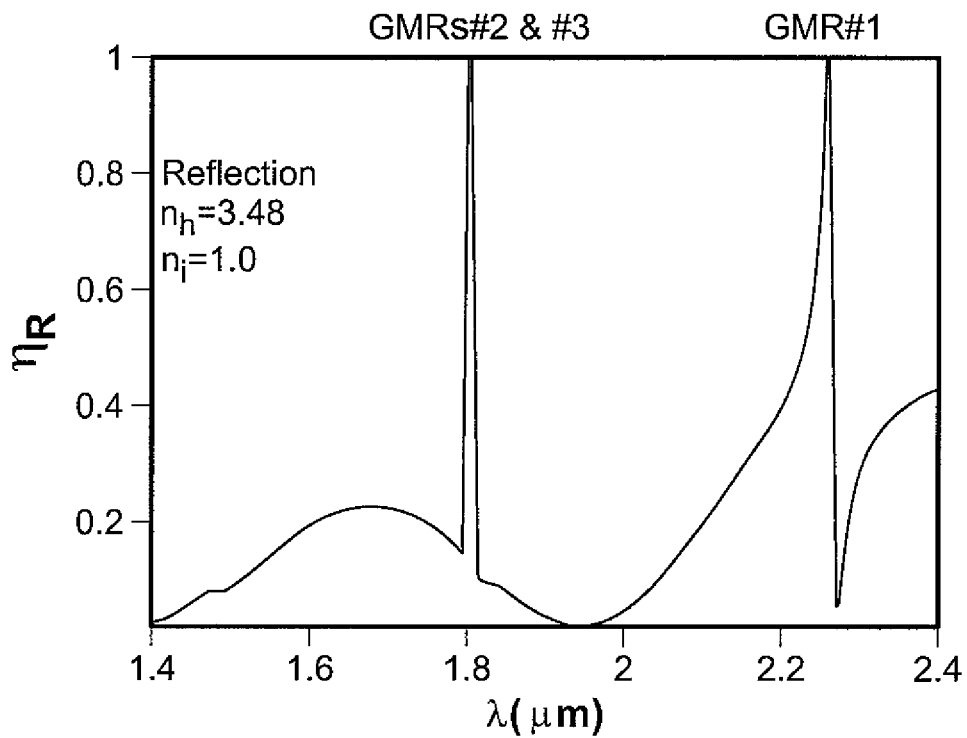
FIGS. 10(a) and 10(b) are graphical representations of exemplary spectra of a narrowband reflection filter where $F_1=0.397$, $F_2=0.051$, M=0.5, d=0.67 μm, $\Lambda=1$ μm, $n_c=1$, $n_h=3.48$, $n_s=1.48$, $n_{avg}=2.445$, $\eta_R$ is the reflectance, and $\eta_T$ is the transmittance.
Figure 10B:
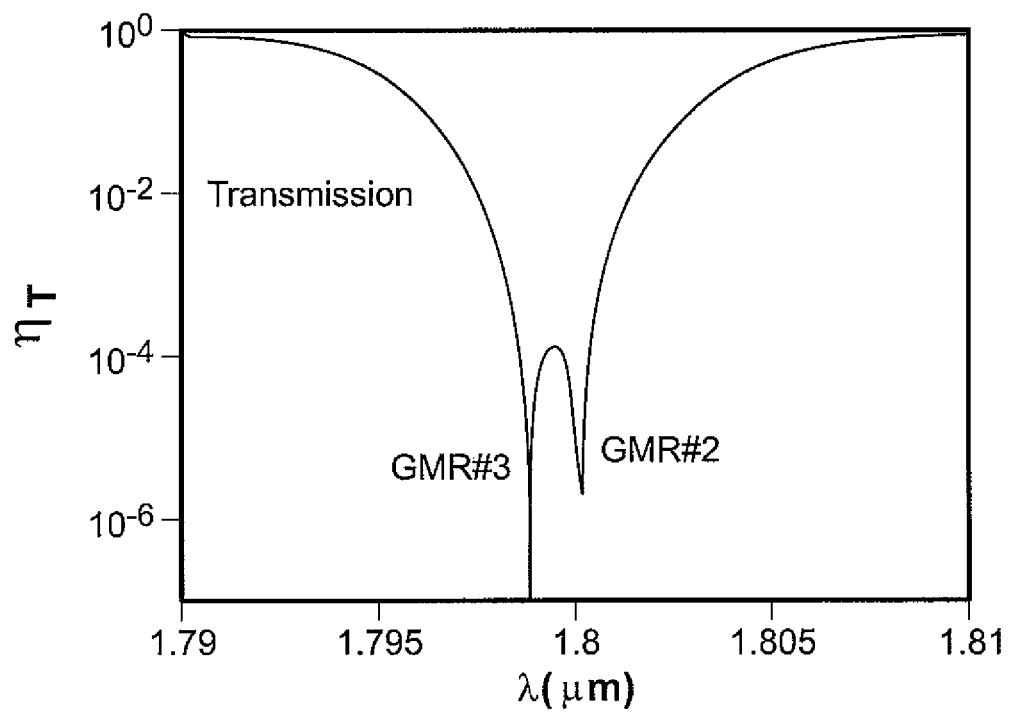

Referring to FIGS. 10(a) and 10(b), an exemplary bandstop filter with a narrow flattop and a type II profile as shown in FIG. 8(b) is demonstrated. As shown, the spectra pertinent to a bandstop filter with narrow flattop has near 1.8 μm wavelength and an approximate −35 dB transmission dip with bandwidth about 2 nm. The associated flat reflection top is formed by interacting GMR#2 and GMR#3, whose locations are seen in FIG. 10(b). Accordingly, the present exemplary filter can be enabled by interaction of the differentiated $TE_0$ and $TE_1$ modes as discussed/shown with reference to FIGS. 8(a) and 8(b).

Figure 11A:
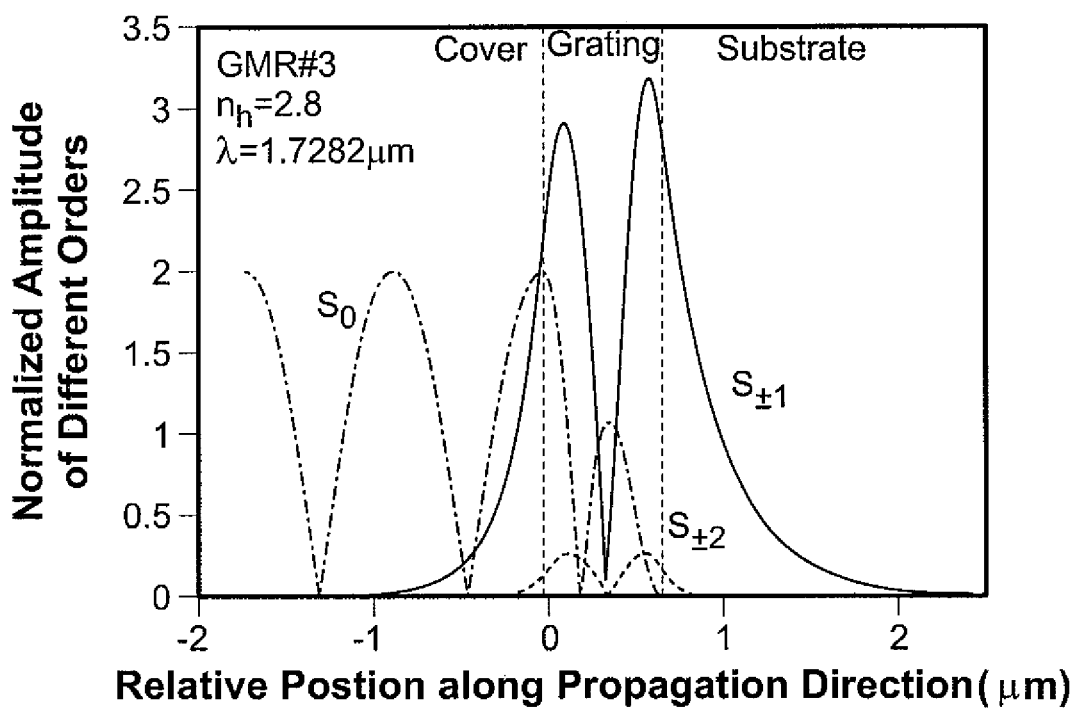
FIGS. 11(a) to 11(d) are graphical representations of exemplary field profiles of the excitation wave $S_0$ and leaky modes $S_{\pm1}$ and $S_{\pm2}$ pertaining to the exemplary resonant filter in FIGS. 10(a) and 10(b).
Figure 11B:
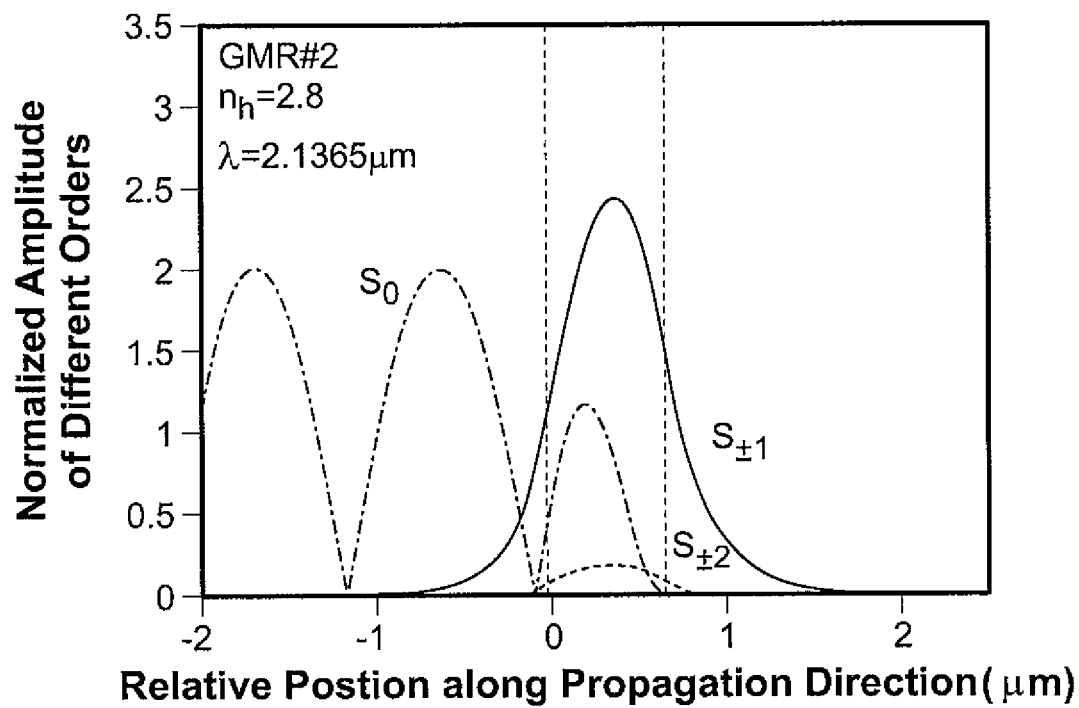
Figure 11C:
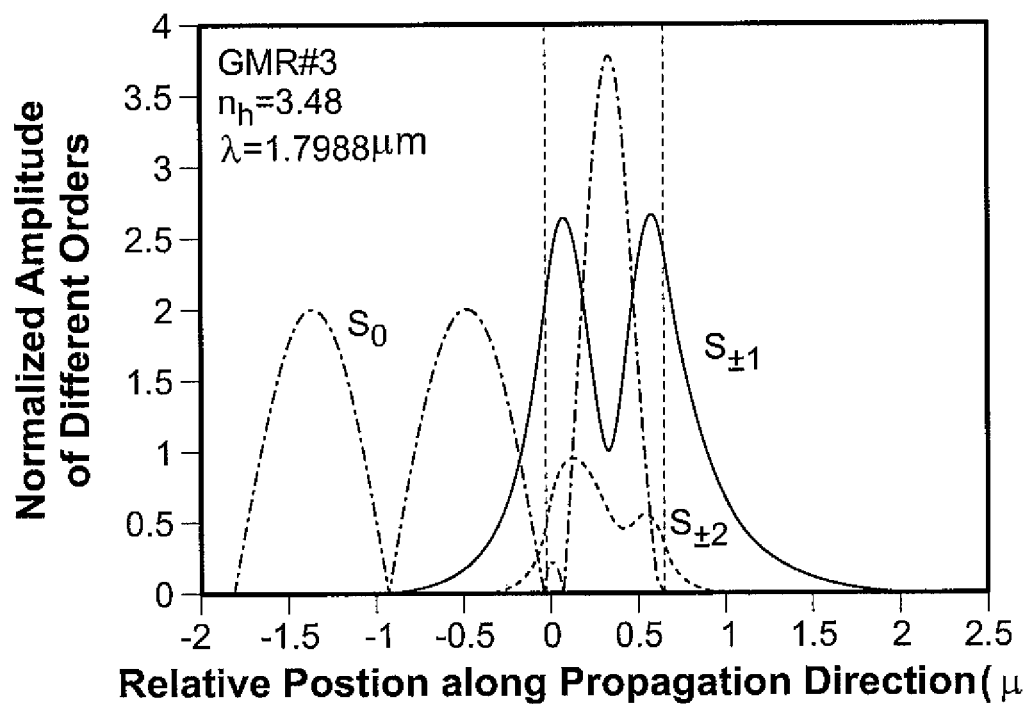
Figure 11D:
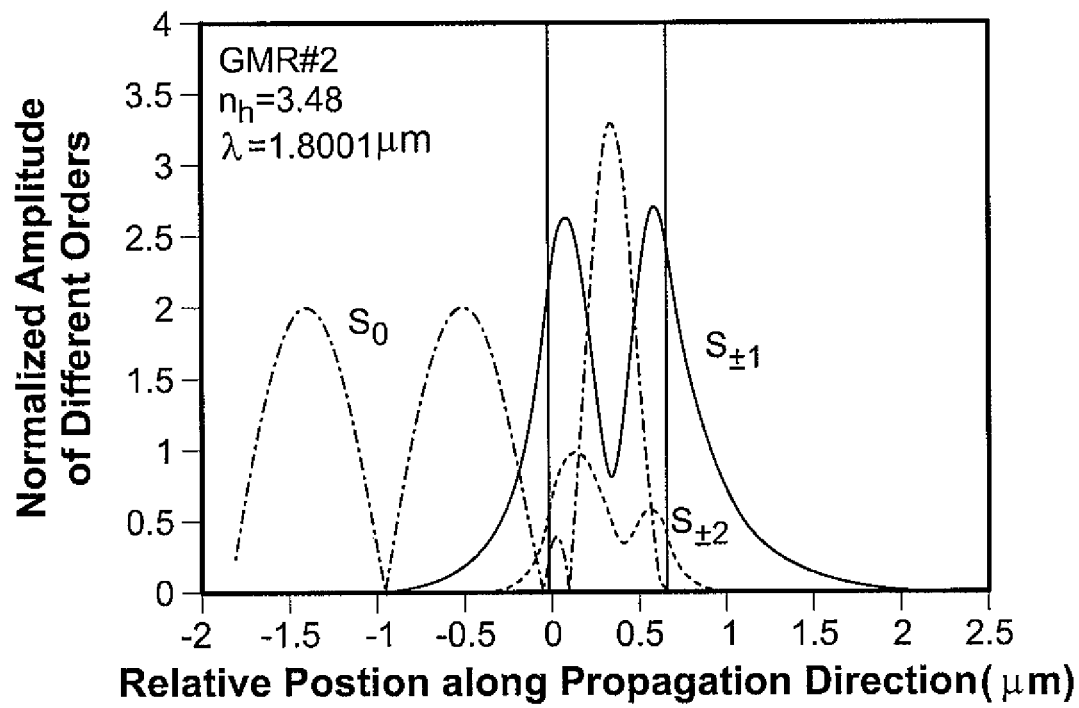

Further, the field profiles associated with this bandstop filter with narrow flattop and type II profile are demonstrated via FIGS. 11(a) to 11(d). FIGS. 11(a) and 11(b) show leaky-mode field profiles associated with GMR#3 and GMR#2, respectively, for a structure with $n_h$=2.8 while $n_{avg}$ is kept unchanged at 2.445. GMR#3 can be associated with a $TE_1$-like mode while GMR#2 is associated with a $TE_0$ mode as evidenced by FIGS. 11(a) and 11(b). As the modulation increases, there is some mixing of the modes on account of the resonance interaction, which is shown in FIGS. 11(c) and 11(d). It is noted in these computed results that as the modulation grows, higher evanescent diffraction orders ($S_{\pm 2}$ and $S_{\pm 3}$ shown) can contribute to the mode picture in accordance with the present disclosure.

EXAMPLE 2

Figure 12A:
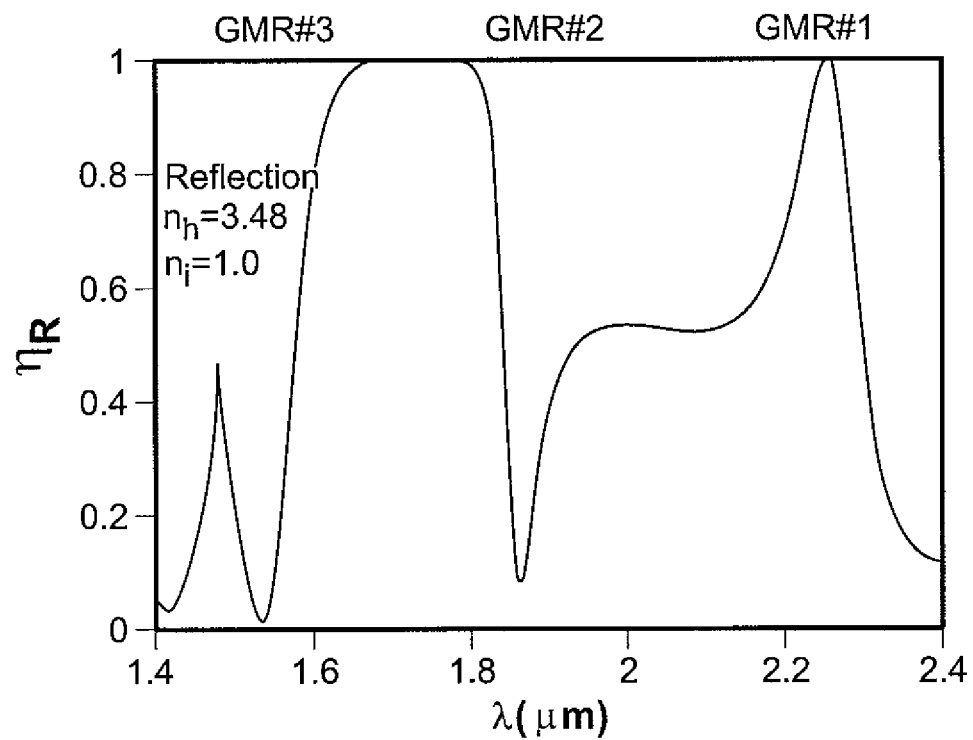
FIGS. 12(a), 12(b) and 12(c) are graphical representations of exemplary spectra of a wideband reflection structure where $F_1=0.35$, $F_2=0.1$, M=0.52, d=0.45 μm, $\Lambda=1$ μm, $n_c=1$, $n_h=3.48$, $n_s=1.48$, and $n_{avg}=2.45$.
Figure 12B:
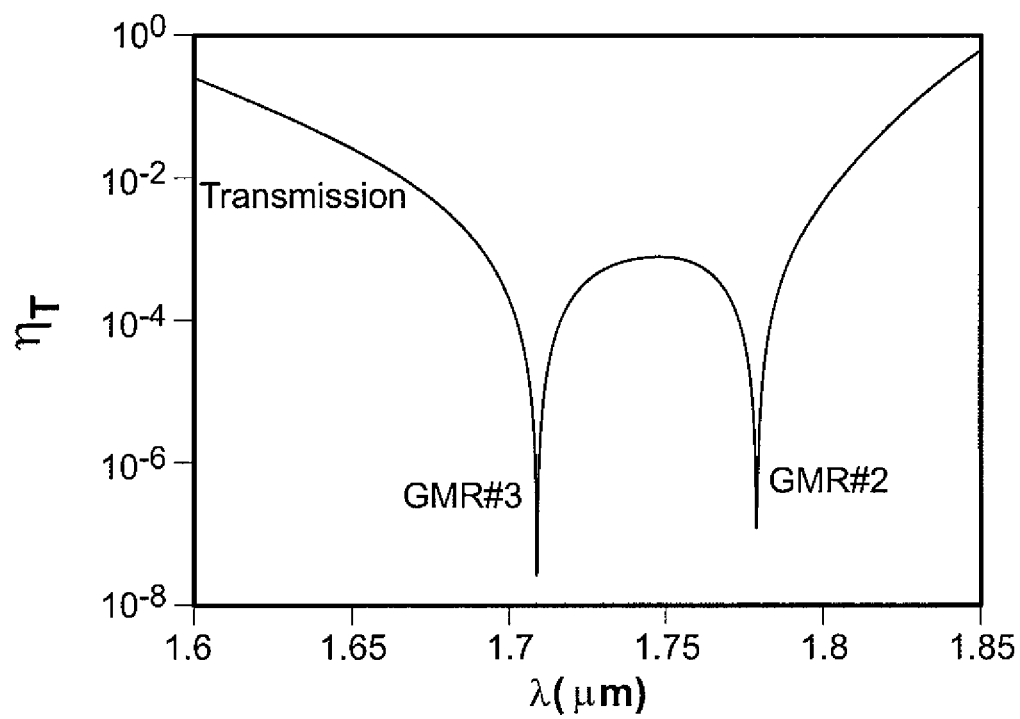
Figure 12C:
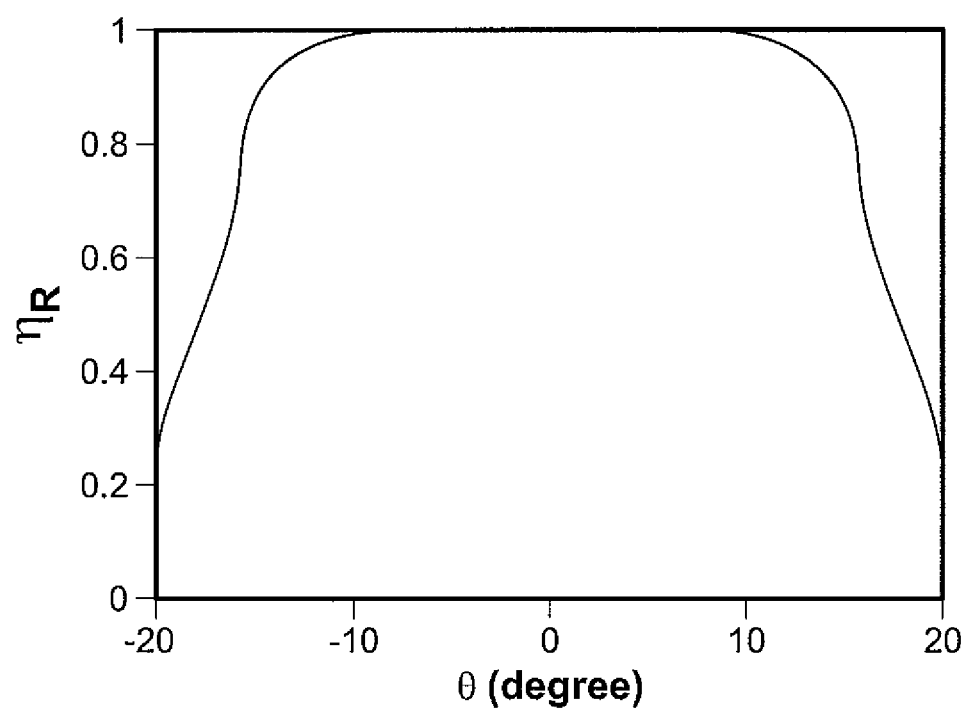

Referring to FIGS. 12(a) to 12(c), an exemplary bandstop filter with a wide flattop and a type II profile as shown in FIG. 8(b) is demonstrated. In this example, a bandstop structure with a wide flattop simulating a dielectric stack mirror is obtained. FIG. 12(a) shows the reflectance spectrum and FIG. 12(b) provides an enlarged view of the corresponding transmission spectrum. The corresponding wide angular spectrum associated with the present structure is shown in FIG. 12(c). As with the previous example, the flat reflection band is formed by GMR#2 and GMR#3 yielding a linewidth of approximately 150 nm with central wavelength near $\lambda$=1.75 μm.

EXAMPLE 3

Figure 13A:
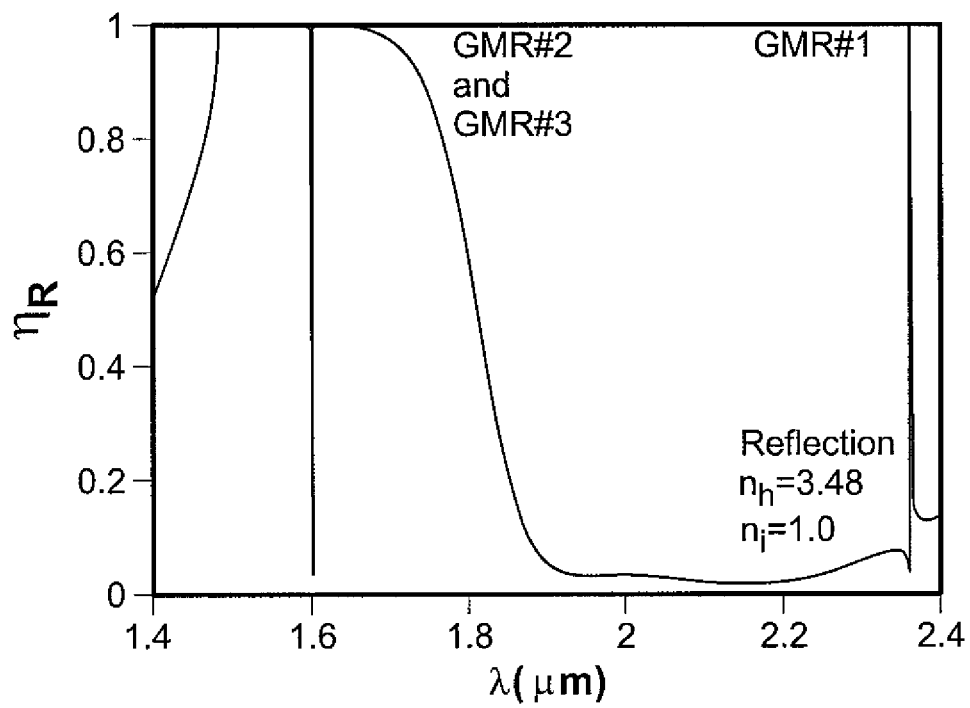
FIGS. 13(a) and 13(b) are graphical representations of exemplary spectra of a transmission structure. The parameters are: $F_1=0.5$, $F_2=0.05$, M=0.55, d=0.39 μm, $\Lambda=1$ μm, $n_c=1$, $n_h=3.48$, $n_s=1.48$, and $n_{avg}=2.667$.
Figure 13B:
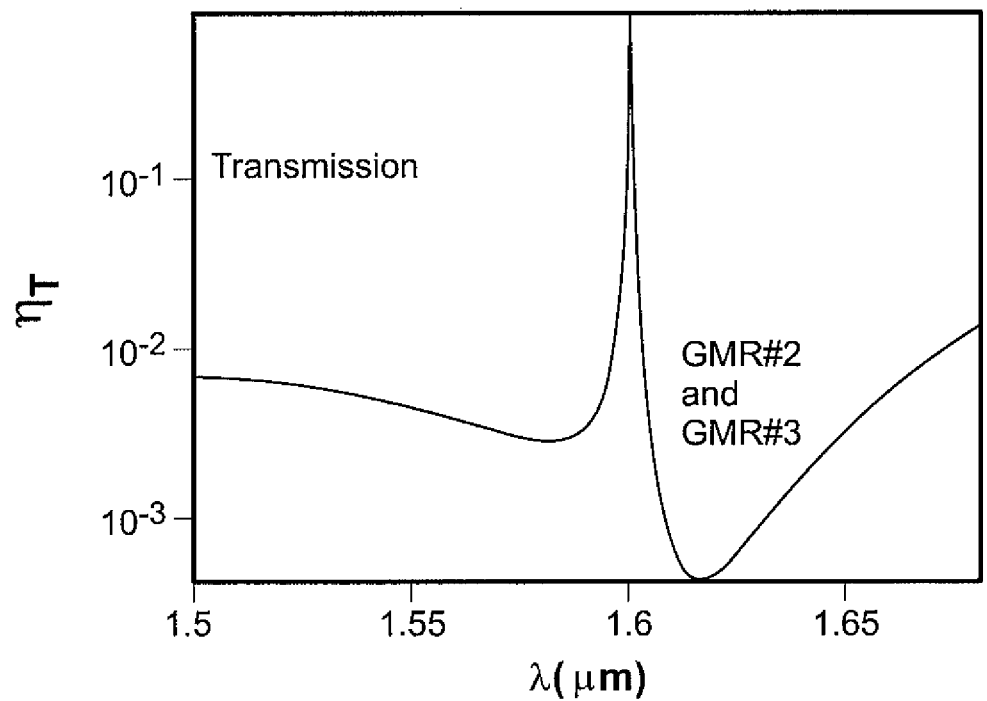

Referring to FIGS. 13(a) and 13(b), an exemplary bandpass filter with a type II profile as shown in FIG. 8(b) is demonstrated. As shown, there is a narrow transmission peak at approximately 1.6 μm and a wide transmission band between 1.9 and approximately 2.3 μm as indicated by the corresponding low reflectance region in FIG. 13(a). The background of the narrow transmission peak at approximately 1.6 μm is provided by GMR#2 and GMR#3, while the peak is due to the asymmetrical lineshape associated with GMR#2. The wide transmission band between 1.9 μm and approximately 2.3 μm is formed by the interaction between GMR#1 and GMR#2 shown in FIG. 9.

EXAMPLE 4

Figure 14A:
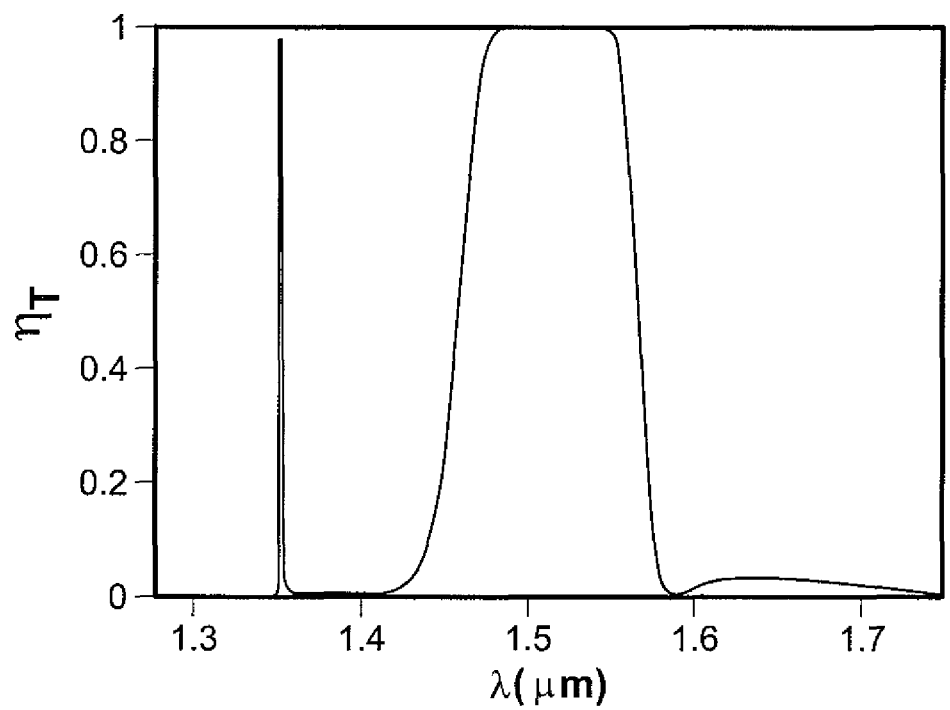
FIGS. 14(a) and 14(b) are graphical representations of spectra for a single-layer transmission structure, where
Figure 14B:
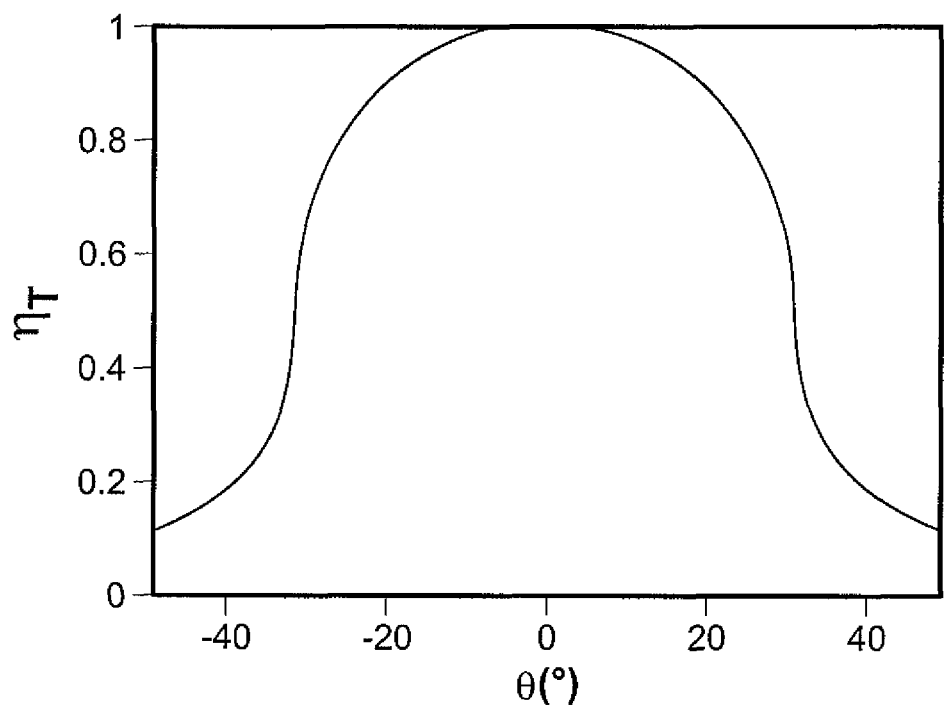

Referring to FIGS. 14(a) and 14(b), the spectra and corresponding angular spectrum for a single-layer transmission structure (i.e., a bandpass resonant element) are respectively shown. As shown, a wide flattop passband is realized near 1.5 μm and a narrow sideband at approximately 1.35 μm.

EXAMPLE 5

Figure 15A:
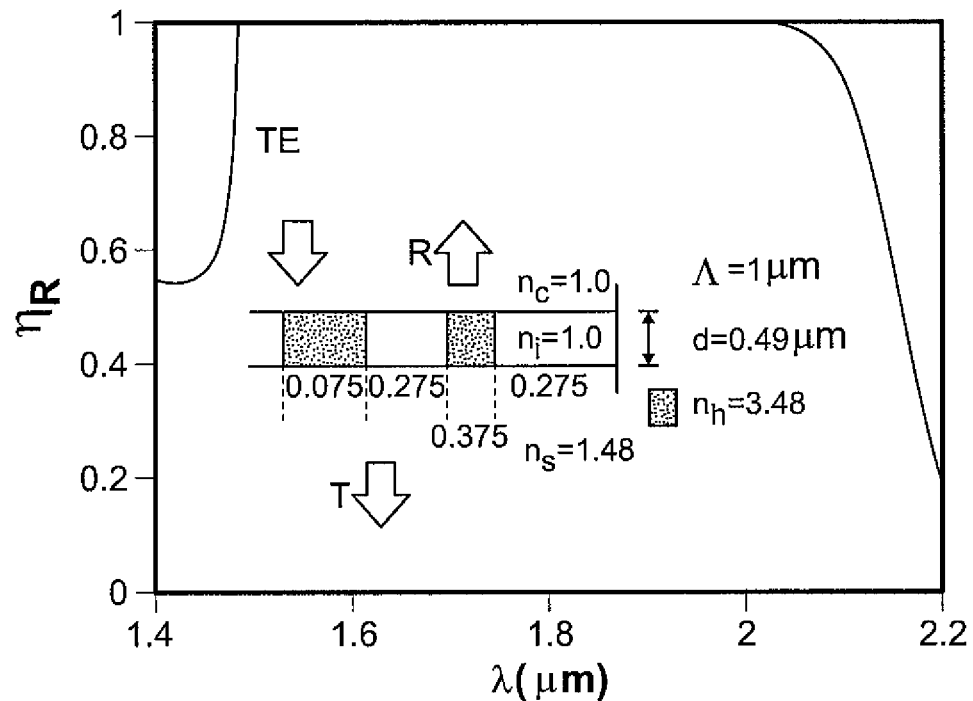
FIGS. 15(a) and 15(b) illustrate the spectral reflectance characteristics associated with exemplary resonance structures with FIG. 15(a) demonstrating TE polarization and FIG. 15(b) demonstrating TM polarization.
Figure 15B:
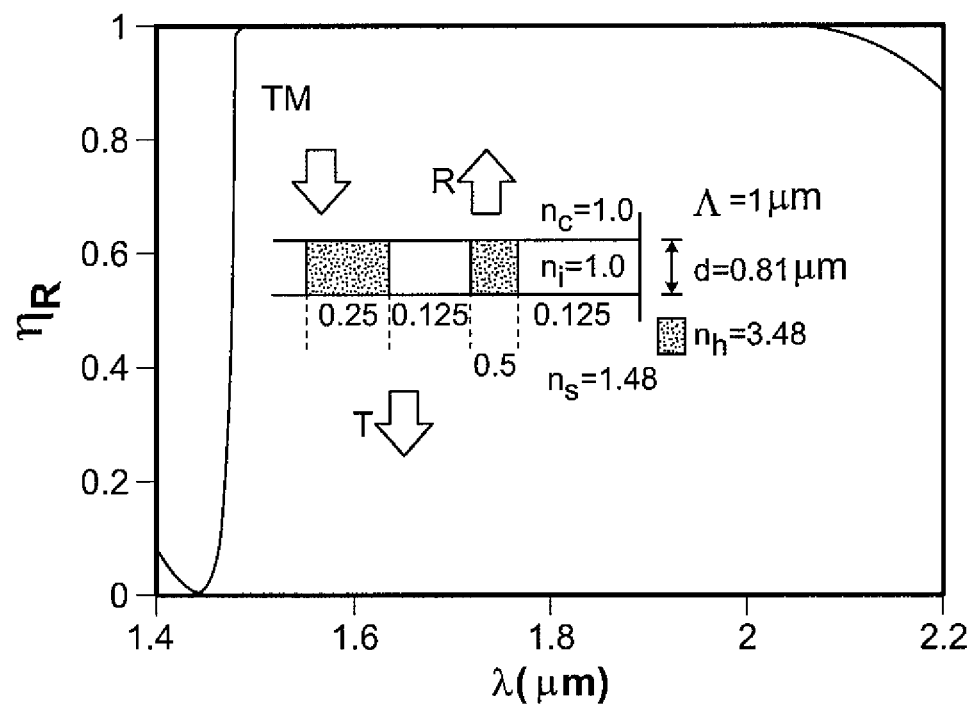

Referring to FIGS. 15(a) and 15(b), the spectral characteristics associated with a single-layer, wideband high reflector is illustratively shown with the TE polarization demonstrated in FIG. 15(a) and the TM polarization demonstrated in FIG. 15(b). These devices have the type II profile of FIG. 8(b) but apply symmetric materials distribution within the period as shown in the figure insets. These elements function as bandstop filters or reflectors with wide and flat spectra.

EXAMPLE 6

Figure 16A:
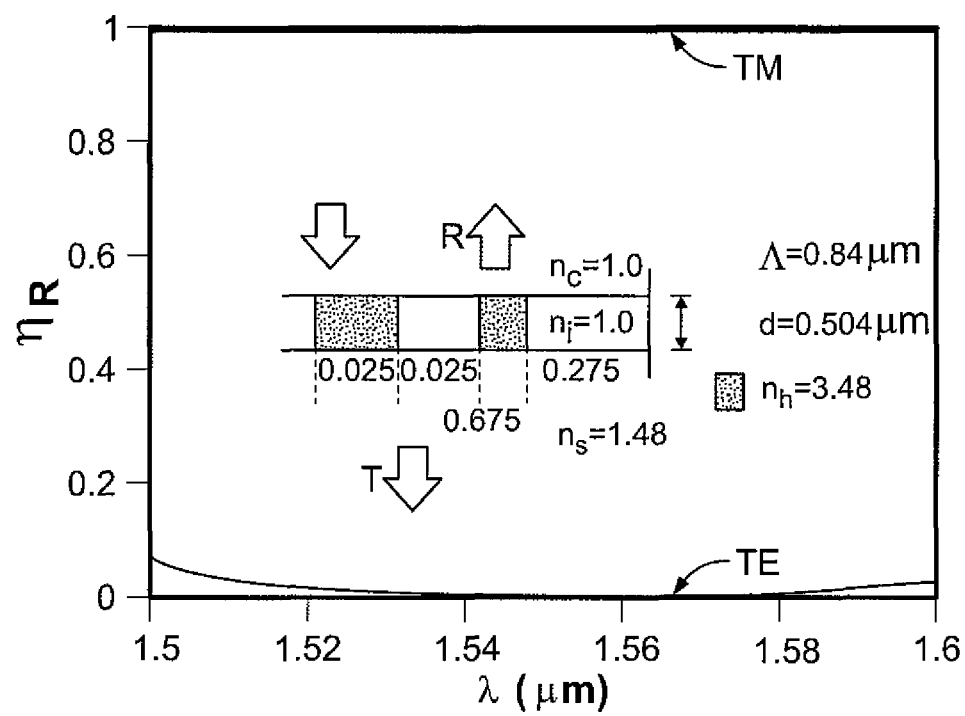
FIGS. 16(a) and 16(b) illustrate the spectrum of a polarizer and of an antireflection structure, respectively.
Figure 16B:
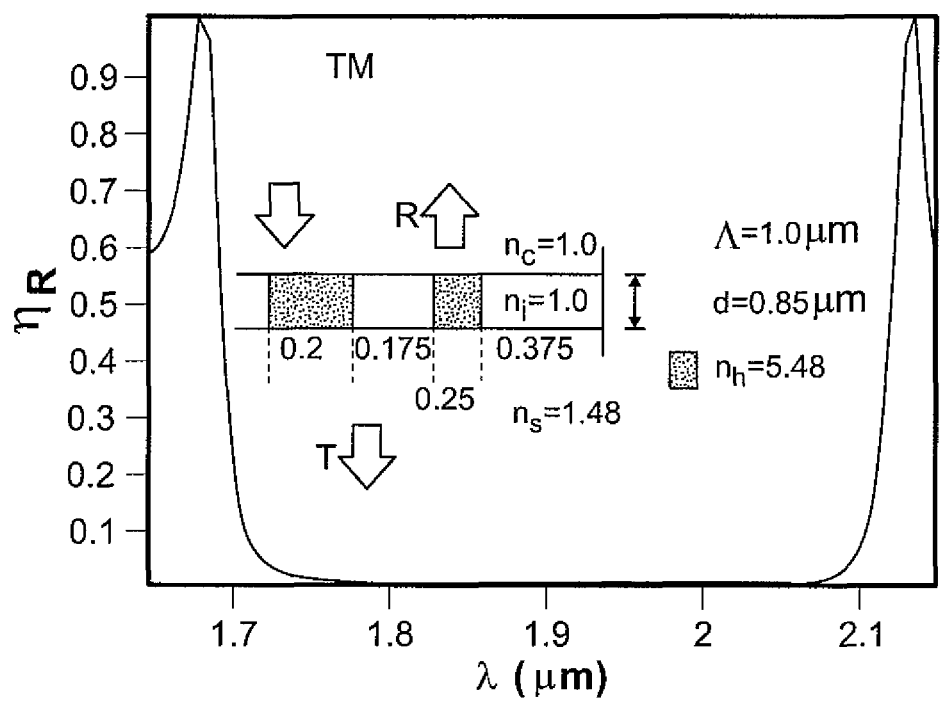

Referring to FIGS. 16(a) and 16(b), there is demonstrated a polarizer with a high extinction ratio and wide band in accordance with an illustrative aspect of the present disclosure (See FIG. 16(a)), as well as a structure with a flat passband, that is low reflection, across an extended region also in accordance with an illustrative aspect of the present disclosure (See FIG. 16(b)). These devices have the type II profile of FIG. 8(b) but apply asymmetric materials distribution within the period as shown in the figure insets.

In the foregoing examples, a high index material (e.g., $n_h$=3.48) was used in order to produce large modulation strength. It is noted that lower refractive indices may also be used. It is also noted that control of the width of the second stopband (i.e., the nondegenerate resonance locations at each edge) may involve tradeoff between the value of the modulation amplitude and the profile geometry.

Figure 17A:
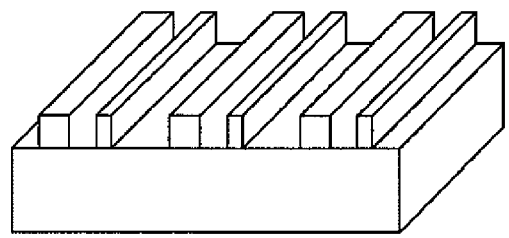
FIGS. 17(a), 17(b) and 17(c) schematically illustrate 1D and 2D resonant periodic gratings, respectively, having examples of asymmetric profiles.
Figure 17B:
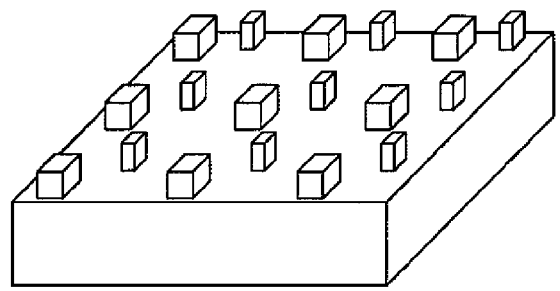
Figure 17C:
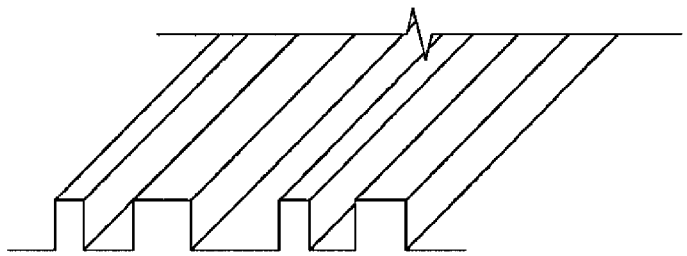

Thus, the above examples and discussion illustrate that guided-mode resonance elements possessing asymmetric (type II) grating profiles such as, for example, the structures shown in FIGS. 17(a), 17(b) and 17(c), as well as GMR elements with symmetric (type I or type II) profiles are candidates for bandstop and bandpass filters with diverse spectral features. The separation of the nondegenerate resonances arising at the edges of the second stopband (for asymmetric type II structures) can be manipulated by controlling the bandgap via the grating modulation amplitude and profile fill factors. For symmetric structures, the connection of the exciting evanescent orders and the pertinent leaky modes can be accomplished by proper profile design of type II. Thus, the spectral spacing and level of interaction between adjacent resonant modes, in accordance with the present disclosure, are conveniently controllable. This, in turn, provides for new dimensions in the design of resonant photonic devices.

Figure 17D:
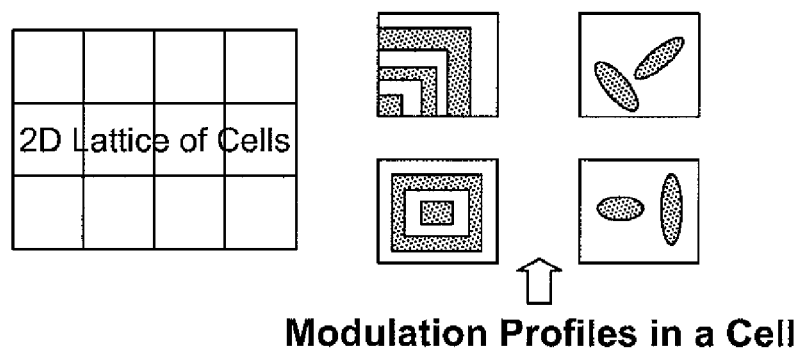
FIG. 17(d) schematically illustrates modulation profiles in a cell.

The exemplary filters discussed above include wideband and narrowband flattop bandstop and bandpass filters and although the discussion has emphasized single-layer structures, it is expected that additional layers may be incorporated so as to preferably enhance filter features. Moreover, the systems and methods disclosed herein are generally applicable to 2D layered photonic crystal lattices (see FIG. 17(d)) by, for instance, including a sublattice that is properly offset from the main lattice. As will be readily apparent to those of ordinary skill in the pertinent art based on the present disclosure, the number of combinations and possibilities is infinite.

With reference now to FIGS. 18 to 20, in accordance with an aspect of the present disclosure, profile asymmetry may be used to shape the spectral bands provided by single-layer modulated films and to obtain regions of polarization independence. The asymmetry preferably removes the leaky-mode degeneracy at normal incidence, which has been used to design filters with spectral properties of interest in many applications [Y. Ding and R. Magnusson, "*Use of nondegenerate resonant leaky modes to fashion diverse optical spectra,*" Optics Express, vol. 12, pp. 1885-1891, May 3, 2004]. The contents of the foregoing Ding et al. publication are incorporated herein by reference.

Figure 18A:
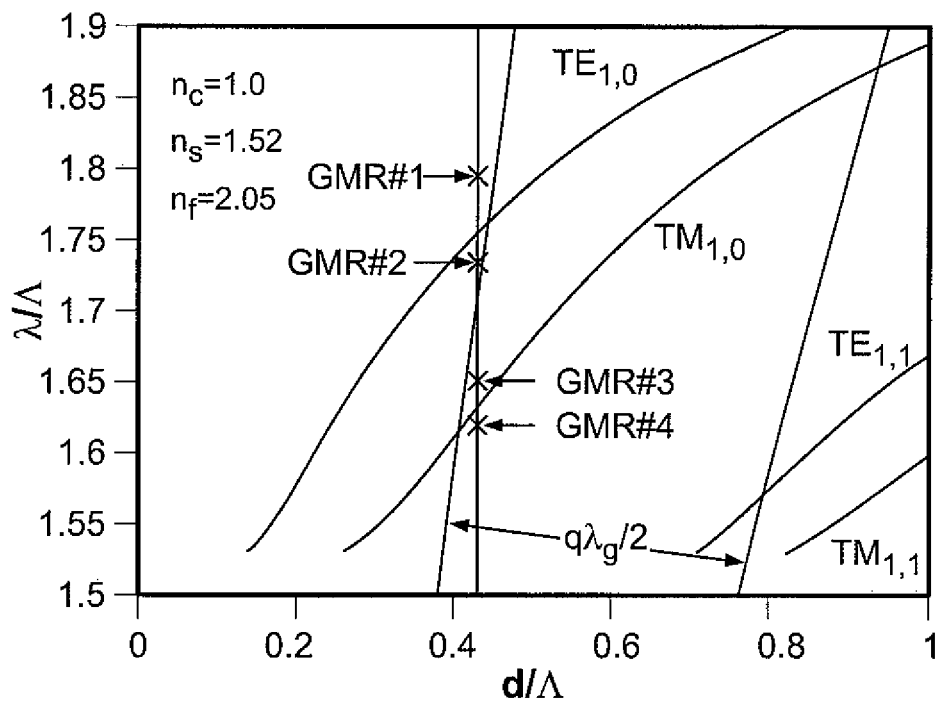
FIGS. 18(a) and 18(b) are graphical representations of estimated resonance locations for two parameter sets in accordance with an illustrative aspect of the present disclosure.
Figure 18B:
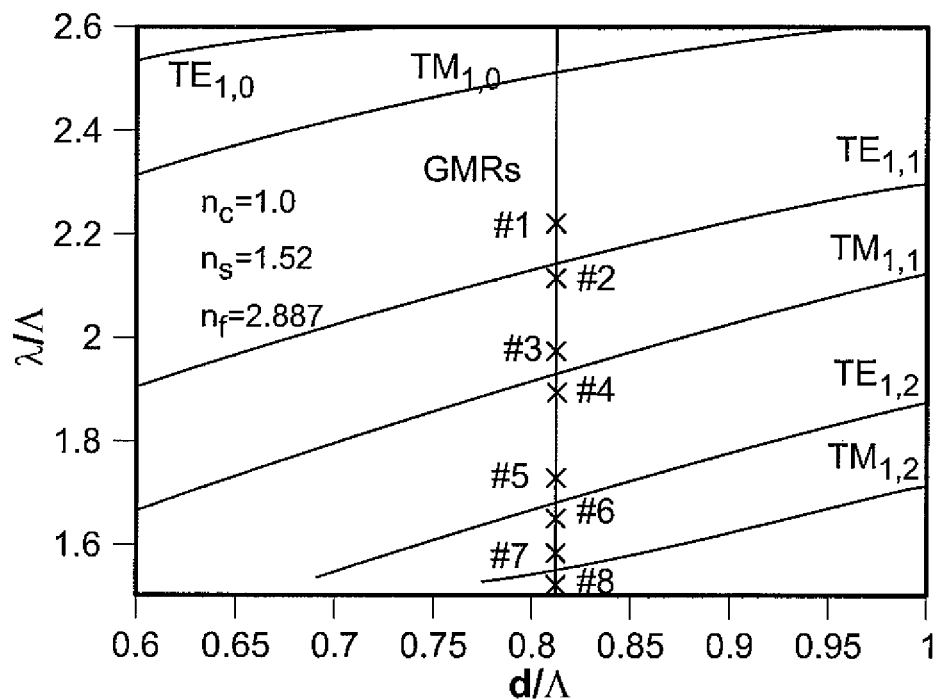

As shown in FIGS. 18(a) and 18(b), estimated resonance locations for two parameter sets based on the eigenvalue function of the equivalent single-layer homogeneous waveguide are illustratively shown [See, S. S. Wang and R. Magnusson, "*Theory and applications of guided-mode resonance filters,*" Appl. Opt. 32, 2606-2613 (1993)]. The order-mode resonance connection is indicated by $TE_{m,v}$ or $TM_{m,v}$, where m represents the evanescent diffraction order exciting the v-th TE or TM mode. Structures close to $q\lambda_g/2$ (q is an integer, $\lambda_g$ the wavelength in the film) lines have thickness around a multiple of half-wavelength at resonance and symmetrical line shape will appear [See, R. W. Day, S. S. Wang and R. Magnusson, "*Filter response lineshapes of resonant waveguide gratings,*" J. Lightwave Tech. 14, 1815-1824 (1996).].

As the resonances arise at the edges of the second stop band, the separation of the two GMRs depends upon the width of the stopband. Thus, as previously discussed and further exemplified in FIG. 18(a), the spectral separation of GMR#1 and GMR#2 indicates the width of the $TE_0$ stopband and that of GMR#3 and GMR#4 shows the width for the $TM_0$ stopband. As demonstrated in FIG. 18(a), it is possible to place GMR#2 and GMR#3 near the same wavelength, as the width of the second stopband for both $TE_0$ and $TM_0$ modes can be increased by the modulation strength $\Delta\in=n_h^2-n_l^2$. By appropriate profile design, GMR#2 and GMR#3 can have comparable linewidth and similar lineshape resulting in a polarization independent structure. It is noted that there is no interaction between GMR#2 and GMR#3 in FIG. 18(a) because one GMR is associated with a TE mode and the other is with a TM mode. If two GMRs associated with the same polarization (i.e., GMR#2 and GMR#5, or GMR#4 and GMR#7 in FIG. 18(b)) are placed close to each other, they will interact and lead to spectra with versatile properties as previously discussed. In addition, interaction between GMR#2 and GMR#5 forms a flat reflection band for TE incidence, and the interaction among GMR#3, GMR#4, GMR#7 and GMR#8 will form a flat reflection band for TM incidence and the overlapping portion of the two reflection bands is polarization independent.

Still further interaction possibilities arise on mixing/interacting of modes with dissimilar polarization states. This is accomplished with anisotropic materials or by other means that induce TE-TM mode conversions in the structure. Such materials may be used in forming the waveguide layer or any layer, or combination of layers, in the device structure. Such material selection and material combinations are yet another design feature for producing spectrally versatile optical devices of the present disclosure.

With respect to the foregoing, to simplify the analysis, the gratings are assumed transversely infinite and the materials are assumed lossless and dispersion free. Further, the incident wave is taken as being at normal incidence and the spectra calculated with computer codes based on rigorous coupled-wave analysis (RCWA) of wave propagation in periodic structures [See, T. K. Gaylord and M. G. Moharam, "*Analysis and applications of optical diffraction by gratings,*" Proc. IEEE 73, 894-937 (1985), M. G. Moharam, D. A. Pommet, E. B. Grann, and T. K. Gaylord, "*Stable implementation of the rigorous coupled-wave analysis for surface-relief gratings: Enhanced transmittance matrix approach,*" J. Opt. Soc. Am. A 12, 1077-1086 (1995)].

Figure 19A:
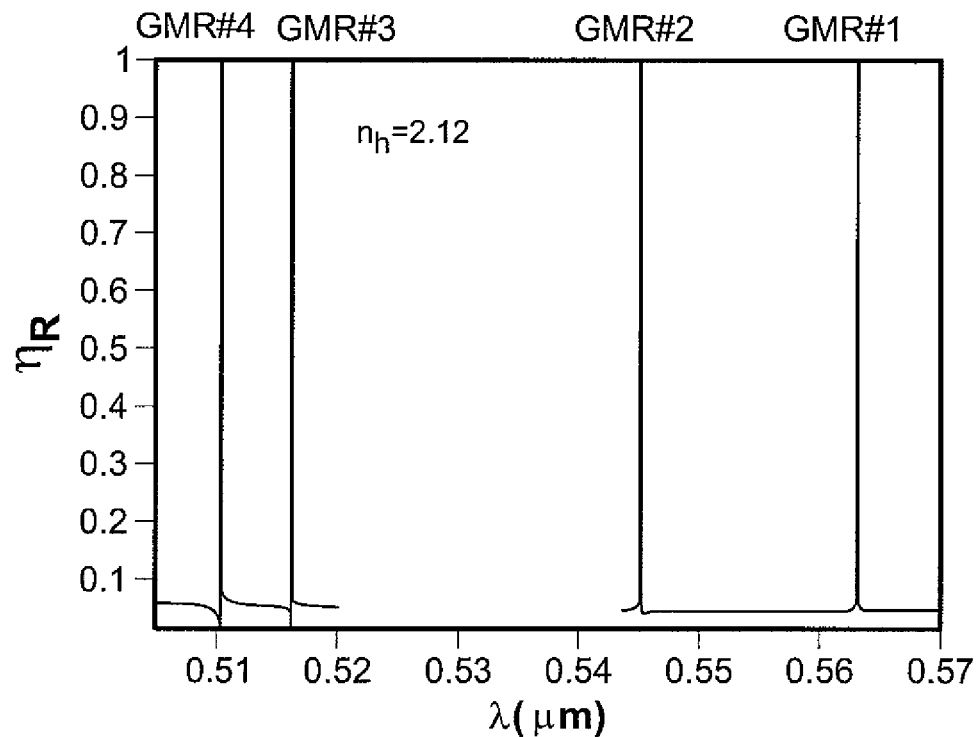
FIGS. 19(a) and 19(b) are graphical representations of spectra for an exemplary narrowband reflection filter where
Figure 19B:
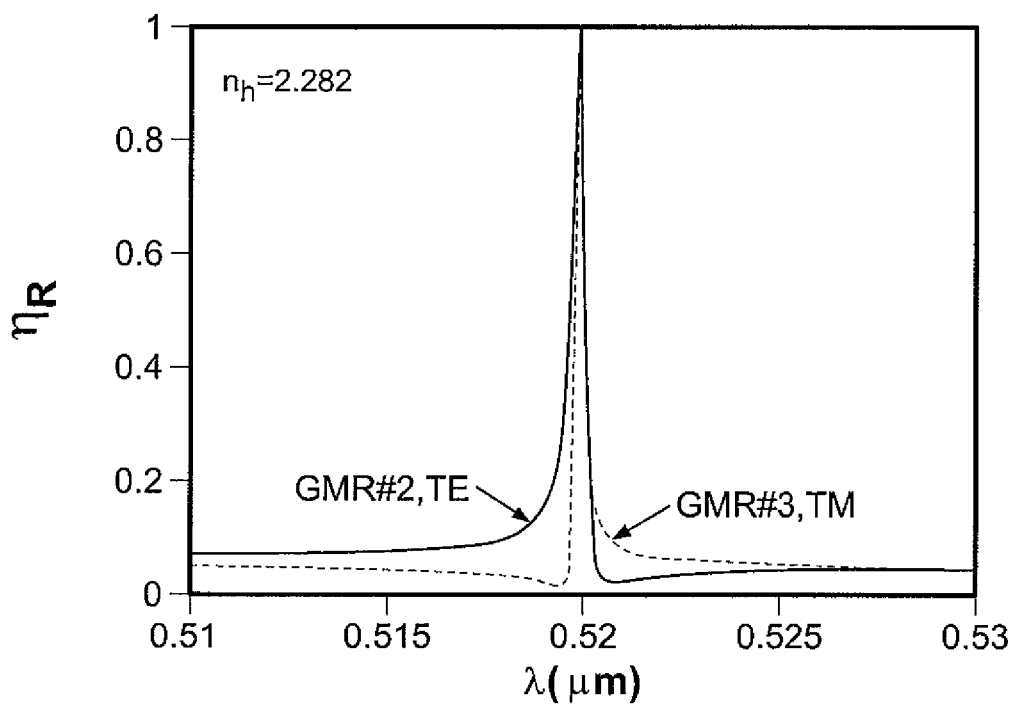

Referring to FIGS. 19(a) and 19(b), there is shown the spectra pertinent to a bandstop filter with narrow band. As demonstrated in FIG. 19(a), the GMRs associated with the same leaky modes are well separated even when modulation is small (i.e., $n_h$=2.12). As modulation increases, the like GMRs will be further pushed away from each other such that when $n_h$ increases to 2.282, GMR#2 and GMR#3 overlap and provide a polarization independent bandstop structure as shown in FIG. 19(b).

Figure 20A:
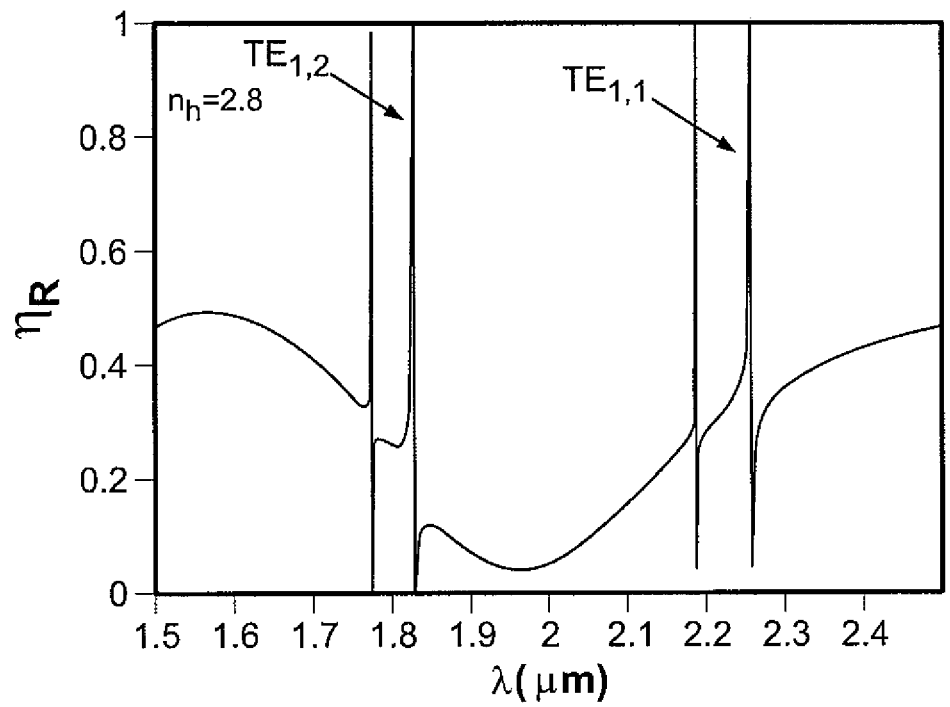
FIGS. 20(a) to 20(d) are graphical representations of spectra for an exemplary wideband reflection filter where
Figure 20B:
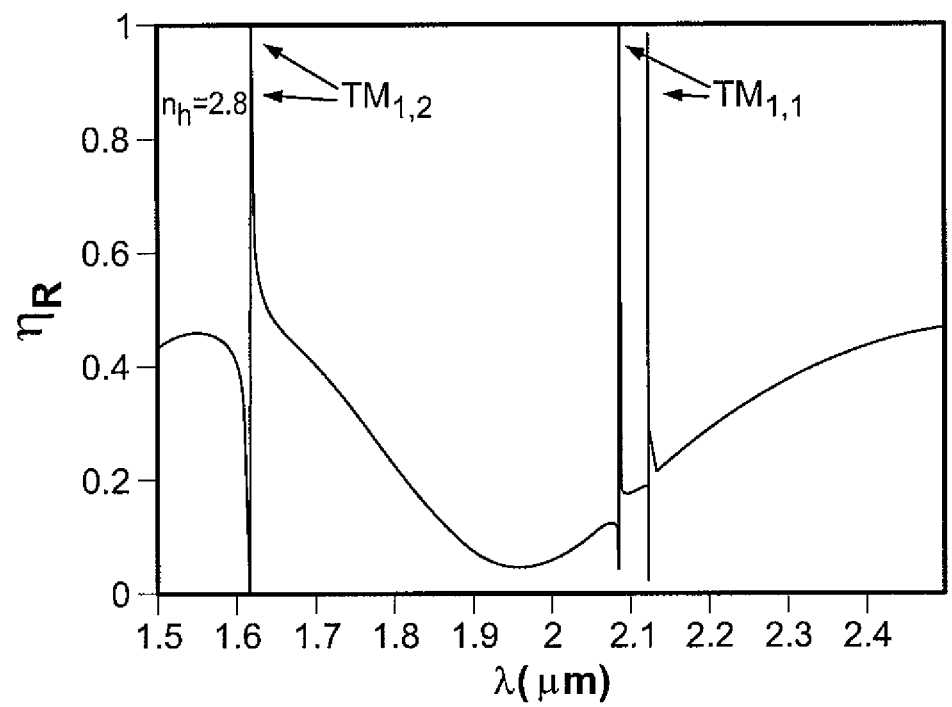
Figure 20C:
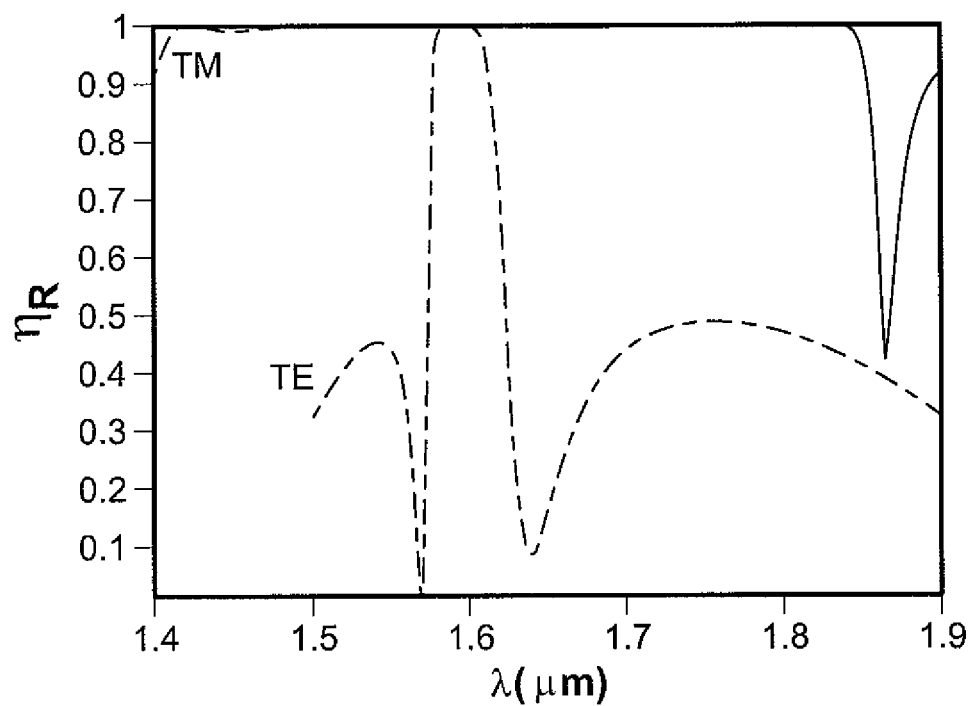
Figure 20D:
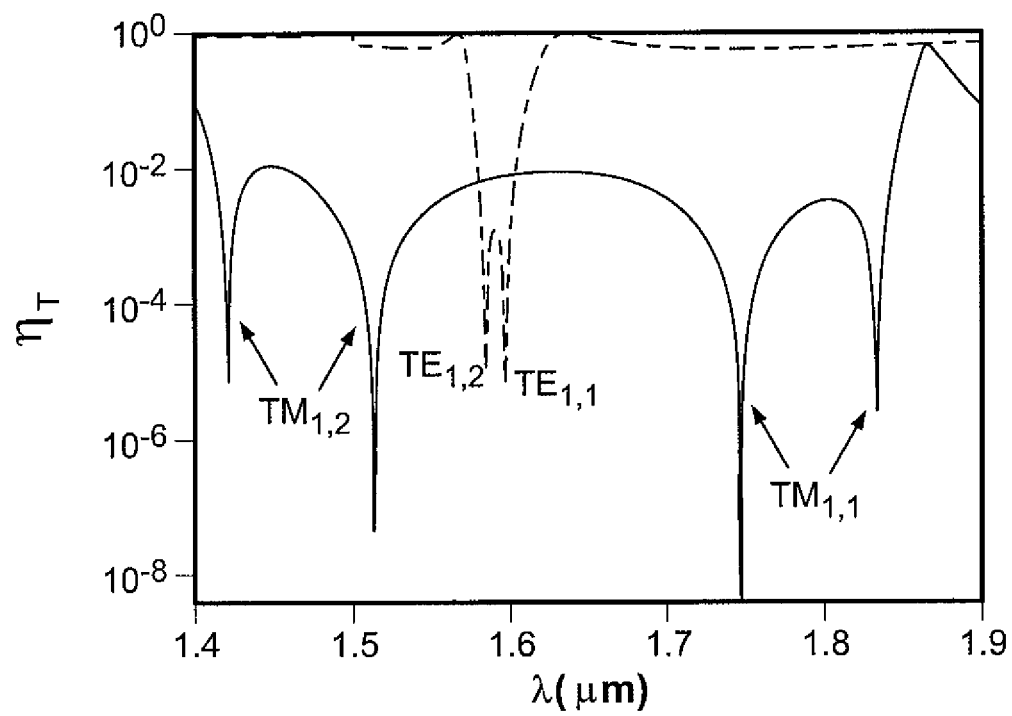

Furthermore, with reference to FIGS. 20(a) to 20(d), there are shown the spectra of a bandstop filter with wide band. The GMRs associated with different leaky modes are best shown in FIGS. 20(a) and 20(b) for a comparatively small modulation (i.e., $n_h$=2.8). As modulation increases, the GMRs approach each other and their linewidths increase. Consequently, the GMRs begin to interact with each other. When $n_h$ increases to 3.48, a polarization independent 20 dB reflection band centered at about 1.6 μm with approximately 20 nm bandwidth is formed. The GMRs contributing to the reflection band are marked in FIG. 20(d). It is noted that the TM reflection band is very wide (approx. 400 nm).

Thus, in accordance with an illustrative aspect of the present disclosure, guided-mode resonance elements possessing asymmetric grating profiles are candidates for polarization independent bandstop filters. The separation of the nondegenerate resonances arising at the edges of the second stopband can be manipulated by controlling the bandgap via the grating modulation amplitude and profile fill factors. The exemplary filters identified and discussed above may thus include polarization independent wideband and narrowband bandstop filters and, although the present discussion has been limited to single-layer structures, as will be readily apparent to those of ordinary skill in the pertinent art, it is expected that additional layers will enhance filter features. And by applying similar methods, polarization independent bandpass filters can also be realized.

By way of further elaboration, in an illustrative embodiment of the present disclosure, a bandpass filter based on guided-mode resonance effects in a single-layer periodic waveguide is implemented. A bandpass resonant filter utilizes the transmission peak associated with a reflection minimum in the naturally asymmetrical spectral curve. By using multilayer dielectric coatings to generate a wideband low-transmission background while maintaining the transmission peak, structures supporting transmission bandpass characteristics can be obtained [See, R. Magnusson and S. S. Wang, "*Transmission bandpass guided-mode resonance filters*," Appl. Opt. 34, 8106 (1995); S. Tibuleac and R. Magnusson, "*Reflection and transmission guided-mode resonance filters*," J. Opt. Soc. Am. A. 14, 1617 (1997)]. Employing genetic algorithms, simpler transmission type structures with reasonable line shape can also be found [See, Tibuleac and R. Magnusson, "*Narrow-linewidth bandpass filters with diffractive thin-film layers*," Opt. Lett. 26, 584 (2001)].

Figure 21A:
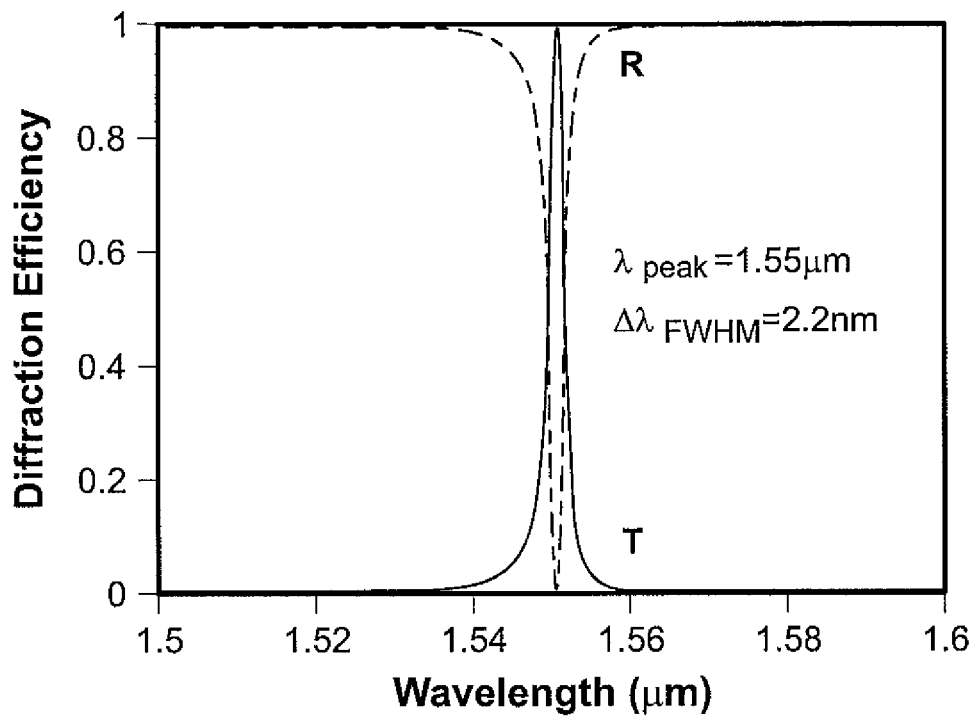
FIGS. 21(a) and 21(b) are a graphical representation of the spectral and angular response of an exemplary single-layer bandpass filter structure in accordance with an illustrative aspect of the present disclosure where the period is 1120 nm, $n_s=1.3$, $n_H=3.48$, $n_L=2.427$, and $n_c=1.0$.
Figure 21B:
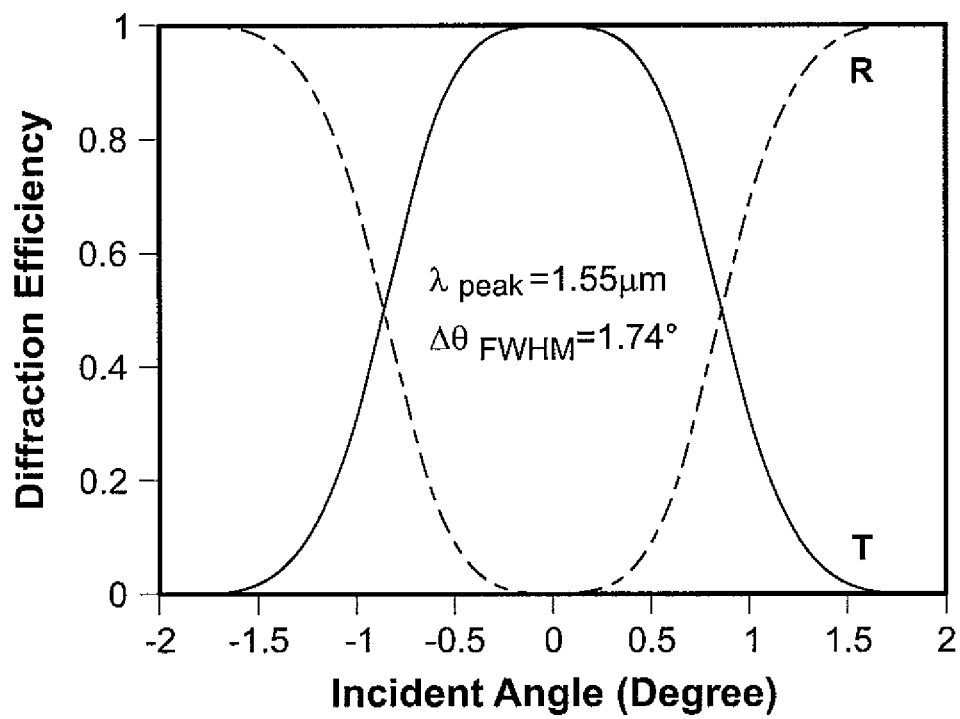
Figure 22:
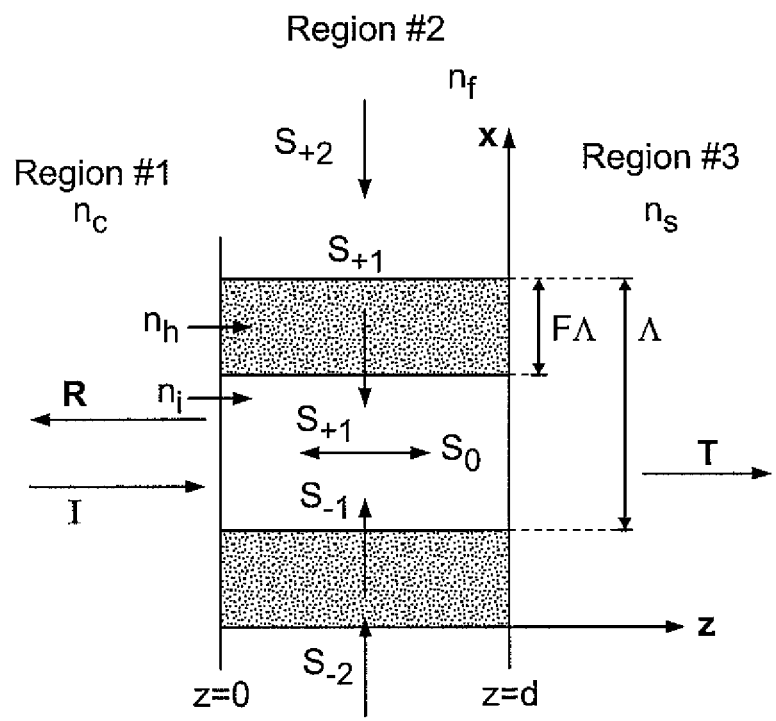
FIG. 22 is a schematic illustration of one type of a resonant periodic waveguide diffraction model in accordance with an illustrative aspect of the present disclosure.

Referring to FIGS. 21(a) and 21(b), illustrative spectral and angular resonance characteristics of a single-layer filter are shown. This type of structure utilizes high modulation to support excitation of a double resonance in a type I profile element as per FIG. 8(a). In comparison to reflection structures, single-layer transmission structures can be difficult to design at least because the resonance is fundamentally associated with zero transmission or a reflection peak, and because it can be difficult to establish a low transmission background with a single dielectric homogeneous layer. However, as provided by the present disclosure, such single-layer bandpass filters may be advantageously realized in resonant elements possessing, as noted above, strong modulation to support the excitation of two types of resonance. For example, the low transmission background of the bandpass filter can be formed by resonant excitation of leaky mode $TE_2$ by the $\pm 1$ evanescent diffracted orders, whereas the transmission peak arises by excitation of leaky mode $TE_0$ by the $\pm 2$ evanescent diffracted orders. Even though both of these resonances are fundamentally reflection type, the asymmetrical line shape of the resonance enables the appearance of a transmission peak as in the case of known multilayer bandpass filters. FIG. 22 shows an exemplary resonant periodic waveguide diffraction model where $S_i$ represents the complex amplitudes of the diffracted waves, $n_c$, $n_s$ are the refractive indices of regions 1 and 3, $n_f$ is the effective refractive index of the periodic waveguide with $n_f = \sqrt{Fn_h^2 + (1-F)n_1^2}$, $\Lambda$ is the grating period, F is the fill factor and d is thickness of the waveguide.

To obtain resonance, waveguide modes have to be generated with the incident wave satisfying the phase-matching condition of the periodic structure. This leads to $$N_v = \beta_v/k \approx |m|\lambda/\Lambda \qquad (6)$$

where $N_v$ is the effective index of mode v of the equivalent homogeneous waveguide, $\beta_v$ is the propagation constant of the mode, k is the propagation constant in free space, $\lambda$ is wavelength in free space, and the integer m represents the $m^{th}$ diffracted order. This formula works well when the grating modulation is not very strong [See, S. S. Wang and R. Magnusson, Appl. Opt. 32, 2606 (1993)]. However, the formula may still be used as a starting point to locate the resonance in the case of strong modulation.

Figure 23:
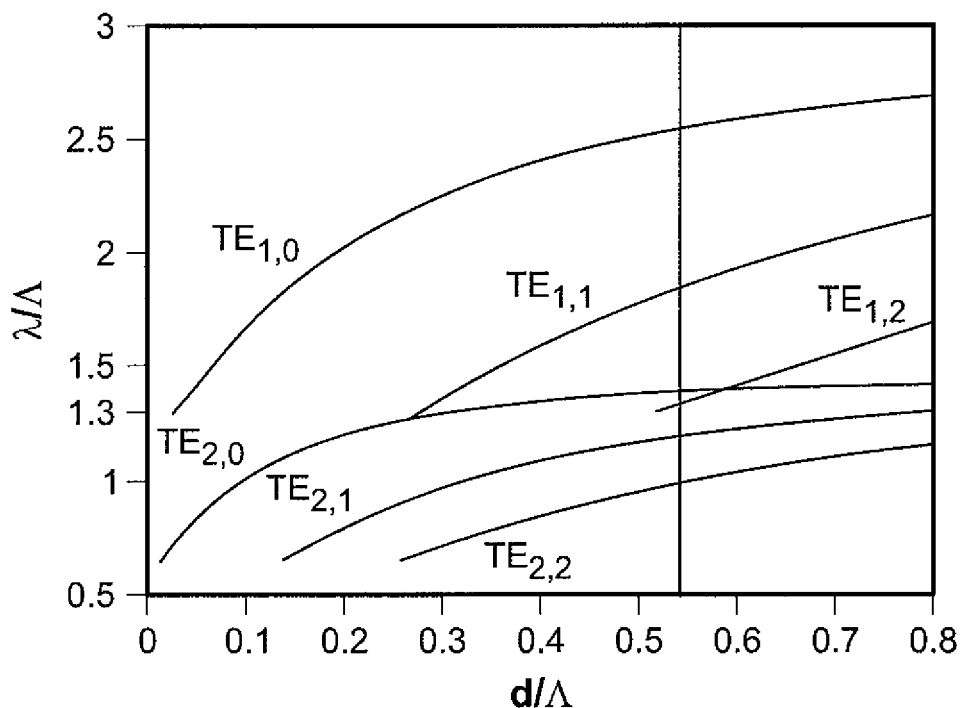
FIG. 23 is a graphical representation showing estimated resonance locations based on the eigenfunction of an equivalent homogenous waveguide where $n_c=1$, $n_s=1.3$, $n_f=2.94$.

Equation (6) shows that the $v^{th}$ mode can be resonant with the $m^{th}$ diffracted order. For example, mode $TE_1$ can be resonant with the $2^{nd}$ diffracted order, and $TE_2$ can be resonant with the $1^{st}$ diffracted order. If the order-mode resonance is expressed as $TE_{m,v}$, where m represents the diffraction order and v represents the mode, the above resonance pairs can be written as $TE_{2,1}$ and $TE_{1,2}$. As shown in FIG. 23, certain resonance pair such as $TE_{1,2}$ and $TE_{2,0}$ can be designed to be close in wavelength. Thus, with respect to the present illustrative embodiment, resonance pair $TE_{1,2}$ and $TE_{2,0}$ can be utilized to design a bandpass filter. FIG. 23 may be obtained with the help of the homogenous waveguide eigenfunction and Equation (6). For a single layer homogenous waveguide, its eigenfunction can be expressed in the form of $f(N_v, d/\lambda, v) = 0$. According to Equation (6), $N_v$ can be approximated with $|m|\lambda/\Lambda$ so that the eigenfunction is provided in the form of $f(|m|\lambda/\Lambda, d/\lambda, v) = 0$. By selecting another set of variables, the eigenfunction can be transformed to the form $f(\lambda/\Lambda, d/\Lambda, |m|, v) = 0$ and used to plot the graph of FIG. 23.

To support multi-resonance, the effective refractive index of the grating layer should be considerably higher than that of the cover and substrate. Specifically, since $n_f > N_v > \max(n_c, n_s)$, excitation of resonance with the $m^{th}$ diffracted order while maintaining the $0^{th}$ order as the only radiating order requires $$n_f > |m| \cdot \max(n_c, n_s) \qquad (7)$$

This constraint may limit the choice of suitable materials that may be utilized for particular applications of the present disclosure.

At the resonance wavelength, a reflection peak appears. The linewidth of this peak depends on the coupling strength between the diffracted order and the incident wave, which, in turn, relates to the grating modulation amplitude. Generally, larger coupling strength yields increased linewidth [See, R. Magnusson and S. S. Wang, "*New principle for optical filters*," Appl. Phys. Lett. 61, 1022 (1992)]. Considering two adjacent resonances, as in FIG. 24, the one with stronger coupling will have a wide reflection peak and can furnish the low-transmission background needed for the bandpass filters of the present disclosure.

To a first-order approximation, the grating harmonics $|\epsilon_q/\epsilon_0|$ indicate the coupling strength between the $q^{th}$ diffracted order and the incident wave near resonance. The relative permittivity (i.e., dielectric constant) modulation of the periodic waveguide can be expanded into Fourier series as $$\varepsilon(x) = \sum_{q=-\infty}^{+\infty} \varepsilon_q e^{jqKx} \qquad (8)$$

where $\epsilon_q$ is the q-th Fourier harmonic coefficient, $K = 2\pi/\Lambda$, and $\epsilon_0$ is the effective relative permittivity of the grating.

Figure 24:
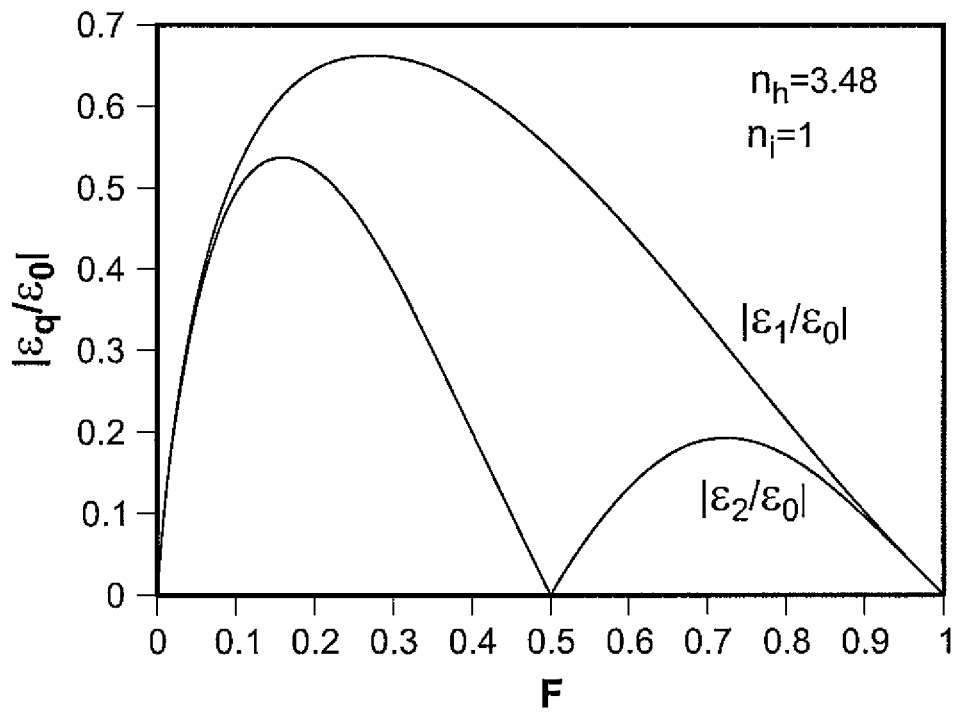
FIG. 24 is a graphical representation of Fourier grating harmonics $|E_q/E_0|$ as a function of a fill factor for a rectangular waveguide-grating profile.

As shown in FIG. 24, $|\epsilon_q/\epsilon_0|$ are functions of the fill factor F. Since $|\epsilon_1/\epsilon_0|$ is always higher than $|\epsilon_2/\epsilon_0|$ for a periodic waveguide with rectangular profile, $TE_{1,2}$ will have a wider reflection peak and can be used to provide the low transmission background. Moreover, to support a wide transmission background, $|\epsilon_1/\epsilon_0|$ should be considerably higher than $|\epsilon_2/\epsilon_0|$. At the same time, $|\epsilon_2/\epsilon_0|$ should have a moderate value such that the linewidth of $TE_{2,0}$ will still be appreciable. These considerations can be used to choose a fill factor.

It has been shown that the resonant structure has asymmetrical line shape in general and that the symmetrical line shape will appear only under certain conditions such as, for example, when the thickness of the structure is near a multiple of half-wavelength at resonance [See, R. W. Day, S. S. Wang and R. Magnusson, "*Filter response lineshapes of resonant waveguide gratings*," J. Lightwave Tech. 14, 1815 (1996)]. For the present exemplary case, this situation should be avoided such that an asymmetrical line shape can be maintained. In considering a numerical example, based on FIG. 23, if d/Λ is set to be 0.56, two close resonances $TE_{1,2}$ ($\lambda/\Lambda \cong 1.35$) and $TE_{2,0}$ ($\lambda/\Lambda \cong 1.39$) can be located. If the transmission peak is to be centered at 1.55 μm, the period of the structure (Λ) is determined to be approximately 1.12 μm with $\lambda/\Lambda \cong 1.39$, since $TE_{2,0}$ is supplying the transmission peak. Then the thickness (d) can be determined as approximately 0.62 μm.

Figure 25:
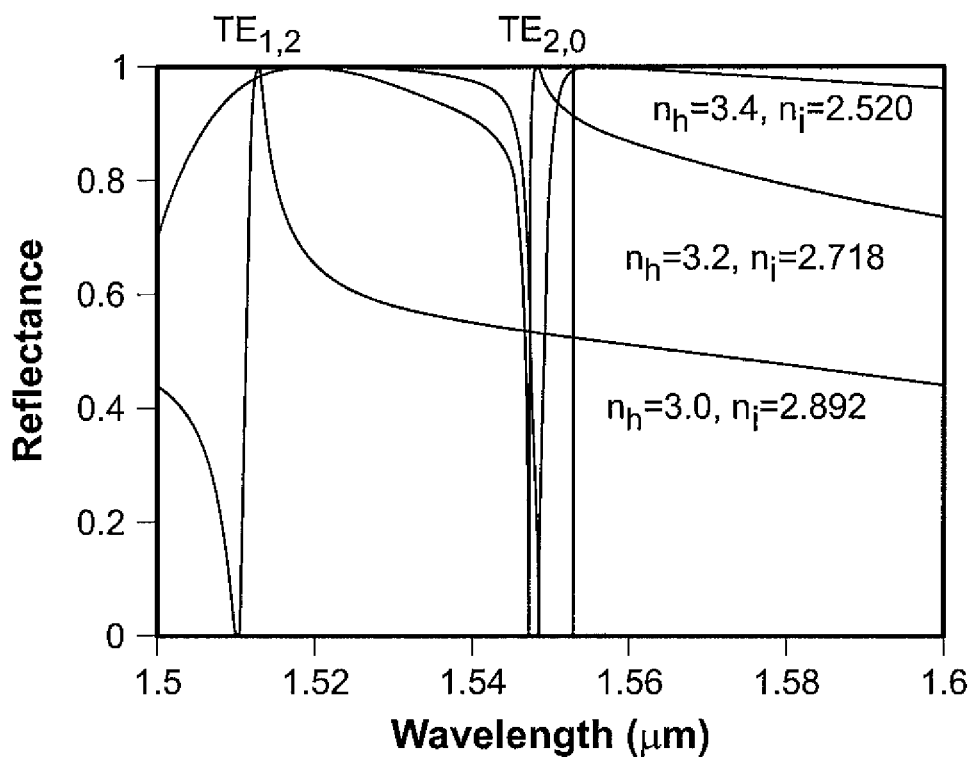
FIG. 25 is a graphical representation of reflectance spectra for a resonant waveguide-grating filter with different modulation strengths with $n_f=2.94$ maintained constant and d=0.62 μm, $\Lambda=1.12$ μm, F=0.44, $n_c=1$ and $n_s=1.3$.

FIG. 25 shows the spectra of the structure with three different modulations. When the modulation is not very strong, i.e., $n_h=3.0$ and $n_f=2.94$, the $TE_{1,2}$ and $TE_{2,0}$ resonances are isolated. With increasing modulation strength, the resonance peak of $TE_{1,2}$ expands and changes the background around $TE_{2,0}$. After numerically tuning the parameters such as thickness and period, a structure with a quality line shape may be obtained. The parameters of the final single-layer filter and the corresponding spectra are illustratively shown in FIGS. 21(a) and 21(b). In operation, the device of the present embodiment is based on double resonance where one resonance provides the low transmission band with the other furnishing the transmission peak through its asymmetrical line shape. The structure profile has a narrow linewidth because the transmission peak is associated with the second diffraction order that has a relatively weak coupling coefficient. Thus, even though the transmission sidebands are provided by a resonant leaky mode, their extent can be considerable.

Having discussed various features and physical mechanisms basic to a single-layer bandpass resonant periodic waveguide filter, it will be readily apparent to those of ordinary skill in the pertinent art that other configurations and/or arrangements suitable to provide that same or similar results equally may be employed and clearly fall within the scope of the present disclosure.

Figure 26:
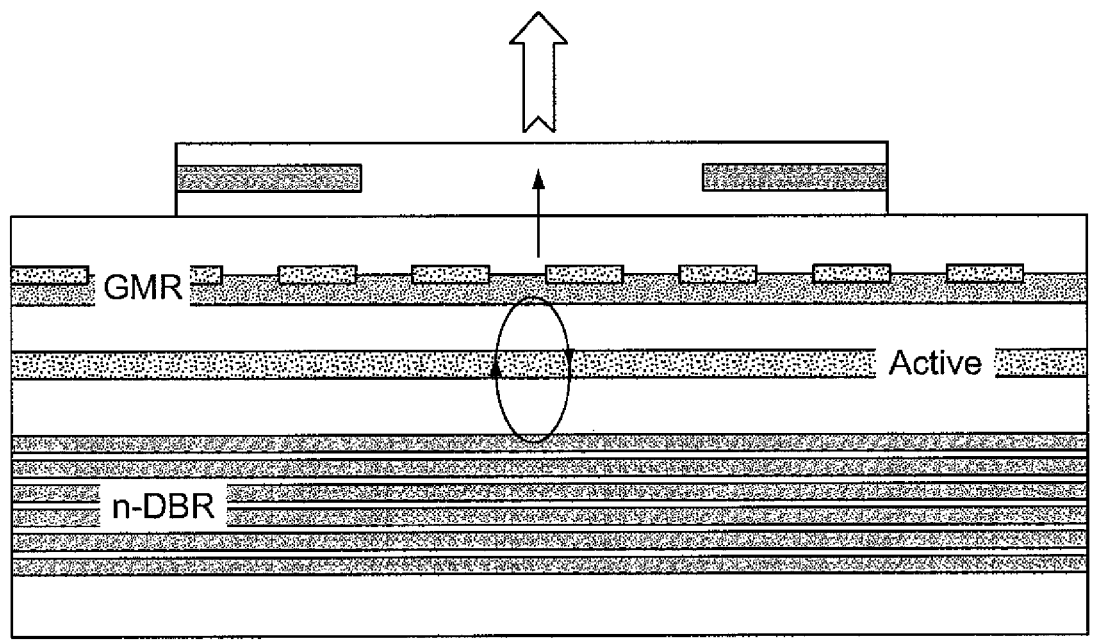
FIG. 26 is a resonant VCSEL in accordance with an illustrative embodiment of the present disclosure.

In another illustrative embodiment of the present disclosure, a vertical-cavity surface-emitting laser (VCSEL) is provided wherein distributed Bragg reflectors (DBR) are not relied on for its operation. That is, by replacing the upper mirror with resonating photonic-crystal waveguide elements (e.g., GMR mirrors) that effectively reflect light in a narrow spectral band, such as, for example, a filter. An exemplary VCSEL is shown in FIG. 26. The VCSEL, as shown, has a lower DBR mirror. Alternatively, a simple metallic or dielectric mirror or the like equally may be used. The particular type of lower mirror selected may depend on the material system and fabrication processes, nonetheless the mirror does not affect the fundamental operation of the proposed VCSELs. In fact, the broadband mirrors with type I or type II (symmetric or asymmetric) profiles could be beneficially incorporated in such resonant VCSELs.

Figure 27:
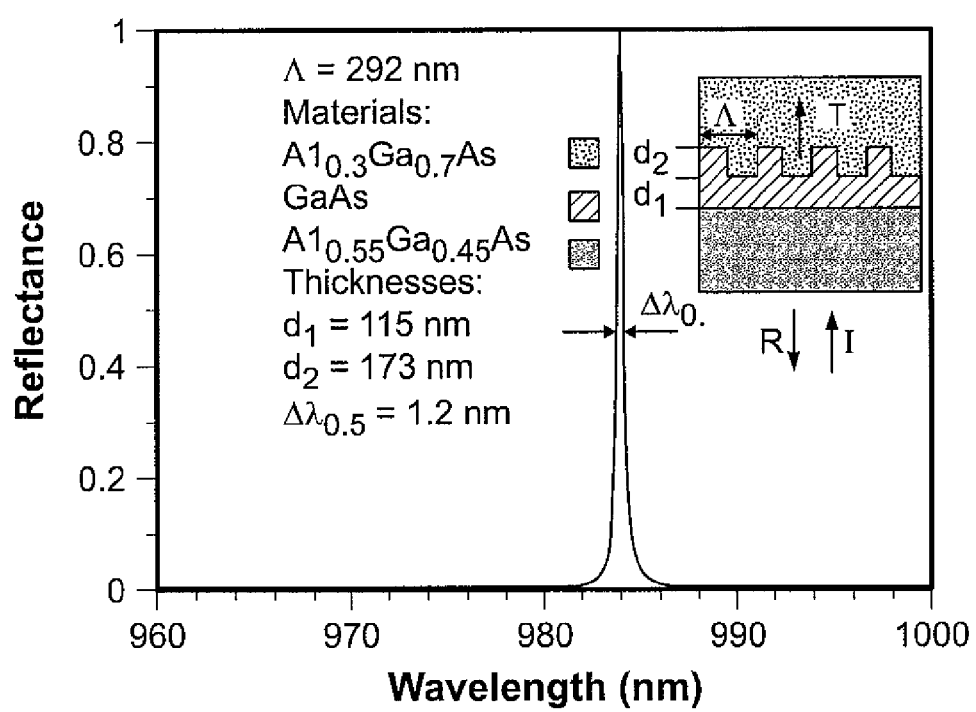
FIG. 27 is a graphical representation of an exemplary spectral reflectance of a two-layer GMR mirror (i.e., a GaAs waveguide and periodic layer embedded in AlGaAs where R=reflectance; T=transmittance; I=incident wave).
Figure 28:
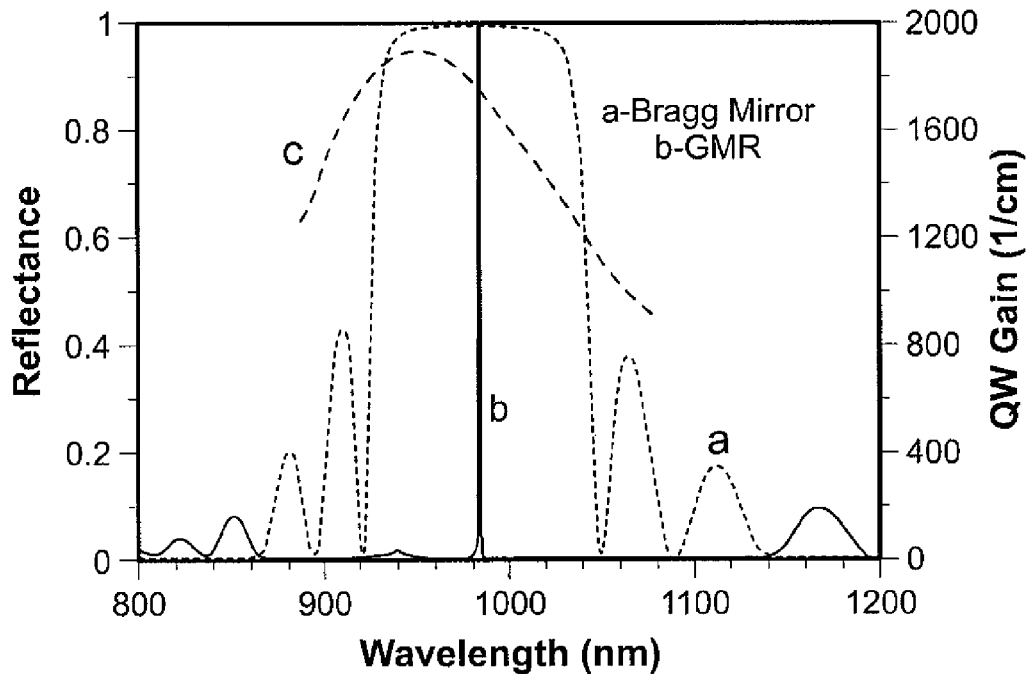
FIG. 28 is a graphical representation of an exemplary spectral response of a distributed Bragg deflector (DBR) mirror (42 layers), a GMR mirror (2 layers), and the gain in a guided mode resonance vertical-cavity surface-emitting laser (VCSEL).

For VCSEL applications, the sufficiently high efficiency, controllable linewidth, and high degree of polarization are key GMR-mirror features. By way of illustration, FIG. 27 shows a calculated spectral response for an exemplary GMR mirror with typical device parameter values for the GaAlAs system indicating layer thicknesses, period Λ, and linewidth Δλ. In this case, the mirror reflects TE-polarized (electric field normal to the page) light at λ=984 nm. FIG. 28 shows the spectral response of a representative device consisting of a DBR mirror, a GMR mirror, and a quantum well (QW) gain layer. As shown, the mirror spectra must overlap the gain curve of the active medium. Additionally, the GMR resonance line must overlap an allowed longitudinal laser cavity mode.

Figure 29A:
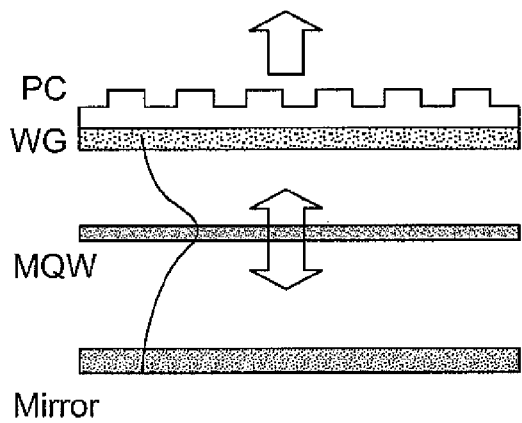
FIGS. 29(a) and 29(b) are schematic illustrations of exemplary VCSELs where an output coupler has been replaced by a resonant mirror.
Figure 29B:
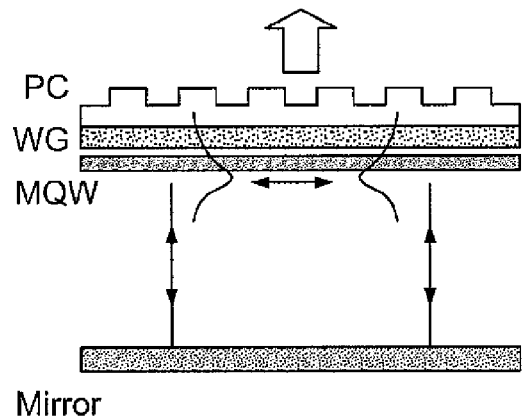

Referring to FIGS. 29(a) and 29(b), which schematically illustrate exemplary VCSELs where an output coupler has been replaced by a resonant mirror [See R. Magnusson, P. P. Young, and D. Shin, "Vertical cavity laser and laser array incorporating guided-mode resonance effects and methods for making the same," and U.S. Pat. No. 6,154,480]. FIG. 29(a) shows a true vertical-cavity laser since the oscillation occurs between the GMR mirror and the bottom mirror orthogonal to the multiple-quantum-well (MQW) gain layer that is often stationed at the peak of the standing longitudinal laser mode as indicated. The VCSEL, as shown, would generally require a high cavity Q factor ($Q=\lambda/\Delta\lambda$) as in ordinary VCSELs and the resonant mirror might preferably need to provide 99% reflectivity, which can be a stringent requirement.

FIG. 29(a) schematically illustrates a VCSEL with a DBR mirror replaced by a resonant photonic-crystal (PC) mirror consisting of a periodic element and a waveguide layer (WG). The active layer MQW, as shown, is offset from the waveguide. Also as shown, the peak of the standing, vertically oscillating, laser mode is near the MQW layer. FIG. 29(b) illustrates an alternative structure which may be more desirable as the resonant leaky mode, responsible for the resonant reflection, is near the MQW gain layer. The leaky mode propagates along the gain layer as it radiates downwards and the gain path thus has both lateral and vertical components. A high-gain configuration allows mirror reflectivity to fall, since the mirror transmission losses are efficiently compensated by the gain. The VCSEL of FIG. 29(b) is substantially similar to the VCSEL of FIG. 29(a) except the active layer is placed near the resonant element to thereby provide elongated gain path via lateral interaction with the leaky mode. The arrows denote the effective gain path and the electric-field profiles of the two counter-propagating leaky modes are also shown. [See R. Magnusson, P. P. Young, and D. Shin, "Vertical cavity laser and laser array incorporating guided-mode resonance effects and methods for making the same," and U.S. Pat. No. 6,154,480]. The actual gain realized depends on the overlap integral of the mode profile and the active layer and, therefore, their relative position. The top GMR mirror governs the VCSEL linewidth.

In accordance with the present disclosure, the bottom mirror in FIG. 29 can be replaced by broadband symmetric or asymmetric reflection elements presented above. These elements can be integrated into a monolithic VCSEL chip by proper design and fabrication processes. Alternatively, hybrid attachment of a nonepitaxial broadband mirror is envisioned.

Figure 30:
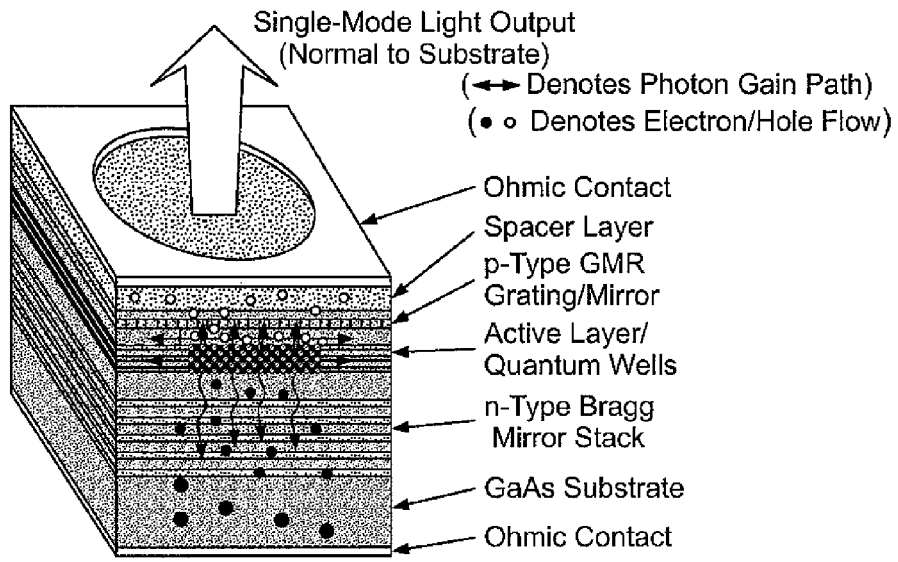
FIG. 30 is an exemplary hybrid electrically excited resonant VCSEL concept employing a resonant periodic layer and a lower DBR mirror in accordance with an illustrative aspect of the present disclosure.
Figure 31:
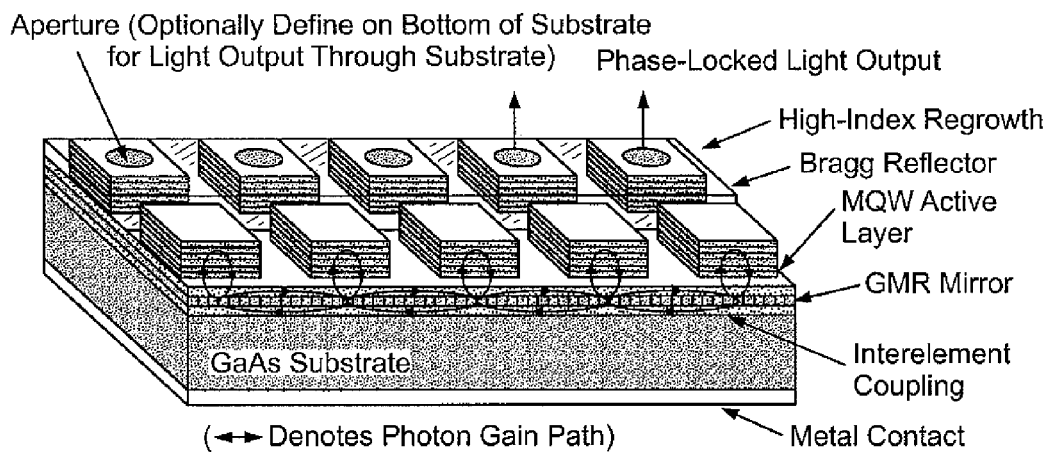
FIG. 31 is an exemplary electrically excited resonant VCSEL array in accordance with an illustrative aspect of the present disclosure.

Having discussed various aspects and features associated with VCSELs in accordance with the present disclosure, it will be readily apparent to those of ordinary skill in the pertinent art that other configurations and/or arrangements suitable to provide the same or similar results equally may be employed and should be considered to fall within the scope of the present disclosure. For instance, as shown in FIGS. 30 and 31, hybrid, electrically pumped lasers and laser arrays that could potentially be realized using resonant periodic elements as discussed herein may be implemented.

Figure 32:
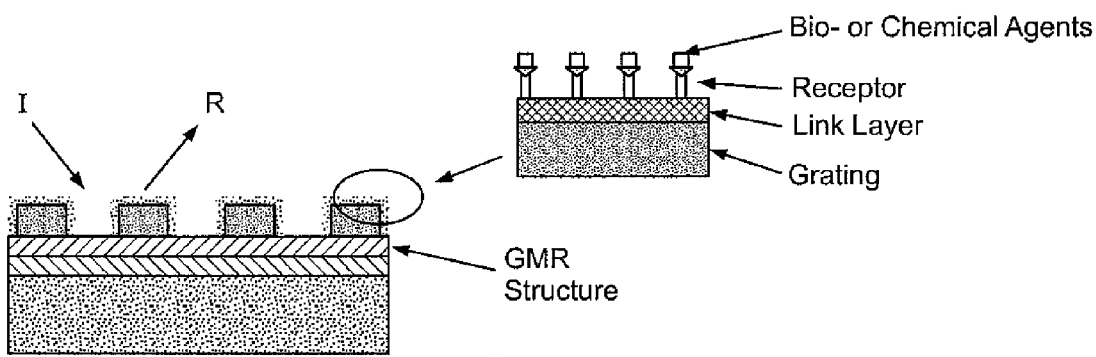
FIG. 32 is an exemplary generic resonant sensor with an agent-receptor that may be pertinent to thickness or refractive index sensing applications.

Referring now to FIG. 32, in still another illustrative embodiment of the present disclosure, a new class of highly sensitive biosensors and/or chemical sensors may be provided that have application in a variety of fields/industries, e.g., medical diagnostics, drug development, environmental monitoring, and/or homeland security.

By changing the thickness of a resonant waveguide grating, its resonance frequency may be changed or tuned [See Magnusson '680 patent]. As the parametric coupling range is typically small, these resonating elements tend to exhibit high parametric sensitivity rendering them extremely responsive to small amounts of trace chemicals and/or biological molecules. Biosensor applications are thus feasible as the buildup of the attaching biolayer may be monitored in real time, without use of chemical fluorescent tags, by following the corresponding resonance wavelength shift with a spectrometer [See, D. Wawro, S. Tibuleac, R. Magnusson and H. Liu, "*Optical fiber end face biosensor based on resonances in dielectric waveguide gratings*," Biomedical Diagnostic, Guidance, and Surgical-Assist Systems II, Proc. SPIE, 3911, 86-94 (2000); B. Cunningham, P. Li, B. Lin, and J. Pepper, "*Colorimetric resonant reflection as a direct biochemical assay technique*," Sens. Actuators B 81, 316-328 (2002); B. Cunningham, B. Lin, J. Qiu, P. Li, J. Pepper, and B. Hugh, "*A plastic colorimetric resonant optical biosensor for multiparallel detection of label-free biochemical interactions*," Sens. Actuators B 85, 219-226 (2002)]. Thus, the association rate between the analyte and its designated receptor can be quantified and the characteristics of the entire binding cycle, involving association, disassociation, and regeneration can be registered [See, M. Cooper, *Nature Reviews. Drug Discovery*, 1, 515-528 (2002)]. Similarly, small variations in the refractive indices of the surrounding media can be measured.

Figure 33A:
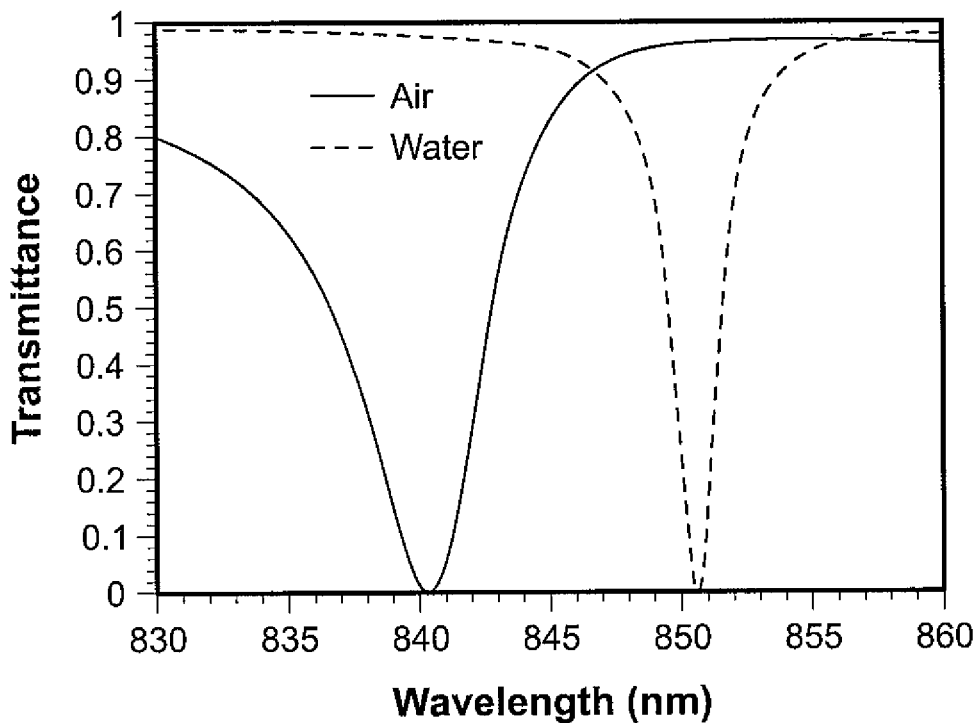
FIGS. 33(a) and 33(b) are graphical representations demonstrating both a calculated spectral shift for a 2-layer sensor and an experimental spectrum taken with Ti:sapphire laser, TE polarized at normal incidence.
Figure 33B:
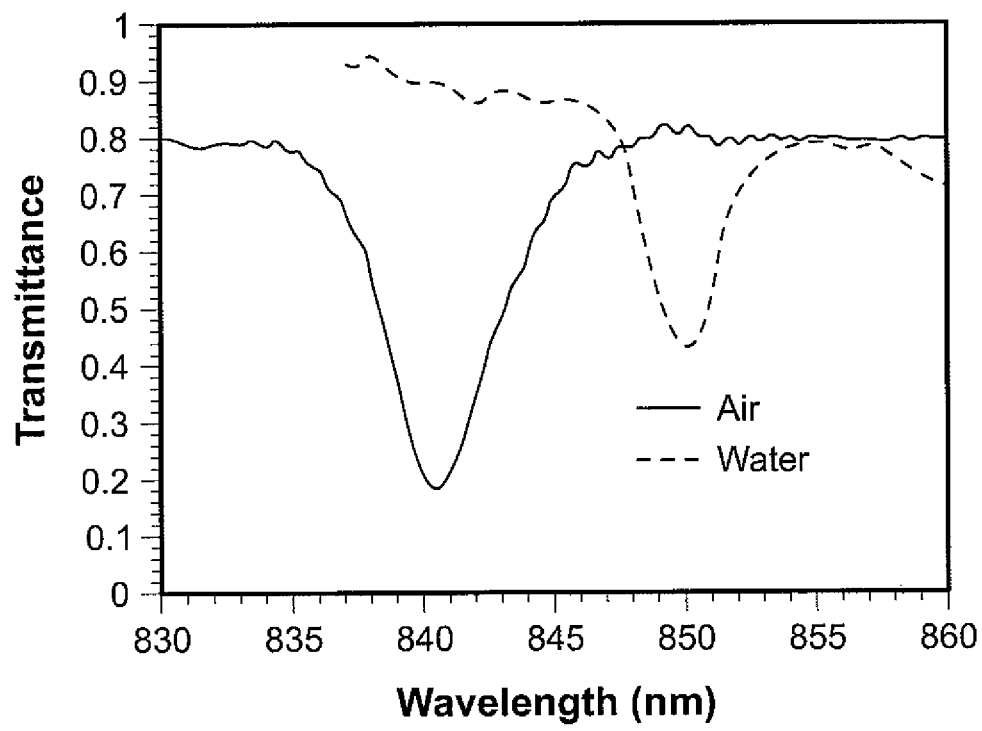
Figure 34A:
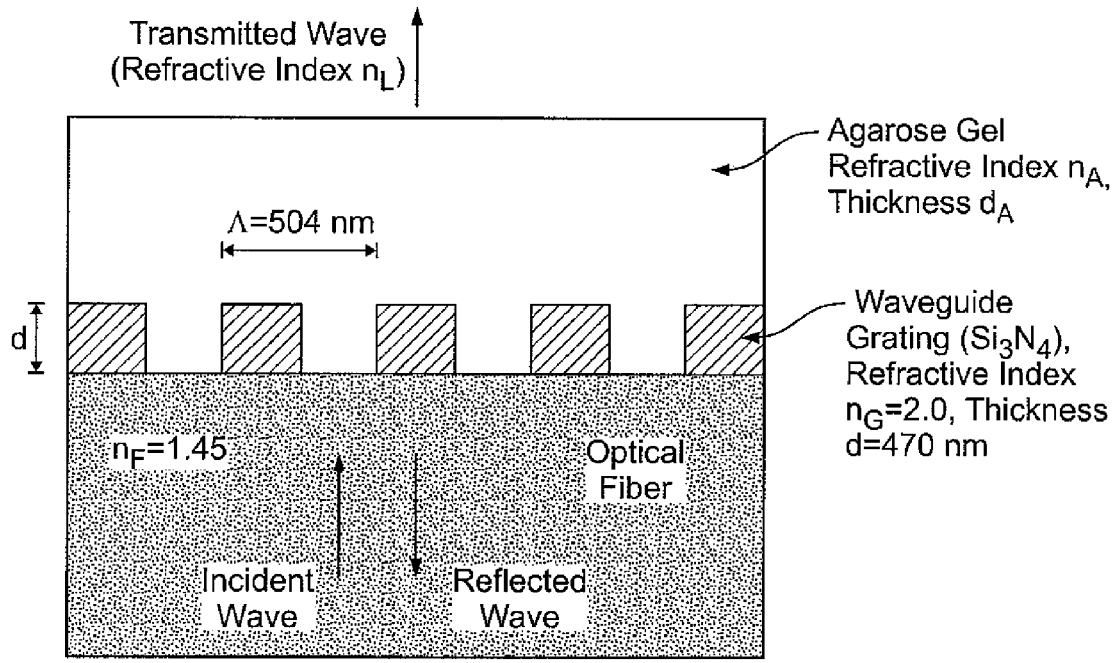
FIGS. 34(a) and 34(b) are schematic and graphical representations of an exemplary resonant fiber-tip waveguide grating with agarose gel for humidity sensing, the calculated resonance peaks and spectral shifts for selected values of percent relative humidity being shown.
Figure 34B:
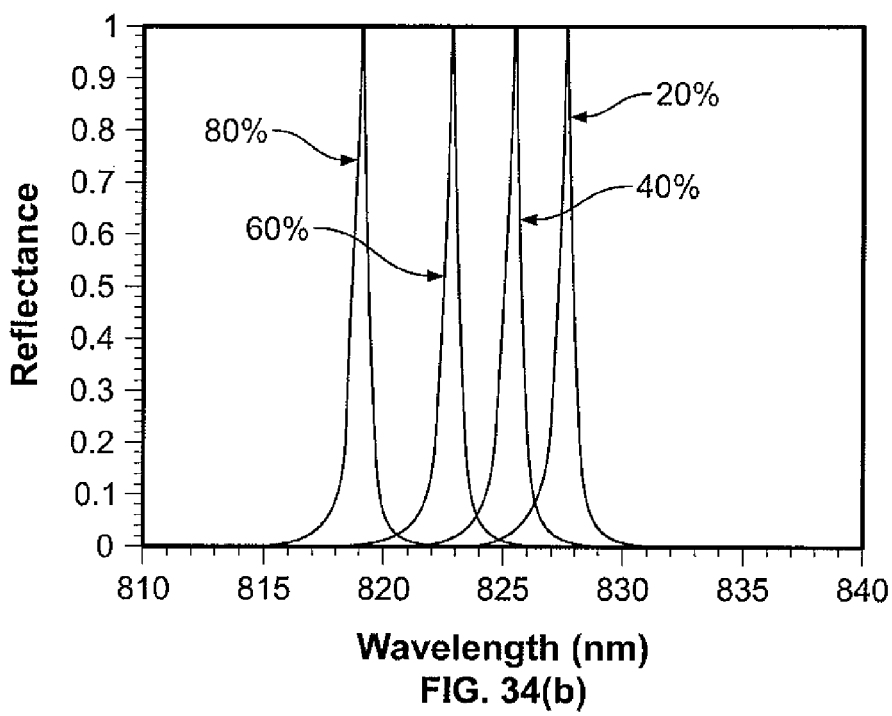

As demonstrated by FIGS. 33(*a*) and 33(*b*), the effect of changing the sensor environment on the resonance wavelength by, for example, immersion in water can be theoretically and experimentally shown. As illustrated, the measured and computed resonance lineshapes agree qualitatively with good conformity found in the resonance wavelength. As can further be seen, the transmission notch shifts approximately 10 nm for a cover refractive index change from $n_C$=1.0 to $n_C$=1.33. It is noted that decreased efficiency in the water is due to bubble formation on the chamber walls. FIGS. 34(*a*) and 34(*b*) illustrate a relative humidity sensor designed with an optical fiber and agarose gel pickup layer with the computed sensitivity of approximately 6% RH per nm of resonance line shift.

Figure 35A:
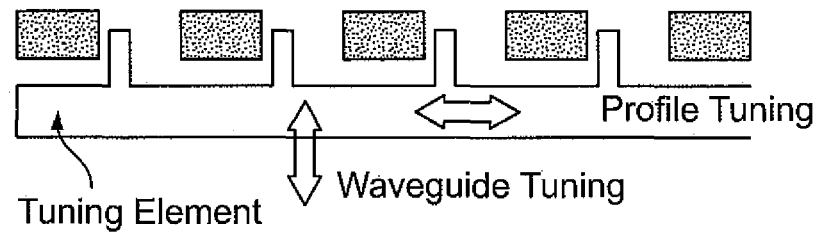
FIGS. 35(a) to 35(c) illustrate mechanically tunable resonant elements in accordance with the present disclosure where the arrows indicate the direction of motion.
Figure 35B:
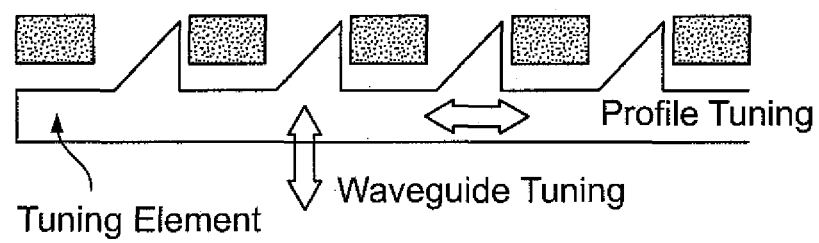
Figure 35C:
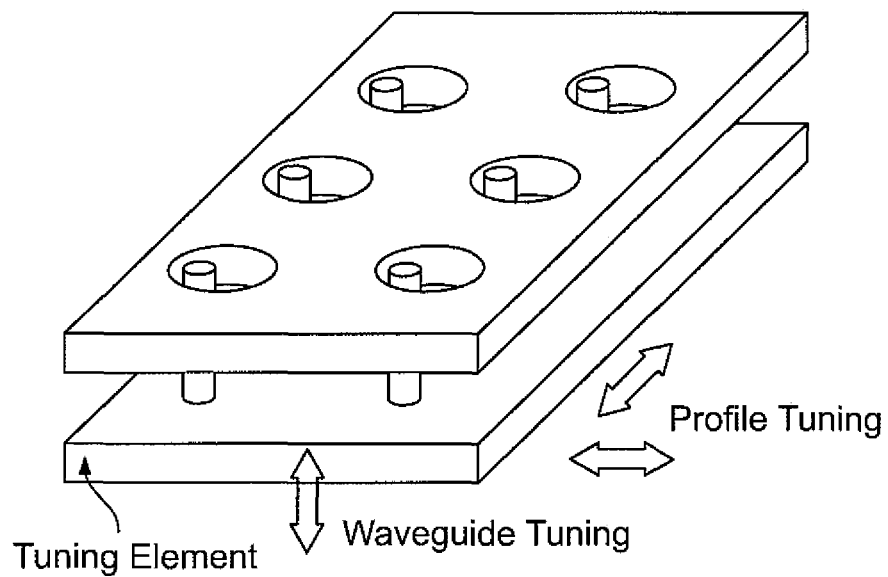

Referring to FIGS. 35(*a*) to 35(*c*), examples of mechanically tunable resonant elements in accordance with the present disclosure are illustrated. FIG. 35(*a*) shows a 1D tunable structure whose tuning element has a binary modulation profile and where the vertical arrow indicates motion to primarily realize fill-factor control, whereas the lateral arrow signifies an ability to primarily control profile symmetry. In FIG. 35(*b*), the inserted grating ridge has a sawtooth or triangular profile. FIG. 35(*c*) indicates a 2D tunable structure whose basic tuning element is a cylindrical post. These systems can be fabricated, for example, using silicon-based MEMS (micro electromechanical systems) technology.

With reference again to FIGS. 13(*a*) and 13(*b*), a GMR biosensor operating in transmission mode is demonstrated. The narrow resonance line will shift within the broad reflection band in response to added biolayers or refractive index changes in the layers or surrounding media.

Thus, the present disclosure discloses and enables advantageous optical devices based on resonant leaky modes in thin periodically modulated films, wherein the shape of the spatial modulation is designed to connect the evanescent diffraction orders to the pertinent leaky modes by proper distribution of the materials within the grating period. Adjacent, distinct resonance frequencies or wavelengths are advantageously produced and convenient shaping of the resulting reflection and transmission spectra for such optical devices may advantageously be accomplished as has been illustrated by numerous examples in this disclosure. The wavelength resonance locations and resonance linewidths may be precisely controlled according to the present disclosure so as to affect the extent to which the leaky modes interact with each other. The interaction spectral range can therefore be large, facilitating production of wideband shaped spectra. The optical spectral properties of a single modulated layer produced according to the present disclosure advantageously rival and exceed the performance provided by much more elaborate (i.e., multilayer) conventional thin-film devices.

Exemplary methods of the present disclosure facilitate manufacture/production of optical devices wherein multiple evanescent diffraction orders are provided in a single layer that may have a symmetric or asymmetric profile. Multiple first and higher evanescent diffraction orders may advantageously interact with the fundamental and higher waveguide modes to yield unique optical spectral characteristics.

As described herein, a single modulated wave-guiding layer, i.e., a type of a waveguide grating, with one-dimensional (1D) periodicity deposited on a substrate having arbitrary properties and having a top cover with arbitrary properties, is provided with an effective refractive index that is higher than those of the surrounding media. An asymmetric device according to the present disclosure may be modulated in two dimensions (2D). In this aspect, a 2D pattern can be a regular lattice of dots, or mesas, or holes with an appropriately offset sub-lattice to create the asymmetry. Alternatively, the 2D pattern can consist of arbitrarily shaped holes or mesas yielding the asymmetry. In yet another aspect of the present disclosure, the 2D pattern can be symmetric or asymmetric and, as in the 1D case, the material distribution within each period may be chosen to represent any arbitrary pattern. The present disclosure further provides a system of two or more layers that may be employed to enhance the leaky-mode device performance as well as to provide new resonant layered systems with added flexibility and exhibiting new and/or advantageous physical functions and functionalities.

Figure 36:
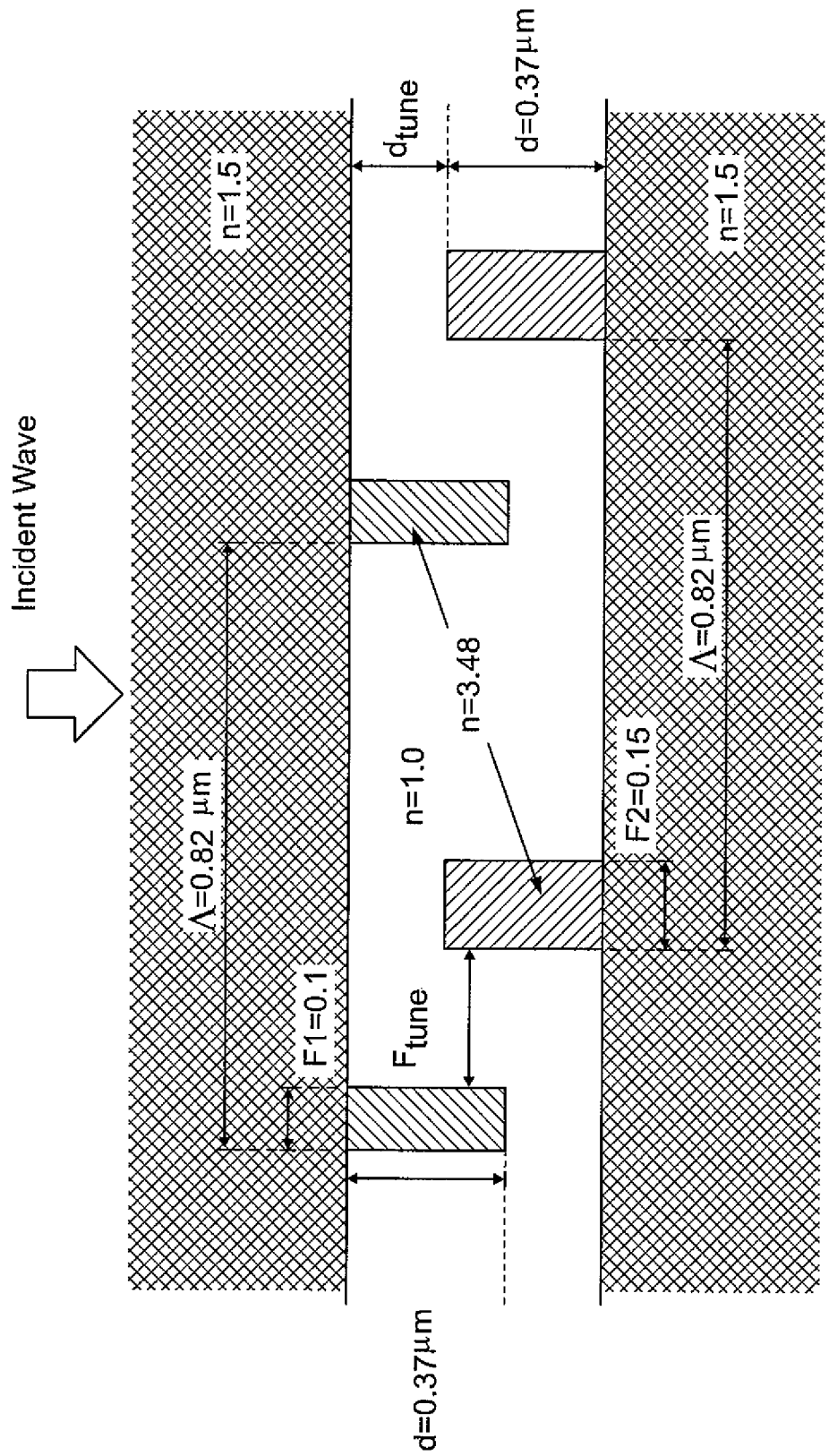
FIG. 36 illustrates a schematic example of a tunable double-grating silicon-on-insulator (SOI) resonant structure. The exemplified gratings are made with silicon and the substrates are silicon dioxide slabs. The incident wave is taken to be TE polarized (electric vector normal to the page) although a general state of polarization is allowed including TM.

As an illustrative example, the chief properties of a tunable microelectromechanical (MEMS) silicon-on-insulator (SOI) device are summarized to show that development of functional devices including filters, spatial modulators, and multispectral pixels potentially operating across wide spectral regions is feasible. Thus, FIG. 36 shows a schematic diagram of a tunable double-grating structure that can be constructed with two SOI single-layer waveguide gratings one of which would be mobile. The double-grating configuration consists of interleaved grating elements whose vertical and lateral separation is controlled by some means including mechanical, thermal, electrical, acoustic, magnetic, etc. The period Λ of the resonance structure in FIG. 1 is selected to implement tunability around the λ=1.55 μm wavelength. Other parameters are selected such that an appreciable range of motion is available. The tuning parameters applied in this example are limited to the separation of the two binary Si blocks along the horizontal direction denoted by $F_{tune}$ (dimensionless fill factor) and the separation of the two gratings along the vertical direction denoted by $d_{tune}$. The tuning with horizontal motion varies the symmetry of the grating profile by shifting a Si block within the period. [Y. Ding and R. Magnusson, "*Use of nondegenerate resonant leaky modes to fashion diverse optical spectra*," Opt. Express, 12, 1885-1891 (2004); Y. Ding and R. Magnusson, "*Resonant leaky-mode spectral-band engineering and device applications*," Opt. Express 12, 5661-5674 (2004).] Such shifting alters the spatial configuration of the localized resonant fields, including relative position of standing-wave peaks and grating materials. The vertical motion changes the net thickness and also strongly affects the resonance wavelength and leaky mode distribution. The horizontal and vertical translational parameters $F_{tune}$ and $d_{tune}$ can be applied simultaneously or independently. Generally stated, MEMS technology and actuation methods can be applied to implement these tunable elements.

Figure 37:
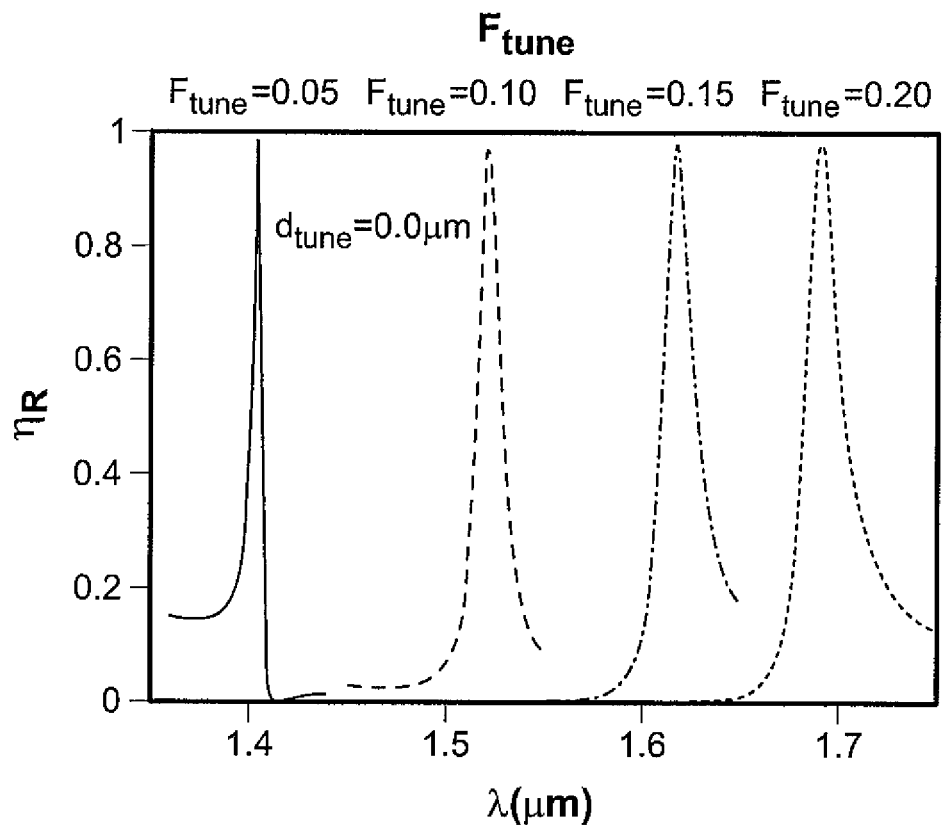
FIG. 37 illustrates resonance tuning by modulation of the grating profile symmetry, wherein the incident angle is $\theta=0°$, and the reflectance is denoted by $\eta_R$.
Figure 38:
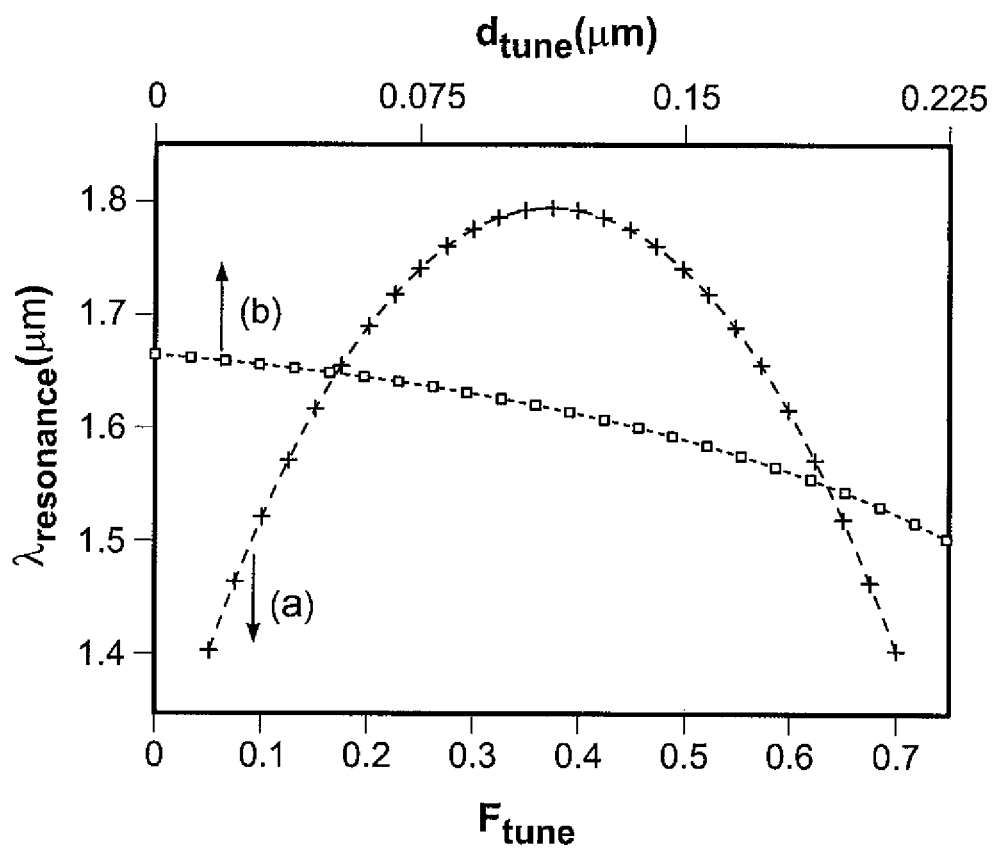
FIG. 38(a) demonstrates MEMS-based spectral tuning of the resonance peak wavelength. Curve (a) demonstrates the effect of profile tuning with $d_{tune}=0$, while curve (b) demonstrates the effect of waveguide tuning with $F_{tune}=0.18$. The lateral translational distance is given by $\Delta F_{tune}=148$ nm for purposes of curve (b).
Figure 39A:
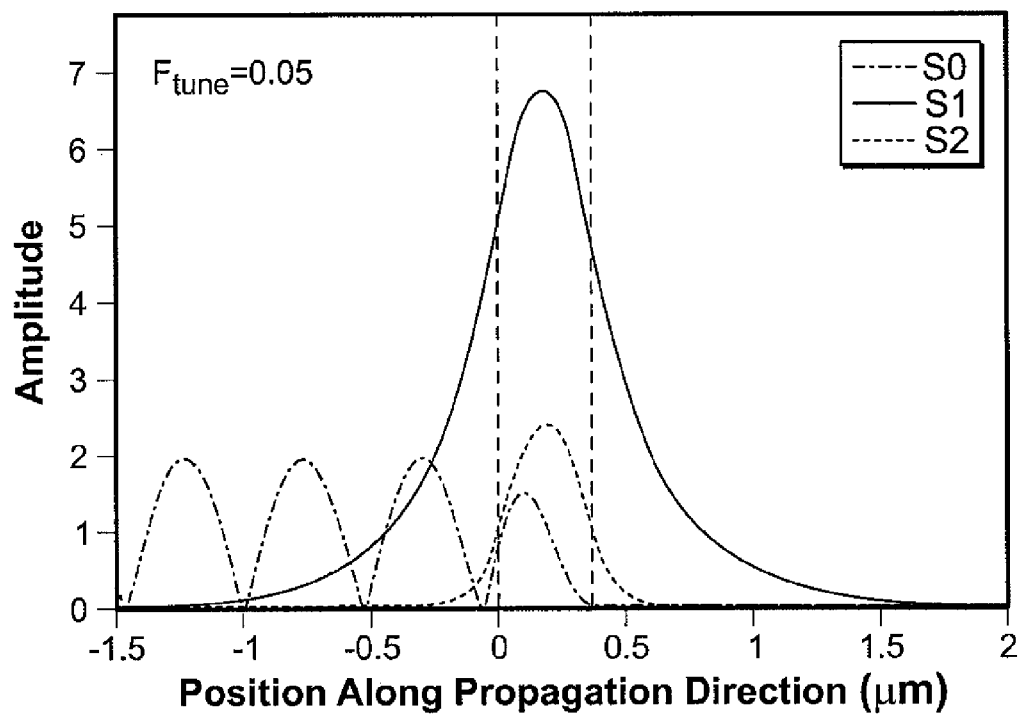
FIG. 39 shows internal electric field distributions at resonance for two values of the symmetry parameter, wherein the two counterpropagating leaky modes form a standing wave with a $TE_0$ mode shape, and the incident wave has unit amplitude.
Figure 39B:
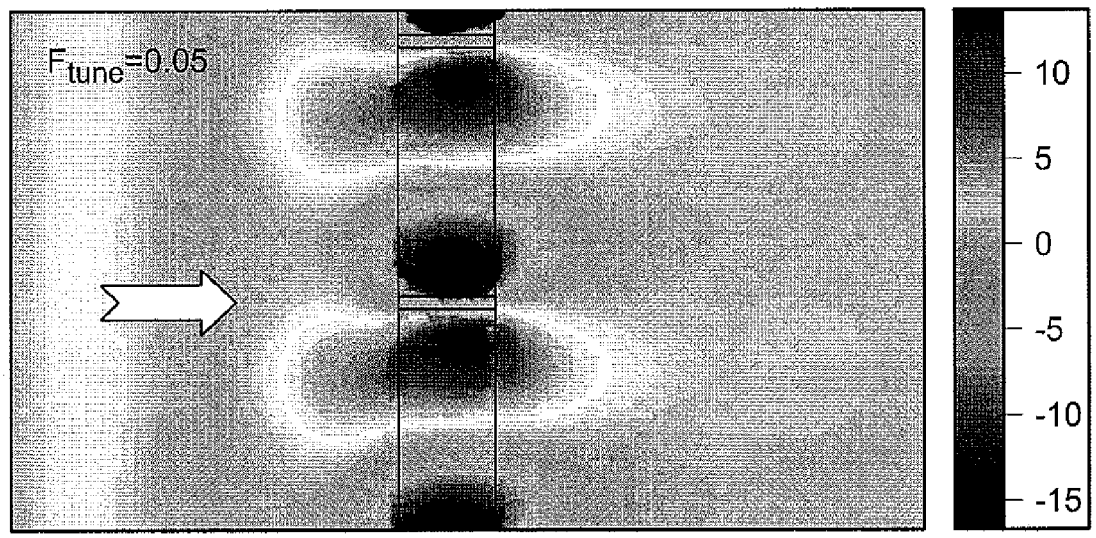
Figure 39C:
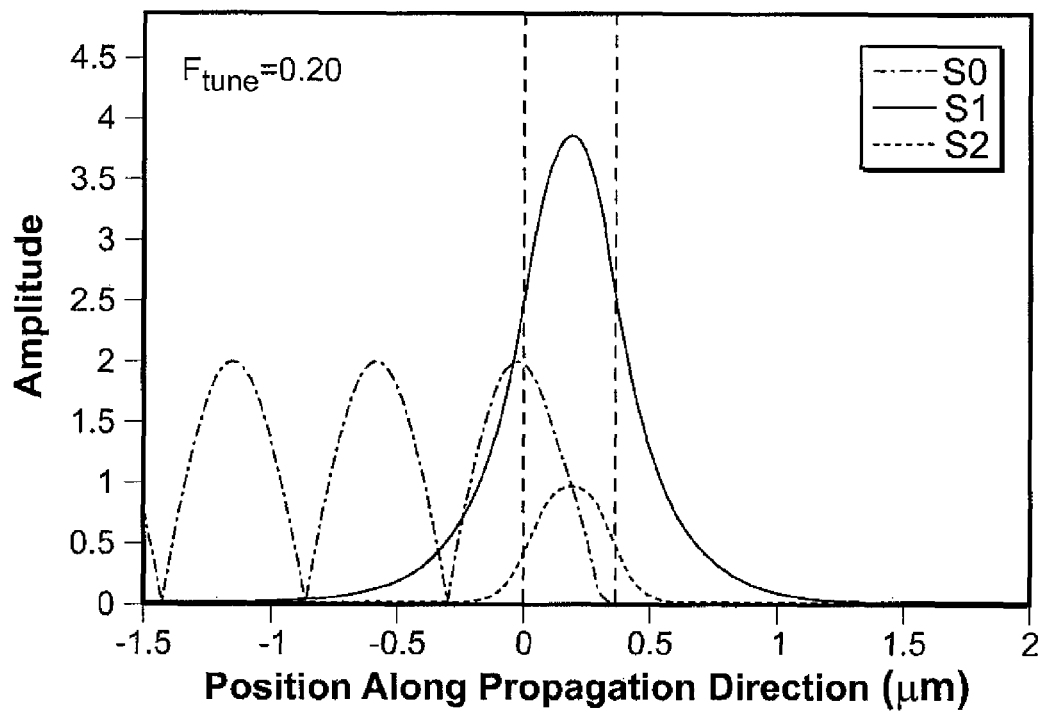
Figure 39D:
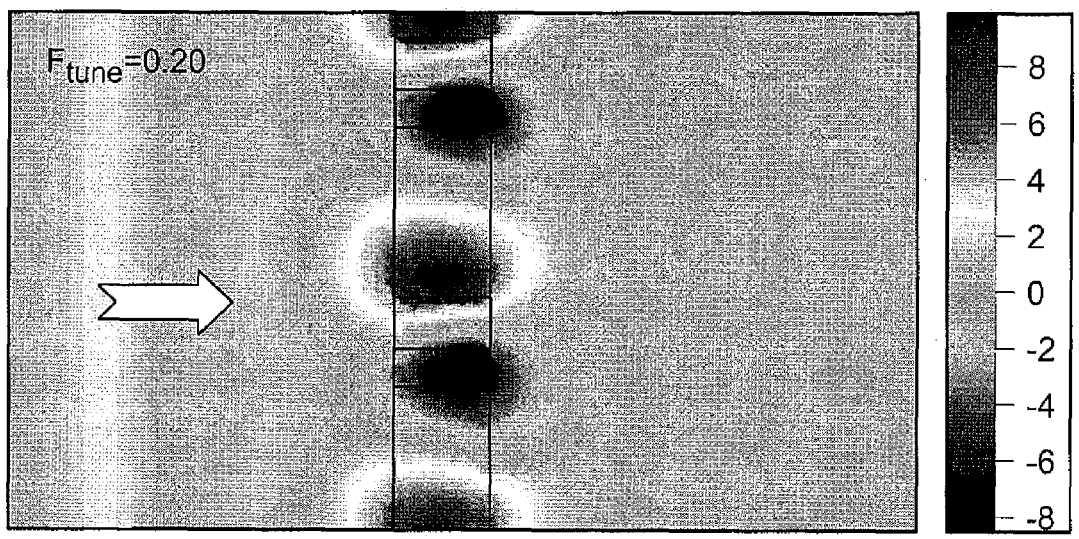
Figure 40:
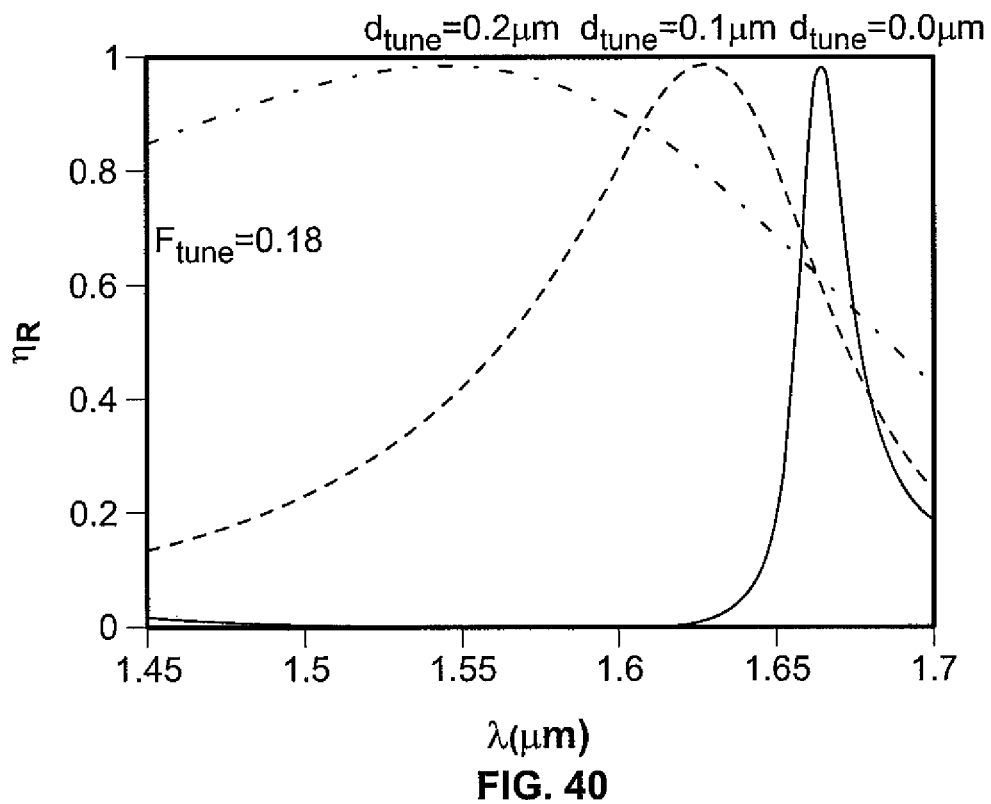
FIG. 40 shows the effect of waveguide tuning on the resonance lineshape and the spectral reflectance for a fixed value of the symmetry parameter $F_{tune}=0.18$.
Figure 41:
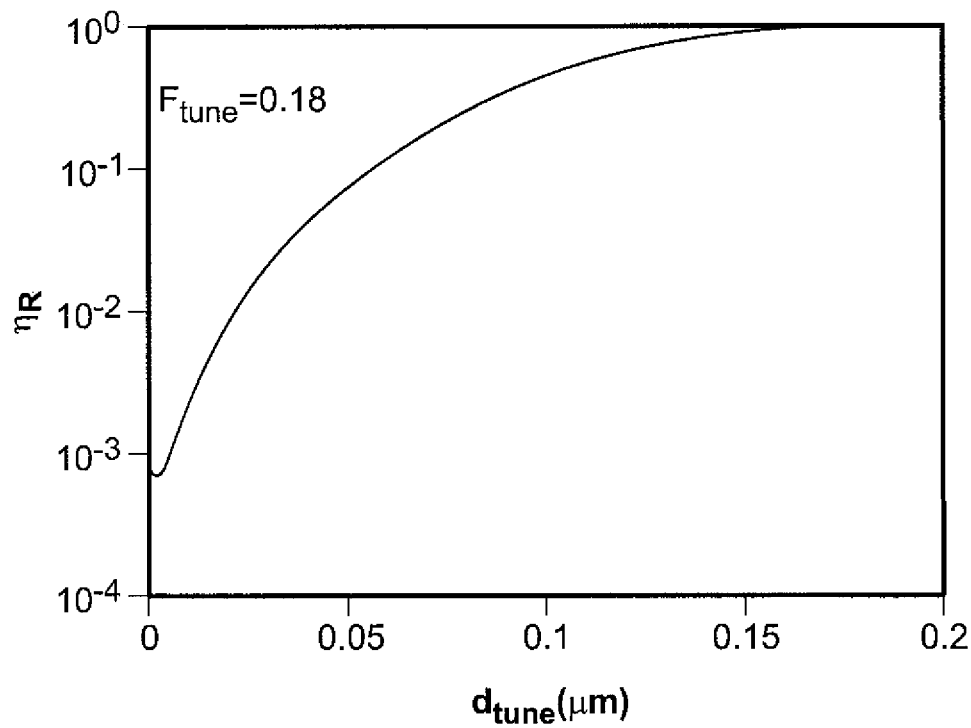
FIG. 41 exemplifies the effect of waveguide tuning on reflectance at $\lambda=1.55$ μm with the symmetry factor held constant.

FIG. 37 quantifies the spectral shift, lineshape, and linewidth of the resonance reflectance peak as a result of profile tuning. In general, the peak shift is accompanied by linewidth change; in this case the resonance linewidth increases as the peak shifts to longer wavelength within the range shown. Curve (a) in FIG. 38 summarizes the change of the resonance wavelength under profile tuning. It is seen that the resonance wavelength can be shifted by approximately 300 nm, from 1.4 pm to 1.7 µm, with a horizontal movement of about 120 nm. At $F_{tune}=0.375$, the structure is symmetric accounting for the reversal in wavelength shift at that point. Thus, for example, the physical situation for $F_{tune}=0.05$ is the same as that for $F_{tune}=0.70$. FIGS. 39(a) - 39(d) show leaky-mode cross section and two-dimensional distributions of the internal modal fields at resonance for a given set of parameters. It is seen that the field amplitude in the Si blocks increases by a factor of about seven ($F_{tune}=0.05$) over the input wave amplitude. Varying the symmetry tuning parameter $F_{tune}$ alters the internal field distributions and their amplitudes. Changing the separation between the two SOI gratings with $F_{tune}$ held constant modifies the guiding layer of the GMR structure with consequences summarized in FIG. 40. As $d_{tune}$ increases, the thickness of the double-grating waveguide increases, its effective refractive index decreases, the resonance Q-factor decreases, the linewidth broadens, and the resonance wavelength changes as depicted also in curve (b) in FIG. 38. At wavelength $\gamma=1.55$ µm, the reflectance can be altered from about $10^{-3}$ to about 1 with a vertical movement of about 0.2 pm as indicated in FIG. 41. Thus a variable reflector and an optical modulator can be realized. These reflectors and modulators would be tunable in the sense that the device can be set for any wavelength within its range and that specific wavelength subsequently variably reflected and modulated.

Figure 42A:
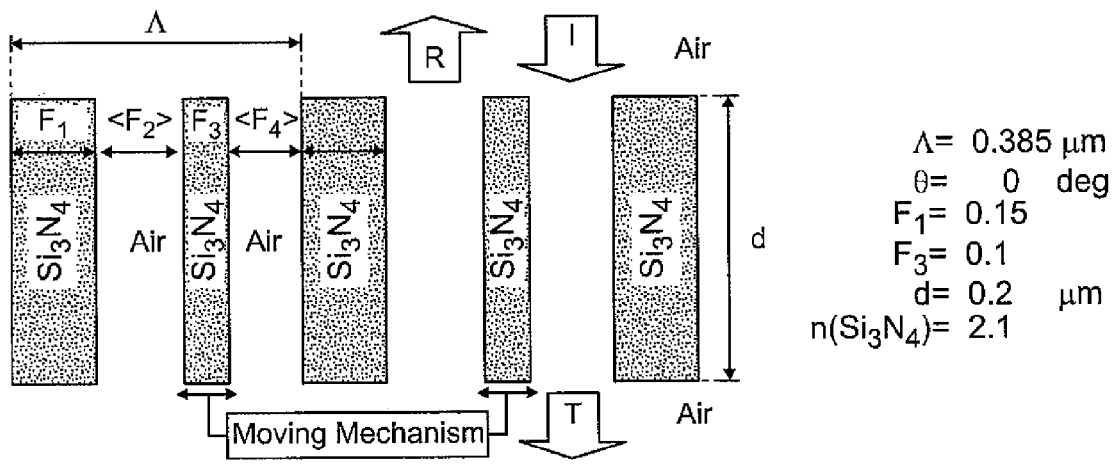
FIGS. 42(a) and 42(b) provide an example of a tunable leaky mode device fashioned as a silicon-nitride membrane in air and operating in the visible spectral region.
Figure 42B:
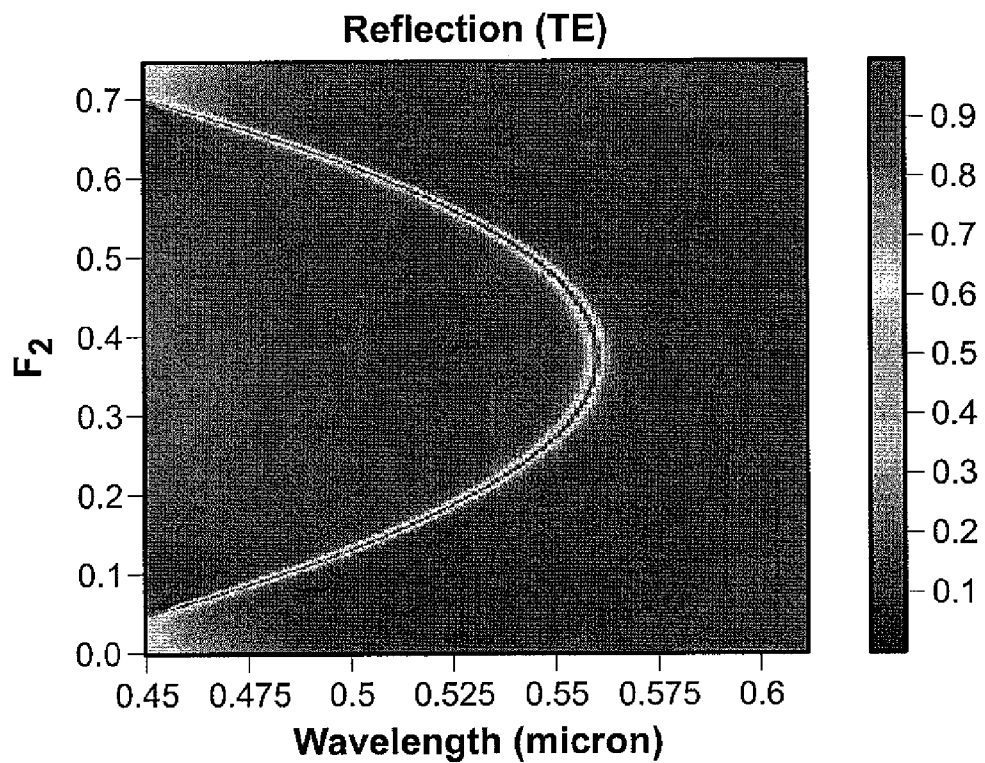
Figure 42C:
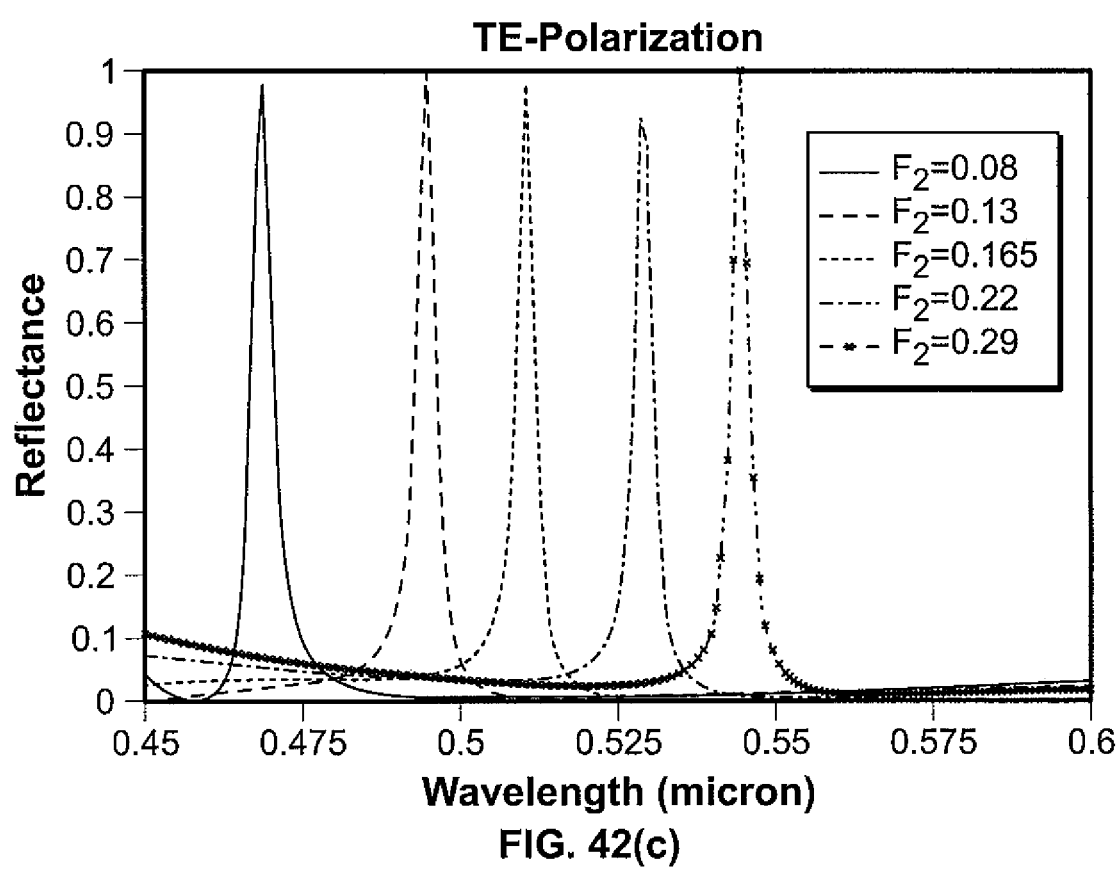
FIG. 42(c) shows the evolution of the reflection spectrum vs. $F_2$.

A leaky mode resonance element tunable in the visible region is shown in FIG. 42. In contrast to the previous example, this device uses a material that is transparent in the visible region ($Si_3N_4$, n=2.1). As can be seen in FIG. 42(b), the tuning range for this pixel is about 100 nm in the visible region on varying fill factor $F_2$ by about 0.3 (about 100 nm spectral shift per about 115 nm lateral shift). FIG. 42(c) shows the evolution of the reflection spectrum versus $F_2$. The device achieves a sharp, well-defined spectrum that maintains the linewidth well. This element can provide a compact solution in a pixelized display system shifting across the blue-to-green region.

Figure 43A:
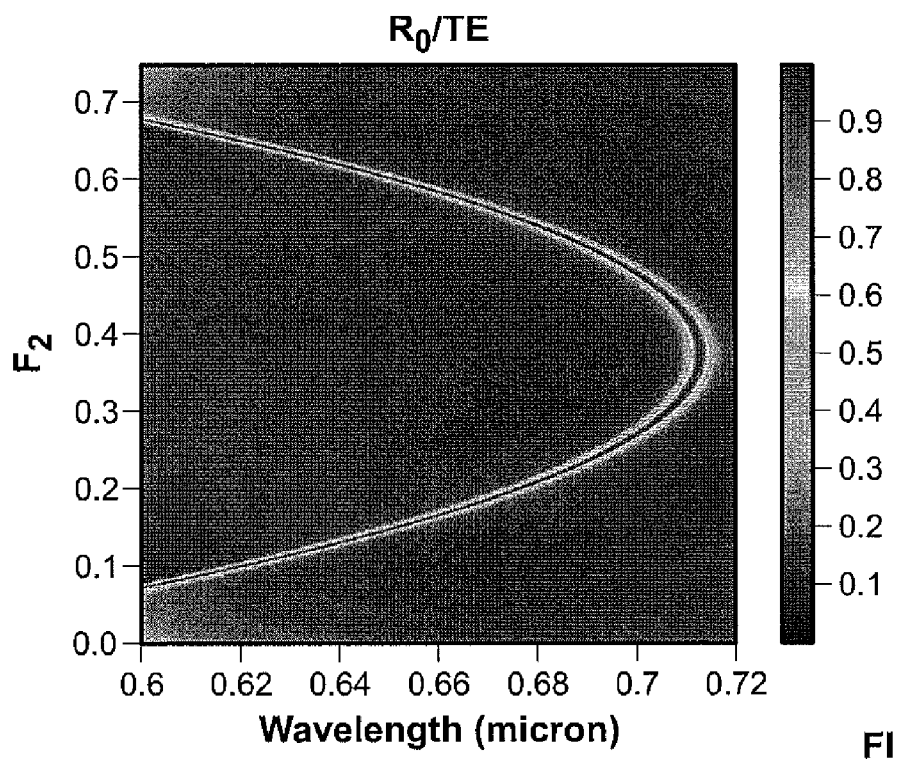
FIGS. 43(a) and 43(b) demonstrate a tunable leaky mode device designed to work in the red portion of the visible region.
Figure 43B:
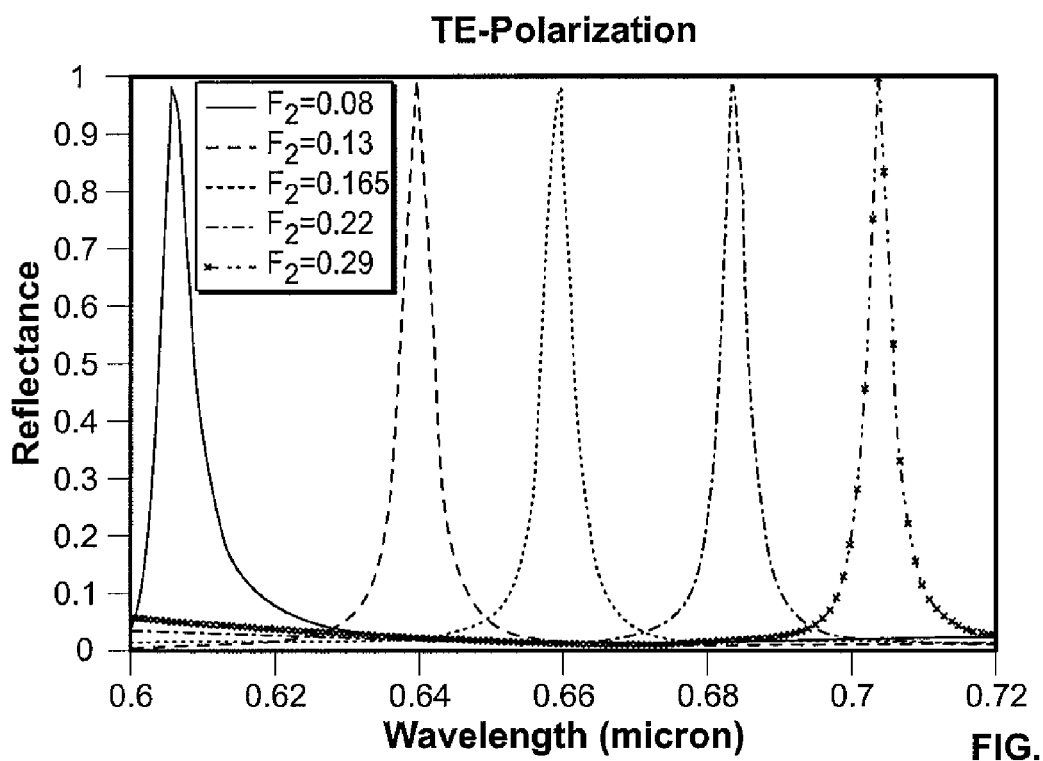

Pixels operating in a different part of the visible region can be found by merely altering the thickness and period of the basic structure in FIG. 42(a). Thus, for example, a pixel spanning the range of about 600 to 710 nm is obtained by setting period $\Lambda=500$ nm and thickness d=250 nm. The result is shown in FIG. 43. FIG. 43(b) shows example resonant spectral lines and their shape and linewidths quantitatively. The (FWHM) linewidths are seen to exceed 5 nm in the range exemplified. The computed angular apertures for this case exceed 5 degrees, indicating that the input illumination can be effectively applied within this angular corridor without excessively critical alignment.

Figure 44A:
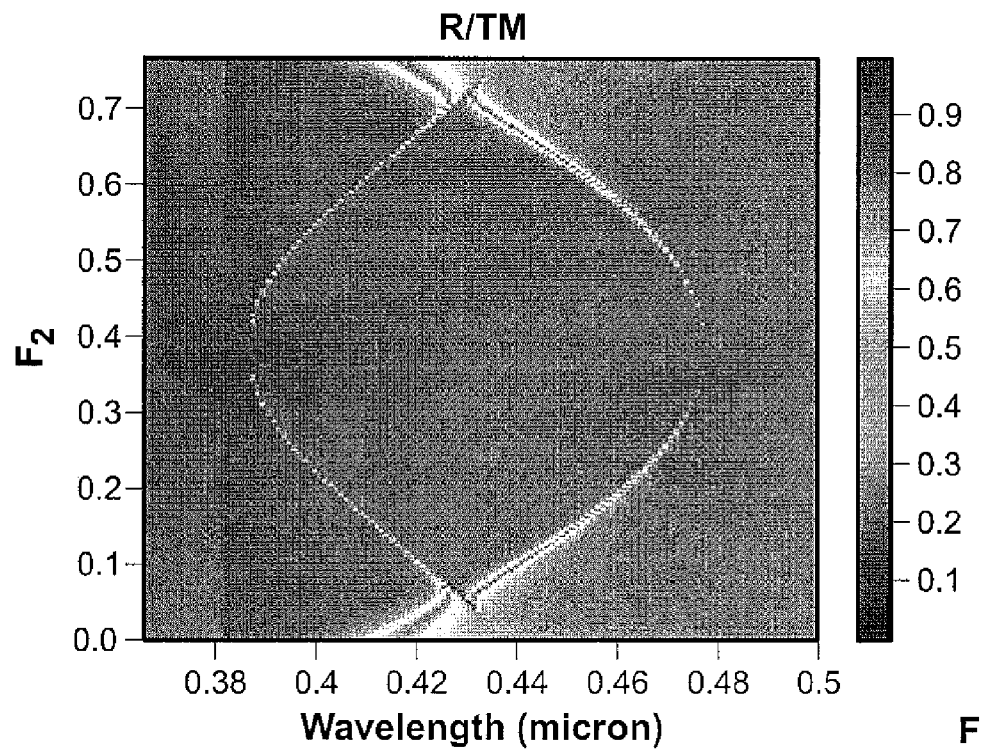
FIGS. 44(a) and 44(b) illustrate the effect of switching the polarization state from TE to TM for the pixels in the previous examples in FIGS. 42 and 43.
Figure 44B:
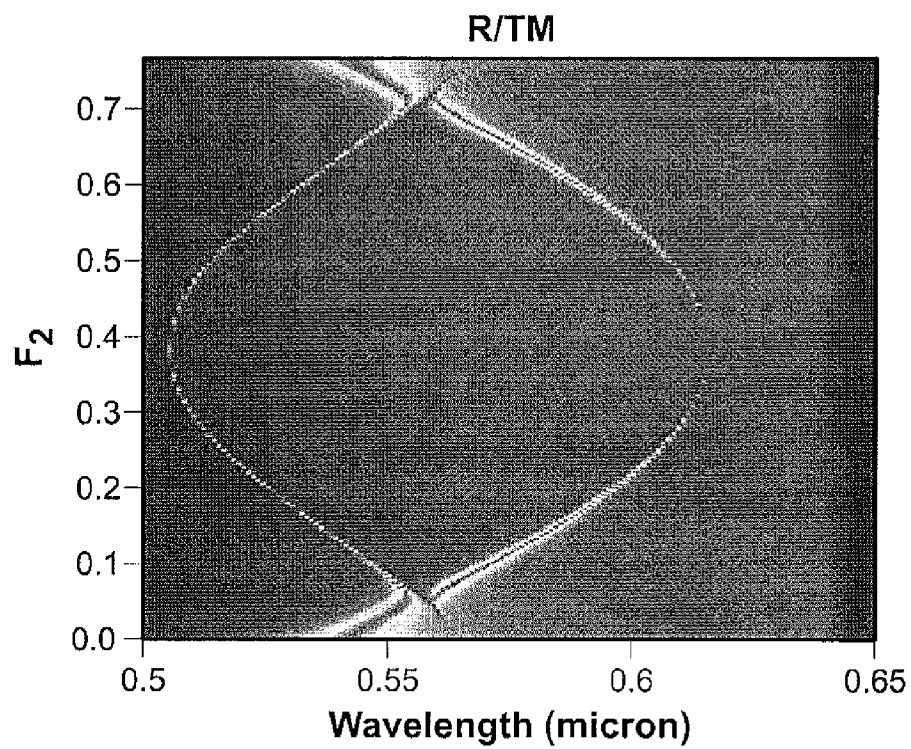
Figure 45A:
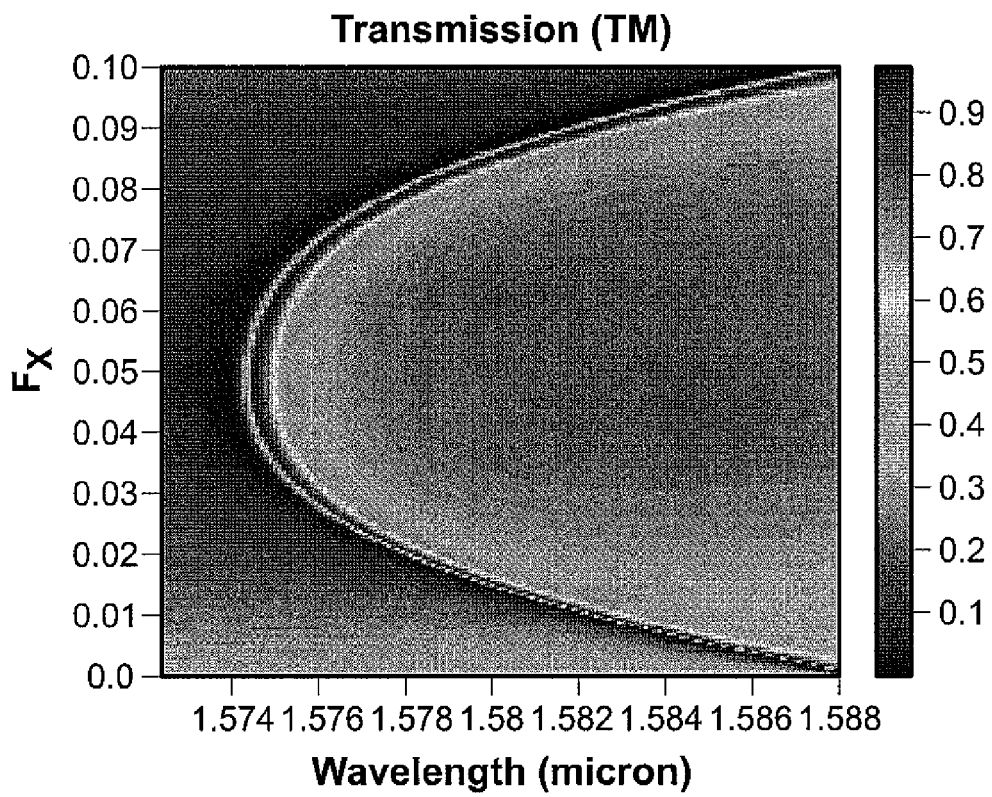
FIGS. 45(a) and 45(b) show a tunable leaky mode element made in SOI operating in the IR region as a transmission bandpass device.
Figure 45B:
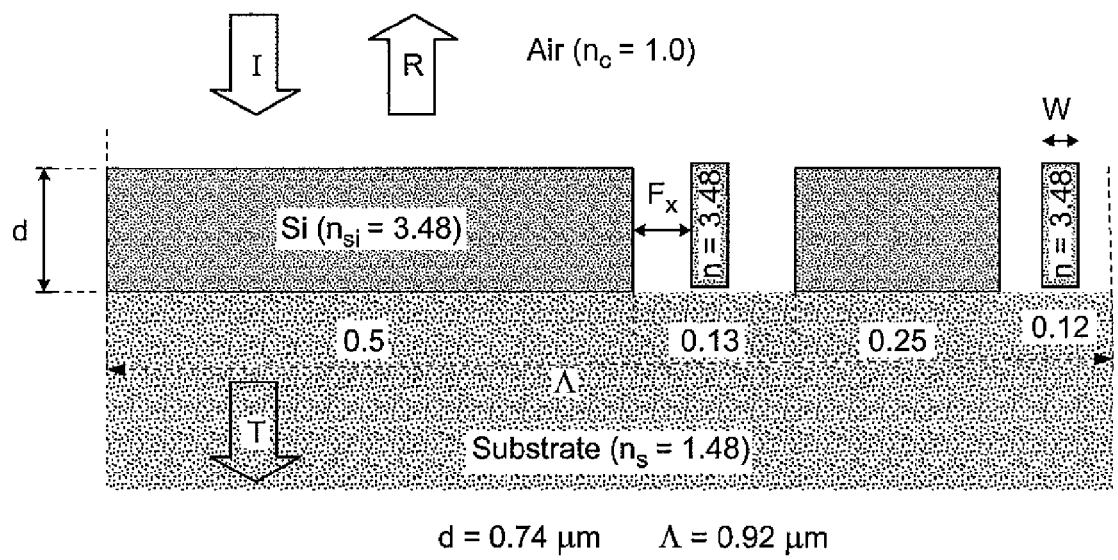

Since the resonance location is sensitive to polarization, the wavelength range covered by these elements changes if the input light is TM polarized. This permits purposely switching the spectral range by polarization variation of the incident light. As an example, FIG. 44 shows the TM-polarization response of the pixels illustrated in FIG. 42 and FIG. 43. To explain further, the red pixel in FIG. 43 spans the approximate wavelength range of 600 to 700 nm in TE polarization by changing $F_2$ from about 0.07 to about 0.25. By switching the polarization to the TM state, the range of $F_2$ from about 0.07 to about 0.2 provides additional output wavelengths in the approximate range of 560 to 600 nm as shown in FIG. 44(b), thus extending the range covered by 40 nm.

FIG. 44 indicates the two branches that occur in these pixels associated with the upper and lower bandedges of the second (leaky) stopband, as discussed further below. Thin-film edge filters can be used to block or pass either band as desired.

A variety of leaky-mode elements operating in transmission or as bandpass filters have been invented by the named inventors on the present application, and are described in the art. [See, R. Magnusson and S. S. Wang, "Transmission bandpass guided-mode resonance filters," Appl. Opt. 34, 8106 (1995); R. Magnusson and S. S. Wang, "Efficient bandpass reflection and transmission filters with low sidebands based on guided-mode resonance effects," U.S. Pat. No. 5,598,300; S. Tibuleac and R. Magnusson, "Reflection and transmission guided-mode resonance filters," J. Opt. Soc. Am. A. 14, 1617 (1997); S. Tibuleac and R. Magnusson, "Narrow-linewidth bandpass filters with diffractive thin-film layers," Opt. Lett. 26, 584 (2001); Y. Ding and R. Magnusson, "Doubly-resonant single-layer bandpass optical filters," Optics Letters, vol. 29, pp. 1135-1137, May 2004.] A bandpass resonant filter utilizes the transmission peak associated with a reflection minimum in the naturally asymmetrical spectral curve. By using multilayer dielectric coatings to generate a wideband low-transmission background while maintaining the transmission peak, structures supporting transmission bandpass characteristics have been obtained. [R. Magnusson and S. S. Wang, "Transmission bandpass guided-mode resonance filters," Appl. Opt. 34, 8106 (1995); R. Magnusson and S. S. Wang, "Efficient bandpass reflection and transmission filters with low sidebands based on guided-mode resonance effects," U.S. Pat. No. 5,598,300; S. Tibuleac and R. Magnusson, "Reflection and transmission guided-mode resonance filters," J. Opt. Soc. Am. A. 14, 1617 (1997).] S. Tibuleac et al. subsequently found simpler transmission type structures with favorable lineshape and linewidths were subsequently found by employing genetic algorithms. [S. Tibuleac and R. Magnusson, "Narrow-linewidth bandpass filters with diffractive thin-film layers," Opt. Lett. 26, 584 (2001).]. Y. Ding. et al. later elucidated the detailed mechanisms for these devices. [Y. Ding and R. Magnusson, "Doubly-resonant single-layer bandpass optical filters," Optics Letters, vol. 29, pp. 1135-1137, May 2004.]

In the context of the present disclosure, preliminary device design shows that it is possible to accomplish tuned operation in transmission mode or as bandpass filters. This operational mode can potentially provide spectral arrays that are more compact than those operating in reflection. The bandpass mode presents a challenging design problem; efficient optimization codes will be required. For example, FIG. 46 shows a tunable device with limited performance. The device can be tuned over about 13 nm around the 1580 nm wavelength.

Integration of metallic layers, interleaved metal gratings, and metal and blocks within the nanostructured devices summarized above represents an additional useful design dimension. Interaction of surface plasmons and the leaky modes is of great interest for photonic device development. There is great interest worldwide presently in the transmission and reflection properties of metallic subwavelength surfaces supporting plasmonic resonances as well as in their band structure. [H. Raether, Surface plasmons on smooth and rough surfaces and on gratings, Springer-Verlag, Berlin (1988); T. W. Ebbesen, H. J. Lezec, H. F. Ghaemi, T. Thio, and P. A. Wolff, "Extraordinary optical transmission through subwavelength hole arrays," Nature, vol. 391, pp. 667-669 (1998); S. A. Darmanyan and A. V. Zayats, "Light tunneling via resonant surface plasmon polariton states and the enhanced transmission of periodically nanostructured metal films: An analytical study," Phys Rev B, vol. 67, 035424

(2003); Stéphane Collin, Fabrice Pardo, Roland Teissier and Jean-Luc Pelouard, "*Horizontal and vertical surface resonances in transmission metallic gratings*," Journal of Optics: Pure and applied optics, vol 4, pp. s154-s160 (2002); A. Christ, G. Lévêque, H. Fischer, A. Nesci, S. G. Tikhodeev, and O. J. F. Martin, "*Surface Plasmon Optics,*" 2006 IEEE/LEOS International Conference on Optical MEMS and Their Applications, Big Sky, Mont., Aug. 21-24, 2006.] Devices based on plasmonic/leaky mode interactions fall within the class of devices addressed in this disclosure.

With reference to the physics of the tunable devices disclosed herein, as shown in FIG. 39, there is high field concentration in the grating layer at resonance. Thus, in general, small changes in the location of the silicon tuning block in that example, and the attendant phase variations, strongly affect the near-field coupling processes associated with the resonance. Profile variation generated by a change in the tuning fill factor ($F_{tune}$ or $F_2$) would therefore be expected to induce changes in resonance wavelength. More concretely, the resonance peaks appear at the edges of the second (leaky) stopband associated with each operative mode. The second Fourier harmonic of the grating strongly impacts the width of the second stopband on account of the first-order Bragg condition experienced by the resonant leaky modes with respect to this harmonic.

With reference to FIG. 36, by changing $F_{tune}$ while keeping $d_{tune}$ constant, thereby only varying the Fourier harmonic content of the profile, the bandgap of the second stopband is modified. The fundamental $TE_0$ leaky-mode resonance operative in the particular device under study in FIGS. 37 through 41 locates at the lower bandedge (lower frequency, longer wavelength) of the second stopband. This bandedge is the locus of the resonance wavelength shown in FIG. 38(*a*). Magnusson et al. presented further discussion of these principles of operation. [R. Magnusson and Y. Ding, "MEMS tunable resonant leaky mode filters," IEEE Photonics Technology Letters, vol. 18, pp. 1479-1481, Jul. 15, 2006.]

The periodic elements needed for the disclosed devices can be fabricated with a variety of well-known methods. These include laser-beam holographic interferometry, i-line or UV photolithography, focused ion beam writing, and electron-beam writing [R. Magnusson and D. Shin, "*Diffractive Optical Components*," Encyclopedia of Physical Science and Technology, Third Edition, Vol. 4, pp. 421-440 Academic Press (2002); H. Nishihara, M. Haruna, T. Suhara, Optical Integrated Circuits, McGraw-Hill (1989); M. J. Madou, Fundamentals of Microfabrication: The Science of Miniaturization, Second Edition, CRC press (2002)]. Replication from master elements may be a cost-effective approach. [See Magnusson and Shin; Nishihara, Haruna and Suhara; Madou.] Device processing may involve film deposition by sputtering or e-beam evaporation or other means, etching, scanning electron microscope (SEM) inspection, and atomic force microscope (AFM) inspection, and N/MEMS actuation methods in integrated CMOS-based structures may be employed. For example, the relative motion of the two periodic layers can be accomplished with CMOS comb-drive actuators; details of such actuators are discussed by Madou.

The minimum size of the pixels is determined by the parameters used in each case. A key idea is to resonate the input light effectively within the lateral size of the pixel. As the leaky mode has a finite decay length, the lateral size has to exceed this characteristic length. For the blue pixel in FIG. 42, for example, we can estimate the decay length by the formula $l_d = \Lambda \lambda / 4 \pi \Delta \lambda$ [see, I. A. Avrutsky and V. A. Sychugov, "Reflection of a beam of finite size from a corrugated waveguide," J. Mod. Optics. 36, pp. 1527-1539 (1989)], yielding an $l_d$ value of approximately 3 µm, with a transverse pixel size of 10 µm being feasible in this case.

The disclosed tunable elements have a broad range of applications as briefly exemplified above. They can be arranged in 1D or 2D arrays or operated as single units. Their operating spectral regions are controlled by the element design. The input electromagnetic radiation illuminates the element and is filtered, modulated, analyzed, or tuned by the element. Suitable optical and electronic components constitute the various systems utilizing the tunable resonant leaky-mode N/MEMS elements disclosed herein with a broad variety of arrangements being possible. The decomposition of an input scene in multiple wavelength regions into its spectral, polarization, and intensity components has numerous applications in civilian and military systems.

Well-known examples of other MEMS-based systems for display include the Texas Instruments digital micromirror device (DMD) and the Silicon Light Machines grating light valve (GLV) technologies. Each of these systems is based on pixel elements completely different and distinct from the elements under disclosure presently. The DMD basic element is a flat mirror, not based on periodic modulation, which is tilted on an axis so that the illuminating light is directed towards the screen or away from it under electronic MEMS control. Rapid flipping of the mirrors allows display of a large number of grey levels as well as a multitude of colors if the input white light is directed through a color wheel. This simulates high contrast color images on screens via suitable projector systems. Operational details and key steps in the fabrication of the MEMS system part of the DMD are disclosed by Madou. [See Madou, at 308-310.] The GLV system employs a MEMS reflection grating whose diffraction efficiency is controlled by applied voltage. [See, D. M. Bloom, "*The grating light valve: revolutionizing display technology*," Proc. SPIE 3013, pp. 165-171 (1997); J. I. Trisnadi, C. B. Carlisle, and R. Monteverde, "*Overview and applications of Grating Light Valve based optical write engines for high-speed digital imaging*," Proc. SPIE 5348, pp. 1-13 (2004).] A suspended ribbon structure in which alternate ribbons are deflected to control the level of diffracted intensity constitutes the GLV element. The GLV applies the first diffraction orders of the phase grating, possibly collecting the light in both the +1 and −1 orders for enhanced efficiency with additional optical components. Three different grating periods of the GLV are used to produce red, green, and blue colors for superposition on a display screen; thus three distinct pixels provide these three primary colors. The diffraction efficiency of each pixel is controlled rapidly by the MEMS feature thus achieving effective color mixing and balancing on the screen. Each GLV elements is thus essentially an intensity modulator. In contrast, the current tunable resonant leaky-mode N/MEMS elements are spectrally selective subwavelength devices with no higher propagating diffraction orders. The MEMS actuation is in the plane of the device while the GLV actuates the ribbons normal to the surface. Additionally, the GLV employs no resonance effects.

As an example, a system using a single GMR pixel might be used to paint a color picture on a screen. Using for example a white-light LED illuminating source, a signal driver operating the GMR MEMS actuation mechanism, a lens, and a two-axis angularly-scanning mirror that is electronically controlled, a 2D picture can be created. In a miniature system, the screen could be the retina of the eye. This is a single-point scan system of which a CRT display is a well-known example.

One-dimensional arrays of GMR pixels can be used to limit the angular scan to one axis. If the GMR pixel covers the whole visible region, only one linear array is needed. If two pixels cover the visible range (as two pixels similar to those in FIG. 42 and FIG. 43 can accomplish), two arrays with superposed outputs are needed. Suitable white light illumination (~line source) illuminates the GMR array. Each pixel is controlled (using, e.g, pulse width modulation) to render the correct color on each corresponding image column, with displayed columns sequentially scanned across the screen by a rotating mirror. Amm et al. disclosed the use of this method in a GLV system with 1080 vertical pixels to form a 1920×1080 image on a display screen. D. T. Amm and R. W. Corrigan, "*Grating light valve technology: Update and novel applications*," Society for Information Display Symposium, Anaheim, Calif., May 19, 1998.

The advantages and features associated with the aspects identified and discussed in the present disclosure are utilized in designing various optical devices including, for example, narrowband reflecting structures and filters (bandstop filters), wideband reflecting structures and filters (bandstop filters, mirrors), narrowband transmitting structures and filters (bandpass filters), and wideband transmitting structures and filters (bandpass filters). In addition, such advantages and features are effectively employed when using 1D periodicity to implement polarization independent devices such as narrowband and wideband bandstop and bandpass filters, or using 1D periodicity to implement polarization independent reflectors where the phase between the two orthogonal components is 180 degrees to implement a half-wave polarization plate or is 90 degrees to realize a quarter-wave plate. That is, as the amplitude for each polarization component has nearly unity reflectance and the phase is controllable by design, a variety of devices can be implemented for polarization control.

Having described certain aspects associated with resonance sensors and the like, such resonance elements, in accordance with an exemplary aspect of the present disclosure, may utilize leaky modes that are, for example, localized waves propagating along the surface so as to result in a resonance highly sensitive to the conditions of the surface and the layers along which the modes glide. Further, beneficial applications of the systems and methods disclosed herein are envisioned in other spectral regions including, for example, the microwave region and the millimeter-wave region.

Although the numerous resonant leaky-mode optical devices realized with thin periodically modulated films wherein the spatial modulation has a structural profile suitable for resonant leaky mode excitation with selected evanescent diffraction orders, as discussed in the present disclosure, have been demonstrated with reference to exemplary embodiments thereof, the present disclosure is not limited to such exemplary embodiments and/or preferred aspects. Nor is the present disclosure limited to the tunable resonant leaky-mode N/MEMS elements and uses described herein. Rather, the present disclosure extends to and encompasses such modifications, variations and/or enhancements that will be apparent to persons skilled in the pertinent art in view of the detailed description provided herein.

The invention claimed is:

1. A dynamically tunable device, comprising:
a double-grating structure that includes a first fixed grating and a second mobile grating,
wherein the first fixed grating and the second mobile grating are operatively connected with a relative displacement imposed therebetween by nano/micro-electromechanical (N/MEMS) means to form a resonant leaky-mode waveguide grating.

2. The dynamically tunable device of claim 1, further comprising functionality selected from the group consisting of tunable filter functionality; tunable variable reflector functionality; tunable modulator functionality; tunable pixel functionality; tunable polarizer functionality; tunable analyzer functionality; tunable acoustic sensor functionality; tunable mechanical sensor functionality; tunable biosensor functionality; and a combination thereof.

3. The dynamically tunable device of claim 1, wherein the double-grating structure is a membrane suspended in a medium selected from the group consisting of a vacuum, a gas or a liquid.

4. The dynamically tunable device of claim 1, wherein at least one of the first fixed grating and the second mobile grating is mounted on a substrate.

5. The dynamically tunable device of claim 1, wherein the double-grating structure is integrated with at least one of a micro-electromechanical (MEMS) actuator and an electronic control circuit.

6. The dynamically tunable device of claim 1, wherein at least one of the first fixed grating and second mobile grating is fabricated from at least one material selected from the group consisting of silicon, silicon nitride and silicon dioxide.

7. The dynamically tunable device of claim 1, wherein the double-grating structure includes metal components with plasmonic effect functionality.

8. The dynamically tunable device of claim 1, further comprising means for one-dimensional periodic modulation.

9. The dynamically tunable device of claim 1, further comprising means for two-dimensional periodic modulation.

10. An assembly, comprising:
a housing, and
a dynamically tunable device that includes a double-grating structure mounted with respect to the housing, the double-grating structure including a first fixed grating and a second mobile grating, wherein the first fixed grating and the second mobile grating are operatively connected with a relative displacement imposed by nano/micro-electromechanical (N/MEMS) means therebetween to form a resonant leaky-mode waveguide grating.

11. The assembly of claim 10, wherein the dynamically tunable device operates in reflection or transmission mode.

12. The assembly of claim 10, wherein the dynamically tunable device functions as part of a compact spatial light modulator, a tunable multispectral detector, a multispectral analysis system, a pattern recognition system, an electromagnetic/optical damage avoidance system, a polarization discrimination and analysis system, an electromagnetic screening system, a spectrum analyzer, a tunable laser, or a combination thereof.

13. A system for information display, comprising:
at least one tunable double-grating pixel that includes a first fixed grating and a second mobile grating, wherein the first fixed grating and the second mobile grating are operatively connected with a relative displacement imposed by nano/micro-electromechanical (N/MEMS) means therebetween to form a resonant leaky-mode waveguide grating.

14. The system of information display of claim 13, wherein the at least one tunable double-grating pixel includes a single tunable double-grating pixel, a linear array of tunable double-grating pixels, a two-dimensional array of tunable double-grating pixels, or a combination thereof.

15. The system of information display of claim 13, wherein the at least one tunable double-grating pixel is illuminated by a white light source.

16. The system of information display of claim 15, wherein the white light source is selected from the group consisting of light-emitting diodes, arc lamps, and halogen bulbs.

17. The system of information display of claim 13, wherein the at least one tunable double-grating pixel is illuminated by a narrow-line light source selected from the group consisting of a laser and light-emitting diode.

18. The system of information display of claim 13, further comprising at least one optical system selected from the group consisting of a projection lens, a scanning minor, a fiber cable, and combinations thereof.

19. The dynamically tunable device of claim 1, wherein a coupling between an unbound input wave and a leaky mode occurs.

20. The assembly of claim 10, wherein a coupling between an unbound input wave and a leaky mode occurs.

21. The system of information display of claim 13, wherein a coupling between an unbound input wave and a leaky mode occurs.

\* \* \* \* \*